(12) United States Patent
Isaka et al.

(10) Patent No.: US 8,017,429 B2
(45) Date of Patent: Sep. 13, 2011

(54) METHOD FOR MANUFACTURING PHOTOELECTRIC CONVERSION DEVICE

(75) Inventors: Fumito Isaka, Zama (JP); Sho Kato, Isehara (JP); Junpei Momo, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 268 days.

(21) Appl. No.: 12/369,760

(22) Filed: Feb. 12, 2009

(65) Prior Publication Data
US 2009/0209059 A1    Aug. 20, 2009

(30) Foreign Application Priority Data
Feb. 19, 2008    (JP) .................................. 2008-037733

(51) Int. Cl.
*H01L 21/30*    (2006.01)
*H01L 21/301*    (2006.01)
(52) U.S. Cl. .......... 438/74; 438/166; 438/798; 257/439; 257/E25.032; 257/E33.076
(58) Field of Classification Search .................... 438/74
See application file for complete search history.

(56) References Cited

U.S. PATENT DOCUMENTS

| | | | |
|---|---|---|---|
| 6,322,625 B2 * | 11/2001 | Im ................................ | 117/43 |
| 6,440,824 B1 | 8/2002 | Hayashi et al. | |
| 6,489,222 B2 | 12/2002 | Yoshimoto | |
| 6,548,370 B1 | 4/2003 | Kasahara et al. | |
| 7,022,183 B2 | 4/2006 | Takeda et al. | |
| 7,078,321 B2 | 7/2006 | Yoshimoto | |
| 7,151,046 B2 | 12/2006 | Takeda et al. | |
| 7,217,605 B2 | 5/2007 | Kawasaki et al. | |
| 7,674,647 B2 | 3/2010 | Arai | |
| 7,736,994 B2 * | 6/2010 | Reynaud et al. .............. | 438/455 |
| 7,858,431 B2 | 12/2010 | Isaka et al. | |
| 2004/0060504 A1 | 4/2004 | Takeda et al. | |
| 2004/0125305 A1 | 7/2004 | Nishi et al. | |
| 2006/0118036 A1 | 6/2006 | Takeda et al. | |

(Continued)

FOREIGN PATENT DOCUMENTS
JP    10-093122    4/1998
(Continued)

*Primary Examiner* — Bradley K Smith
*Assistant Examiner* — Mohammad Choudhry
(74) *Attorney, Agent, or Firm* — Eric J. Robinson; Robinson Intellectual Property Law Office, P.C.

(57) ABSTRACT

The purpose is manufacturing a photoelectric conversion device with excellent photoelectric conversion characteristics typified by a solar cell with effective use of a silicon material. A single crystal silicon layer is irradiated with a laser beam through an optical modulator to form an uneven structure on a surface thereof. The single crystal silicon layer is obtained in the following manner; an embrittlement layer is formed in a single crystal silicon substrate; one surface of a supporting substrate and one surface of an insulating layer formed over the single crystal silicon substrate are disposed to be in contact and bonded; heat treatment is performed; and the single crystal silicon layer is formed over the supporting substrate by separating part of the single crystal silicon substrate fixed to the supporting substrate along the embrittlement layer or a periphery of the embrittlement layer. Then, irradiation with a laser beam is performed on a separation surface of the single crystal silicon layer through an optical modulator which modulates light intensity regularly, and unevenness is formed on the surface. Due to the unevenness, reflection of incident light is reduced and absorptance with respect to light is improved, therefore, photoelectric conversion efficiency of the photoelectric conversion device is improved.

15 Claims, 28 Drawing Sheets

U.S. PATENT DOCUMENTS

| | | |
|---|---|---|
| 2007/0070319 A1 | 3/2007 | Nakamura et al. |
| 2007/0148936 A1 | 6/2007 | Ohnuma |
| 2008/0099065 A1* | 5/2008 | Ito et al. .................. 136/261 |
| 2008/0210945 A1 | 9/2008 | Miyairi |
| 2008/0245406 A1 | 10/2008 | Yamazaki et al. |
| 2008/0251126 A1 | 10/2008 | Yamazaki et al. |
| 2009/0117680 A1 | 5/2009 | Yamazaki et al. |
| 2009/0120498 A1 | 5/2009 | Yamazaki et al. |
| 2009/0127555 A1 | 5/2009 | Yamazaki et al. |
| 2009/0139558 A1 | 6/2009 | Yamazaki et al. |
| 2009/0142908 A1 | 6/2009 | Isaka et al. |
| 2009/0165854 A1 | 7/2009 | Yamazaki et al. |
| 2010/0047952 A1 | 2/2010 | Ohnuma et al. |
| 2010/0136735 A1 | 6/2010 | Arai |

FOREIGN PATENT DOCUMENTS

| | | |
|---|---|---|
| JP | 10-335683 | 12/1998 |
| JP | 2003-258285 | 9/2003 |

* cited by examiner portion of surface to be irradiated on surface of silicon

| Ra(nm) | 17.6 |
|---|---|
| P-V(nm) | 256.5 |
| RMS(nm) | 26.5 |

| Ra(nm) | 6 |
|---|---|
| P-V(nm) | 121.8 |
| RMS(nm) | 9.2 |

METHOD FOR MANUFACTURING PHOTOELECTRIC CONVERSION DEVICE

BACKGROUND OF THE INVENTION

1. Field of the Invention

The present invention relates to a photoelectric conversion device including single crystal silicon or polycrystalline silicon and to a manufacturing method thereof.

2. Description of the Related Art

Since the situation of global warming has been serious, a measure against the global warming is an issue that needs to be addressed worldwide. Most greenhouse effect gases which are regarded as a main cause for global-warming, such as carbon dioxide, are exhausted by consumption of energy, such as oil, coals, and natural gases. However, such energy is indispensable to the industrial society. Therefore, the amount of energy consumption cannot be reduced simply. Thus photoelectric power generation which discharges less amount of carbon dioxide and which is eco-friendly has attracted attentions as the next-generation energy.

For the photoelectric power generation, a silicon photoelectric conversion device, which converts light energy into electric energy using semiconductor characteristics, is widely applied. Since silicon photoelectric conversion devices typified by solar cells are already available in the market and governments around the world support solar cells, the production thereof has been expanding year by year. For example, the production of energy generated by solar cells around the world in 2006 is 2521 MW, which has increased by over 40% per annum.

However, there are many obstacles to the widespread of photoelectric power generation. One of the obstacles is a higher cost of photoelectric power generation compared with a cost of commercial power. In order to reduce a cost for photoelectric power generation, improvement of efficiency in a solar cell and reduction of manufacturing costs are indispensable.

Further, the present obstacle to the widespread of photoelectric power generation is short supply of silicon. The supply-demand balance of silicon had been excess in supply reflecting semiconductor recession. In contrast, silicon is now short of supply since around fiscal 2005 because of drastic growth of the solar cell market in addition to the recovery of the semiconductor (LSI) industry. Though major silicon suppliers in the world have already tried to increase capability of silicon production, the increase in demand outweighs the capability.

While shortage of silicon materials is obvious, a thin film silicon photoelectric conversion device has attracted attentions. In the thin film silicon photoelectric conversion device, thin film silicon is formed over a supporting substrate and the thin film silicon functions as a photoelectric conversion layer. In contrast, a balk silicon photoelectric conversion device, which is mainly used currently, whose main portion is formed from a single crystal silicon substrate or a polycrystalline silicon substrate having a thickness which is more than several tens times or more as thick as a thickness necessary for the photoelectric conversion device. Therefore, it is hard to say that silicon is used effectively in the balk silicon photoelectric conversion device. Speaking of extremes, most part of the single crystal silicon substrate or the polycrystalline silicon substrate used for the balk silicon photoelectric conversion device functions only as a structural body for keeping the shape of the photoelectric conversion device. The thin film silicon photoelectric conversion device can have a structure in which silicon is used only for a region for performing photoelectric conversion. Therefore, a silicon usage can be reduced drastically compared with a silicon usage of the balk silicon photoelectric conversion device.

However, the thin film silicon is formed over the supporting substrate in the thin film silicon photoelectric conversion device by using a physical or chemical growing method. Therefore, photoelectric conversion efficiency of the thin film silicon photoelectric conversion device is lower than that of the balk silicon photoelectric conversion device. Thus, a method for manufacturing a solar cell which employs an ion implantation separation method for obtaining a crystal semiconductor layer has provided (for example, see Reference 1: Japanese Patent Application Laid-Open No. H10-335683). A predetermined element is implanted into a crystalline semiconductor so as to be a layer shape and the crystalline semiconductor is bonded over an electrode. A space distributed in a layer shape is formed in the region to which the predetermined element is implanted in the crystalline semiconductor and the crystalline semiconductor is separated along the space by heat distortion to obtain a solar cell A including a crystalline semiconductor layer over the electrode layer. Further, a solar cell B including an amorphous silicon layer is formed thereover to form a tandem solar cell. In this method, a single crystal silicon solar cell which is to be a first power generating layer is formed; however, the thin film silicon photoelectric conversion device which achieves photoelectric conversion efficiency as high as that of the balk silicon photoelectric conversion device is not realized actually.

In order to improve photoelectric conversion efficiency of the photoelectric conversion device, a technique of light confinement in which incident light is used efficiently is researched for all types of the photoelectric conversion device including bulk-type and thin film-type. As the technique of light confinement, formation of a surface texture structure (surface uneven structure) or an antireflection layer on a light incident surface are known. In the case of single crystal silicon, it is known that a surface uneven structure is formed by etching treatment with an alkaline solution or the like using a crystal plane orientation of silicon. Further, in the case of having various plane orientations, such as that of polycrystalline silicon, a method is provided, in which a surface uneven structure is formed using combination of a laser-processing technique and a chemical etching (see Patent Application Laid-Open No. 2003-258285).

SUMMARY OF THE INVENTION

However, although photoelectric conversion efficiency is improved by forming the surface textual structure by etching, a silicon material is to be removed, which is to waste of the silicon material.

In the conventional method for etching with use of an alkaline solution or the like, unevenness formed by dipping in an alkaline solution using different etching rates depending on a crystal plane orientation to form unevenness; however, the size of the formed uneven structure varies easily due to a change in the concentration of the alkaline solution in the dipping, for example. In the case of polycrystalline silicon, its crystal plane orientation is more random than that of the single crystal silicon. Therefore, the favorable uneven structure is hard to be obtained only by etching. As described above, although the uneven structure can be formed by using the combination of the laser-processing technique and the etching, the step is additionally required if using the combination, whereby a manufacturing cost is increased. Further, silicon is evaporated by irradiation with a laser beam to form grooves, whereby particles are easily generated, and further, there is possibility of reattachment of the evaporated silicon as a particle.

In view of the aforementioned problems, one object of the present invention is to provide a method for manufacturing a photoelectric conversion device with excellent photoelectric conversion characteristics typified by a solar cell, using a silicon material effectively, and provide the photoelectric conversion device manufactured by the method.

The photoelectric conversion device according to the present invention has a single crystal silicon layer or a polycrystalline silicon layer for photoelectric conversion and an uneven structure with regular intervals on a surface which is to be a light incident side. The uneven structure with regular intervals is formed by irradiation of the single silicon layer or the polycrystalline silicon layer with a laser beam through an optical modulator. The optical modulator modulates light intensity of the laser beam regularly.

A single crystal silicon substrate is sliced, and a single crystal silicon layer of a surface layer of the single crystal silicon substrate is separated to be fixed to a supporting substrate, whereby the single crystal silicon layer for photoelectric conversion device is formed. Note that the single crystal silicon layer is made to be thick by epitaxial growth depending on the predetermined thickness.

The single crystal silicon layer is irradiated with a laser beam through the optical modulator to form the uneven structure on a surface of the single crystal silicon layer. Note that the irradiation with the laser beam through the optical modulator is performed either before or after the epitaxial growth. When the irradiation with the laser beam through the optical modulator is performed before the epitaxial growth, the uneven structure formed in the surface of the single crystal silicon layer which is to be a seed layer is reflected on the surface of the final single crystal silicon layer, whereby the uneven structure is also formed on the surface of the final single crystal silicon layer. Further the polycrystalline silicon substrate can be used instead of the single crystal silicon substrate to form the polycrystalline silicon layer over the supporting substrate.

Note that the single crystal in this specification refers to a crystal in which crystal planes and crystal axes are aligned and atoms or molecules which are included in the single crystal are aligned in a spatially ordered manner. Although single crystals are structured by orderly aligned atoms, single crystals may include a lattice defect in which the alignment is disordered as part or single crystals may include intended or unintended lattice strain.

One aspect of the present invention is that an embrittlement layer is formed in a single crystal silicon substrate and a first impurity silicon layer having one conductivity type, a first electrode, and an insulating layer are formed so as to be stacked sequentially on one surface of the single crystal silicon substrate. One surface of a supporting substrate and one surface of the insulating layer formed over the single crystal silicon substrate are disposed to be in contact with each other and bonded to each other. Then heat treatment is performed and part of the single crystal silicon substrate fixed to the supporting substrate is separated along the embrittlement layer or the periphery of the embrittlement layer to form a first single crystal silicon layer over the supporting substrate. Then, by irradiation with a laser beam from a separation surface side of the first single crystal silicon layer through an optical modulator which modulates light intensity regularly, unevenness is formed on a surface which is the separation surface of the first single crystal silicon layer. A second single crystal silicon layer is formed on the surface having the unevenness of the first single crystal silicon layer and the unevenness of the first single crystal silicon layer is reflected on a surface of the second single crystal silicon layer, whereby unevenness is formed on the surface of the second single crystal silicon layer. A second impurity silicon layer having a conductivity type opposite to the one conductivity type is formed on the surface having the unevenness of the second single crystal silicon layer.

It is preferable that by irradiation with the laser beam from a separation surface side of the first single crystal silicon layer through the optical modulator which modulates light intensity regularly, the unevenness is formed on a surface which is the separation surface of the first single crystal silicon layer and also crystal defects of the first single crystal silicon layer are repaired in the aforementioned structure.

One aspect of the present invention is that an embrittlement layer is formed in a single crystal silicon substrate and a first impurity silicon layer having one conductivity type, a first electrode, and an insulating layer are formed so as to be stacked sequentially on one surface of the single crystal silicon substrate. One surface of a supporting substrate and one surface of the insulating layer formed over the single crystal silicon substrate are disposed to be in contact with each other and bonded to each other. Then heat treatment is performed and part of the single crystal silicon substrate fixed to the supporting substrate is separated along the embrittlement layer or the periphery of the embrittlement layer to form a first single crystal silicon layer over the supporting substrate. Then, after irradiation with a laser beam from a separation surface side of the first single crystal silicon layer, a second single crystal silicon layer is formed on a surface which is the separation surface of the first single crystal silicon layer. Irradiation with a laser beam performed on a surface side of the second single crystal silicon layer through an optical modulator which modulates light intensity regularly, whereby unevenness on the surface of the second single crystal silicon layer is formed and a second impurity silicon layer having a conductivity type opposite to the one conductivity type is formed on the surface having the unevenness of the second single crystal silicon layer.

It is preferable that irradiation with the laser beam is performed on the separation surface side of the first single crystal silicon layer, whereby the single crystal silicon layer is melted and crystal defects of the first single crystal silicon layer are repaired in the aforementioned structure.

Further, a phase shift mask or a mask having a slit pattern can be used as the optical modulator.

In addition, the second single crystal silicon layer can be formed by solid-phase growth or vapor phase growth using the first single crystal silicon layer as a seed layer.

In the aforementioned structure, the embrittlement layer can be formed by irradiation with ions or cluster ions from one surface side of the single crystal silicon substrate.

Further, in the aforementioned structure, the photoelectric conversion device can be manufactured, in which a third impurity silicon layer having one conductivity type, a non-single-crystal silicon layer, and a fourth impurity silicon layer having a conductivity type opposite to the one conductivity type are formed over the second impurity silicon layer.

According to the present invention, the surface uneven structure can be formed on the light incident side of the photoelectric conversion device, which can reduce reflection of incident light and improve absorptance with respect to light. The single crystal silicon layer or the polycrystalline silicon layer obtained by slicing a superficial portion of the single crystal silicon substrate or the polycrystalline silicon substrate is bonded to the supporting substrate, whereby consumption of silicon as a material can be suppressed. The single crystal silicon substrate from which the first single crystal silicon layer has been separated and the polycrystalline silicon substrate from which the polycrystalline silicon layer has been separated can be reused. Accordingly, the photoelectric conversion device with excellent photoelectric conversion characteristics can be provided while using resources efficiently.

BRIEF DESCRIPTION OF THE DRAWINGS

FIG. 27C is a transmission image of the measured sample.

DETAILED DESCRIPTION OF THE INVENTION

Embodiment modes and embodiments of the present invention will be described with reference to the drawings. However, this invention is not limited to the following description, and it is to be easily understood that various changes and modifications will be apparent to those skilled in the art without departing from the scope of the invention. Therefore, the present invention should not be construed as being limited to the following description of the embodiment modes and embodiments.

Embodiment Mode 1

One aspect of the present invention is that silicon for photoelectric conversion is irradiated with a laser beam through an optical modulator, which modulates light intensity of a laser bean regularly, whereby a silicon layer with an uneven structure is formed. Description is hereinafter made with reference to drawings.

FIGS. 1A to 1D are schematic views for explaining formation of unevenness in a silicon 30 by irradiation with a laser beam 20 through a phase shift mask 10 that is one mode of an optical modulator.

Figure 1A:
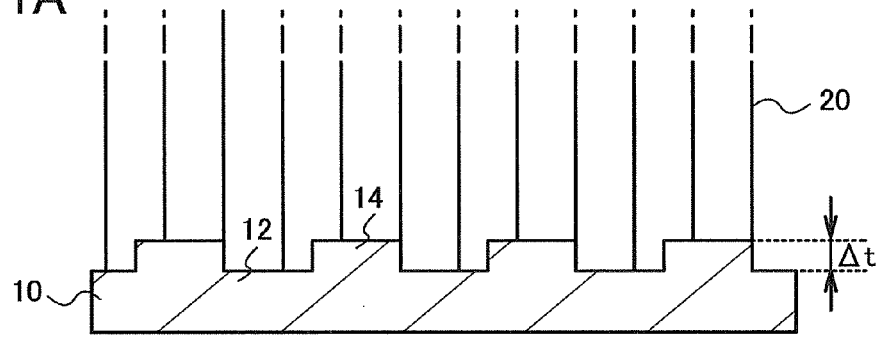
FIG. 1A is a cross sectional schematic view illustrating one example of a phase shift mask.

In FIG. 1A, the optical modulator modulates light intensity of the laser beam regularly. Described in this embodiment mode is an example in which a phase of the laser beam is modulated regularly using a phase shift mask 10 as the optical modulator, a light intensity distribution in which a light intensity is modulated regularly is obtained. Here, the phase shift mask refers to a mask which shifts a phase of transmitted light of an adjacent pattern by $\pi$. The phase shift mask 10 may be formed from a material which transmits a laser beam, and preferably, a substrate which has high smoothness and transmits a laser beam is processed to form the phase shift mask 10. Specifically, it is preferable that a quartz glass substrate is processed, for example, and projection portions and recessed portions are formed by forming grooves with regular intervals to form the phase shift mask 10. In this embodiment mode, the phase of a laser beam 20 which passes through a recessed portion 12 of the phase shift mask 10, which is the optical modulator, is not inverted and the phase of the laser beam 20 which passed through a projection portion 14 is shifted by π. Then, light whose phase is not inverted, which corresponds to the laser beam which has passed through the recessed portion 12, and light whose phase is inverted, which corresponds to the laser beam which has passed through the projection portions 14 interfere with each other, and then a position exists in which light intensity is weakened due to a phase difference between interfering lights, whereby the contrast of strength and weakness in the light intensity distribution is made clear. As a result, the light intensity distribution in which a light intensity is modulated regularly can be obtained.

Note that a difference in height between a surface of the recessed portion and a surface of the projection portion (a difference Δt) and an interval (a pitch) between the recessed portion and the projection portion are designed as appropriate by practitioners, whereby the desired light intensity distribution can be obtained. Here, the difference Δt is calculated by the following mathematical formula 1, from a wavelength λ of the laser beam 20; a refractive index $n_1$ of light in a material of the phase-shift mask; and a refractive index $n_0$ of light in the air.

$$\Delta t = \frac{\lambda}{2(n_1 - n_0)} \quad (1)$$

Description is made of an example in which a quartz glass substrate is used as the material of the phase shift mask and a XeCl excimer laser with a wavelength of 308 nm is used as the laser beam 20. In this case, the refractive index $n_1 \approx 1.486$, the refractive index $n_0 \approx 1.000$, and the wavelength λ=308 nm, which are substituted into the formula 1, whereby the difference Δt≈316 nm. Therefore, unevenness is formed by processing the quartz glass substrate so as to obtain a difference Δt of 316 nm, whereby the desired phase shift mask can be obtained.

Figure 1B:
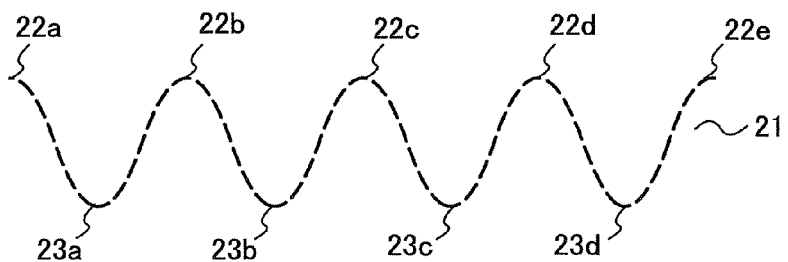
FIGS. 1B and 1C are schematic views illustrating one example of a phase and light intensity distribution of a laser beam through the phase shift mask respectively.
Figure 1C:
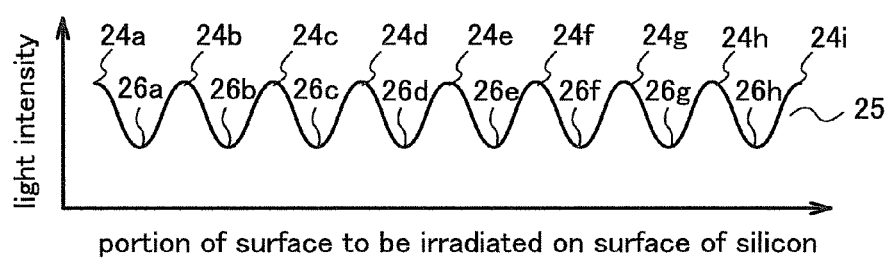

When the laser beam 20 passes through the optical modulator, the phase of the laser beam 20 is modulated corresponding to a pattern formed on the optical modulator and the like. Then, the light intensity distribution in which light intensity is modulated regularly is obtained. Here, FIG. 1B schematically illustrates a phase 21 of the laser beam 20 which has passed through the phase shift mask 10 which is the optical modulator. Further, FIG. 1C schematically illustrates light intensity distribution 25 of the laser beam 20 which has passed through the phase shift mask 10. The vertical axis of FIG. 1C represents light intensity and the horizontal axis thereof represents the position of a surface to be irradiated on the surface of the silicon.

For example, as for the laser beam 20 passing through the phase shift mask 10, the phase of the light which passes through the recessed portion 12 is not inverted and the phase of the light which passing through the projection portion 14 is inverted, whereby the phase 21 illustrated in FIG. 1B is obtained. Then, by interference of the light whose phase is not inverted and the light whose phase is inverted, the light intensity distribution 25 illustrated in FIG. 1C can be obtained. The light intensity distribution 25 has the maximum points of light intensity corresponding peaks 22 of the phase 21 (a peak 22a, a peak 22b, a peak 22c, a peak 22d, and a peak 22e are illustrated) and bottoms 23 of the phase 21 (a bottom 23a, a bottom 23b, a bottom 23c, and a bottom 23d are illustrated).

Further, the light intensity distribution 25 illustrates the minimum points of light intensity at boundaries where the phase is inverted. That is, the pattern formed in the light modulator is reflected on the light intensity distribution of the light which has passed through the light modulator, so that the light intensity distribution can have a distribution in which the maximum point and the minimum point appear repeatedly. The pattern shape of the phase shift mask 10 is reflected on the light intensity distribution 25 illustrated in FIG. 1C. In the light intensity distribution 25, maximum points 24 (maximum points 24a, 24b, 24c, 24d, 24e, 24f, 24g, 24h, and 24i are illustrated) and minimum points 26 (minimum points 26a, 26b, 26c, 26d, 26e, 26f, 26g, and 26h are illustrated) appear regularly.

As the laser beam 20, a laser beam having a wavelength within range of wavelength which can be absorbed by silicon 30. For example, the wavelength of the laser beam 20 is in a range greater than or equal to 100 nm and less than or equal to 800 nm, preferably greater than or equal to 300 nm and less than or equal to 750 nm. Further, the laser beam 20 preferably has a short wavelength although the laser beam has a wavelength within range of wavelength which can be absorbed by silicon 30. This is because the absorption coefficient of the silicon 30 is larger in the case of the short wavelength and energy of the laser beam 20 which is necessary for melting the silicon, can be reduced. Note that, as the laser beam 20, a harmonic (typically, a second harmonic or a third harmonic) as well as a fundamental wave can be used.

As the laser beam 20, a laser beam emitted with a continuous wave laser or a pulsed laser can be used. As the continuous wave laser, a continuous wave solid-state or gas laser is used. Further, as the pulsed laser, a pulsed solid-state or gas laser is used. Hereinafter, examples of a usable laser are given. For example, as the solid-state laser, a YAG laser, a $YVO_4$ laser, a forsterite ($Mg_2SiO_4$) laser, a $GdVO_4$ laser, a $Y_2O_3$ laser, or any one of these laser whose medium is a medium to which one or more selected from Nd, Yb, Cr, Ti, Ho, Er, Tm, or Ta are added as a dopant, an alexandrite laser, a titanium sapphire laser, a ruby laser, a glass laser, or the like can be given. In addition, as a gas laser, an Ar laser, a Kr laser, an excimer laser, a metal vapor laser, or the like can be given.

Single crystal silicon or polycrystalline silicon is used for the silicon 30. Further, the silicon 30 may be a bulk or a thin film; however, the silicon 30 preferably has a film thickness which is the same or the almost the same as the wavelength of the laser beam 20 or is greater than or equal to one third of the wavelength of the laser beam 20. By irradiating the silicon 30 having such a thickness with the laser beam 20, the silicon 30 can be melted easily and the unevenness (projection) with regular intervals can be formed easily.

The silicon 30 is irradiated with the laser beam 20 through the phase shift mask 10 to form the unevenness on a surface of the silicon 30. Hereinafter, the principle thereof is described. The silicon 30 is irradiated with the laser beam 20 through the phase shift mask 10 and the silicon 30 is melted and recrystallized. The laser beam 20 has the light intensity distribution 25, for example. A light intensity of the laser beam with which a region corresponding to the minimum point 26 (here, the minimum points 26a to 26h) of the light intensity distribution 25 is irradiated is lower than that of the laser beam with which another region is irradiated. Thus, the silicon 30 in the region corresponding to the minimum point 26 is not melted sufficiently or the temperature of the silicon 30 in the region corresponding to the minimum point 26 is decreased faster then that in another region. Therefore, a nucleus of crystal growth (also referred to as a crystal nucleus) is formed on the region corresponding to the minimum point 26 (here, the minimum points 26a to 26h) and regrowth of crystal occurs from the region. That is, in the silicon 30 melted by irradiation with the laser beam 20, recrystallization sequentially begins at the region irradiated with the light having lower light intensity, which is to be a crystal nucleus. Sequentially, crystal growth progresses from the crystal nucleus to a region where crystallization begins late (the region with a high light intensity, namely, the region on the maximum point 24 in the light intensity distribution). Here, in the light intensity distribution 25, the maximum point 24 and the minimum point 26 appear regularly and also the crystal nucleus is also generated regularly. Then, the crystal growth progresses from the crystal nucleus due to a gradient in the light intensity distribution 25 and the crystal growth progresses in different directions and crystals meet each other, whereby the projection is formed on the surface.

Here, a region of the adjacent minimum points 26b and 26c, and regions of the maximum point 24c which is between the adjacent minimum points 26b and 26c is described as an example. As described above, the light intensity of the minimum points 26b and 26c is low, whereby the regions corresponding to the minimum points 26b and 26c become crystal nuclei. The light intensity of the maximum point 24c is high. Crystal growth progresses from the minimum points 26b and 26c to the maximum point 24c in a horizontal direction mainly and crystals meet each other at the region of the maximum point 24c or around the region of the maximum point 24c, whereby the projection is formed. In a similar manner, the projection is formed at another region of the maximum point by meeting of crystal growth and other crystal growth each other. That is, crystal growth progresses from adjacent regions each corresponding to the minimum point 26 to the maximum point located between the adjacent regions and crystals meet each other, whereby the projection is formed to generate the unevenness. Therefore, the projection is formed corresponding to the position of the maximum point 24 in the light intensity distribution 25 and the unevenness is formed in the silicon 30. Note that crystal growth progresses from the region corresponding to the minimum point 26b to the regions corresponding to the maximum points 24c and 24b which are adjacent to the minimum point 26b. Further, crystal growth progresses from the region corresponding to the minimum point 26c to the regions corresponding to the maximum points 24c and 24d which are adjacent to the minimum point 26c.

At this time, the energy of the laser beam 20 is set so that the silicon 30 is melted at the minimum point 26 of the light intensity distribution 25. Although the silicon 30 may be melted completely or partly, it is preferable that the silicon 30 is set to be melted partly at the minimum point 26 of the light intensity distribution 25. The silicon 30 is melted partly at the minimum point 26 of the light intensity distribution 25, whereby a region where part of the silicon 30 is left being solid state without being melted and each direction of crystal growth can be aligned. When each direction of crystal growth can be aligned, the projections with regular intervals can be formed, and thus the uneven structure with regular intervals can be formed. Note that "complete melting" in this specification indicates that the whole silicon layer is melted to be in a liquid state. "Partly melting" indicates that part of the silicon layer (for example, an upper part) is melted to be in a liquid state but the other part thereof (for example, a lower part) is not melted to be in a solid state.

Figure 1D:
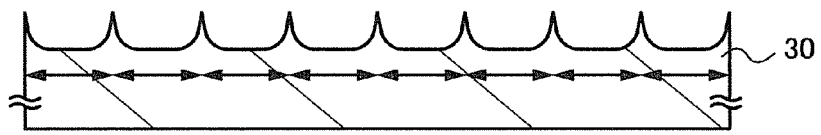
FIG. 1D is a cross sectional schematic view illustrating one example of silicon on which an uneven structure is formed.

Accordingly, by forming the projections, the silicon 30 having the uneven structure in the surface of the silicon 30 can be obtained as illustrated in FIG. 1D.

Figure 2A:
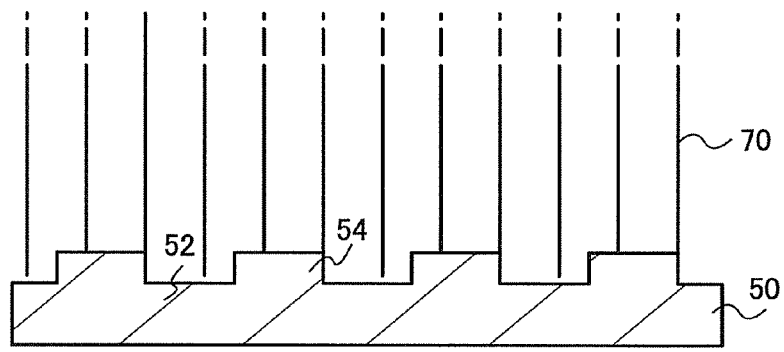
FIG. 2A is a cross sectional schematic view illustrating one example of a phase shift mask.
Figure 2B:
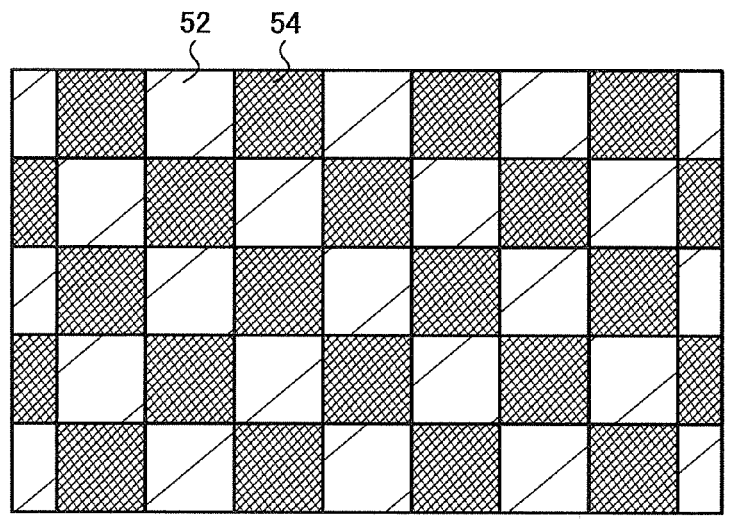
FIG. 2B is a plan schematic view illustrating the same.

Note that the pattern in the optical modulator, which gives the light intensity distribution where light intensity is modulated regularly to the laser beam, is designed by the practitioners as appropriate in consideration of reflectivity in a light incidence surface of a photoelectric conversion device. In this embodiment mode, the pattern shape of the phase shift mask 10, the pitch interval of the unevenness and the step of the unevenness (difference in height) may be set in accordance with a preferable uneven shape for realizing improvement of the photoelectric conversion efficiency due to reduction of the reflectivity. As an example thereof, FIGS. 2A and 2B are a schematic cross sectional view and a schematic plane view of a phase shift mask 50, respectively. In the phase shift mask 50, unevenness is formed by forming grooves with regular intervals in a quartz substrate. Seen from above, a recessed portion 52 and a projection portion 54 are arranged in a checkered flag pattern (checkered pattern).

Figure 2C:
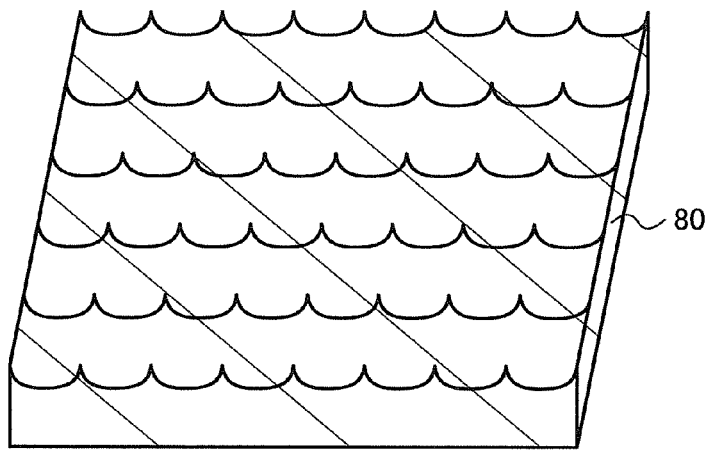
FIG. 2C is a perspective view illustrating one example of silicon on which an uneven structure is formed.

The phase shift mask 50 gives the same light intensity distribution as the phase shift mask 10 illustrated in FIG. 1A. The phase of a laser beam passing through the recessed portion 52 is not inverted and the phase of a laser beam passing through the projection portion 54 is shifted by $\pi$. Therefore, the checkered flag pattern is reflected in the maximum point and the minimum point in the light intensity distribution, whereby the maximum point and the minimum point are located in a grid pattern. With irradiation of silicon 80 with a laser beam 70 through the shift mask 50, a pattern shape of the shift mask 50 is reflected and projections with regular pitch intervals can be formed in a grid pattern. Thus, the silicon 80 with a surface uneven structure in which the projections with regular intervals are formed can be obtained as illustrated in a perspective view of FIG. 2C.

As described above, with laser beam irradiation through the optical modulator, the silicon having the uneven structure with regular intervals can be formed on its surface. The silicon is used as silicon included in the photoelectric conversion device to form an uneven structure in the light incidence surface of the photoelectric conversion device. Thus, reflection of incident light can be suppressed. Accordingly, absorptance with respect to light and photoelectric conversion efficiency can be improved, whereby the photoelectric conversion device with excellent photoelectric conversion characteristics can be manufactured.

Further, with a method according to this embodiment mode, the uneven structure with regular intervals is formed by utilizing crystal growth of silicon. The photoelectric conversion device with high efficiency can be realized without wasting a silicon material. In addition, when crystal defects exist, the crystal defects can be repaired or improved by recrystallization by a laser beam. Therefore, crystal defects in the silicon for photoelectric conversion can be reduced and high efficiency can be realized.

Note that, application of the phase shift mask as the optical modulator is exemplified in this embodiment mode; however, a means is not limited in the present invention as long as the means can modulate the light intensity of the laser beam regularly. For example, a mask with a slit pattern can be used instead of the phase shift mask. In this case, by irradiation with a laser beam through the mask having a slit pattern with regular intervals, a light intensity distribution in which a transmissive portion and a shielding portion are in a comb shape can be given.

Note that this embodiment mode can be combined with any of the other embodiment modes and embodiments, as appropriate.

Embodiment Mode 2

In this embodiment mode, a method for manufacturing a photoelectric conversion device in which unevenness is formed in a silicon layer for photoelectric conversion by irradiation with a laser beam using an optical modulator and a structure of the photoelectric conversion device formed by the method will be described.

Figure 3A:
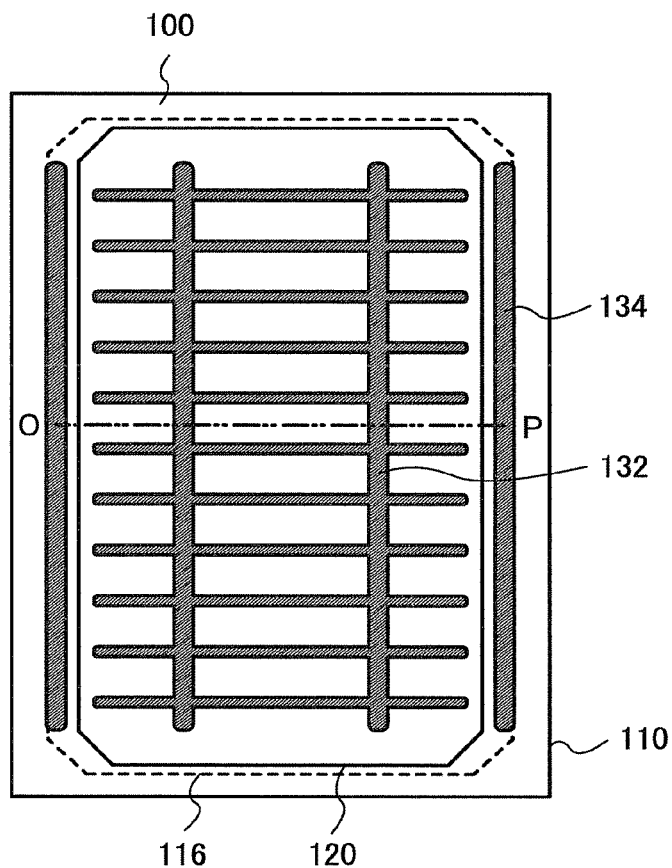
FIG. 3A is a plan view and FIG. 3B is a cross sectional view each illustrating one example of a photoelectric conversion device.
Figure 3B:
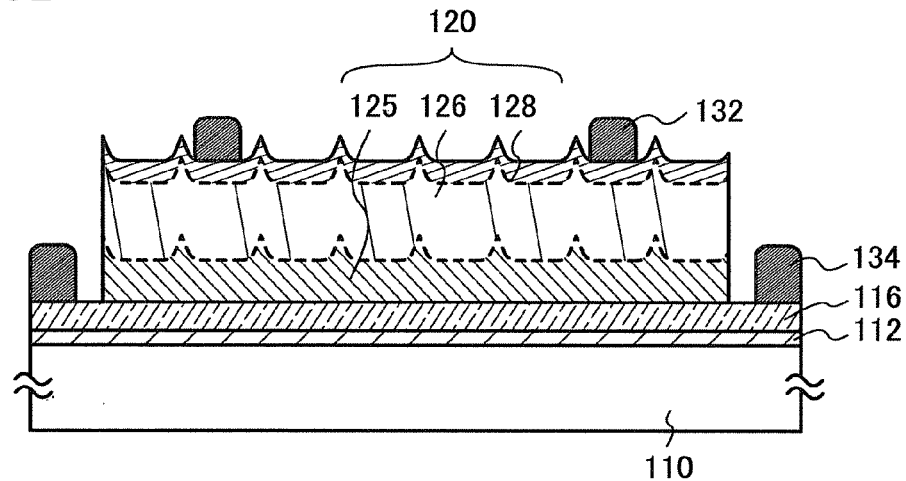

FIG. 3A illustrates an example of a top view of a photoelectric conversion device 100 according to this embodiment mode and FIG. 3B illustrates an example of a cross sectional view thereof. Note that FIG. 3B is the example of the cross sectional view taken along the line OP in FIG. 3A.

In the photoelectric conversion device 100, a first unit cell 120 in which a single crystal silicon layer is provided is formed over a supporting substrate 110. The first unit cell 120 is provided with the first electrode 116 on the supporting substrate 110 side, and the first unit cell 120 is provided with a second electrode 132 on a surface side which is opposite to the supporting substrate 110 side. The first unit cell 120 is interposed between the first electrode 116 and the second electrode 132.

An insulating layer 112 is provided between the supporting substrate 110 and the first unit cell 120. The first electrode 116 is provided between the insulating layer 112 and the first unit cell 120 over the supporting substrate 110. Moreover, an auxiliary electrode 134 is provided in electrical connection with the first electrode 116. The first electrode 116 and the second electrode 132 correspond to a positive electrode and a negative electrode. A structure in which the first electrode 116 and the second electrode 132 are exposed to the same side as the supporting substrate 110 is used in this embodiment mode. Further, the second electrode 132 side is set to a main light incident side in the photoelectric conversion device 100 according to this embodiment mode.

A light incident surface of the unit cell 120 is provided with projections with regular intervals to have an uneven structure. As for the projections formed in the surface, the largest difference in height (P–V) is greater than or equal to 50 nm, preferably greater than or equal to 150 nm. Note that the largest difference in height in this specification refers to a difference in height between the peak and lowest valley. The peak and the lowest valley in this specification refer to a peak and a valley obtained by three-dimensional expansion of the "peak" and the "valley" defined by JIS B0601. The peak is represented by the highest part of the peaks in the specified surface. The valley is represented by the lowest part of the valleys in the specified surface. In this embodiment mode, a second impurity silicon layer 128 is the light incident surface on which the projections are formed to be the uneven structure. As described above, the uneven structure on the light incident surface functions as a surface textural structure in the photoelectric conversion device and can contribute to improvement in photoelectric conversion efficiency.

In the unit cell 120, a first impurity silicon layer 125 having one conductivity type, a single crystal silicon layer 126, and a second impurity silicon layer 128 having a conductivity type opposite to the one conductivity type are sequentially stacked.

The first impurity silicon layer 125 having the one conductivity type and the second impurity silicon layer 128 having the conductivity type opposite to that of the first impurity silicon layer 125 are silicon layers each containing impurity elements imparting a predetermined conductivity type. When the first impurity silicon layer 125 is set to p-type, the second impurity silicon layer 128 is set to n-type. Needless to say, it is possible that the first impurity silicon layer 125 is set to n-type and the second impurity silicon layer 128 is set to p-type. An element belonging to Group 13 of the periodic table, such as boron or aluminum, is used as a p-type impurity element, and an element belonging to Group 15 of the periodic table, such as phosphorus or arsenic, is used as an n-type impurity element. Addition of the impurity element can be performed by ion implantation, ion doping, or laser doping.

Further, the first impurity silicon layer 125 can be formed using a single crystal silicon layer obtained by slicing a superficial portion of a single crystal silicon substrate. In this embodiment mode, the single crystal silicon substrate is irradiated with ions or cluster ions generated from a source gas containing hydrogen so that hydrogen is added to the single crystal silicon substrate at a high concentration. Then, heat treatment is performed and a surface layer of the single crystal silicon is separated to form the single crystal silicon layer. Alternatively, a single crystal silicon layer may be epitaxially grown on a porous silicon layer and then the porous silicon layer may be cleaved to be separated by water-jetting.

The single crystal silicon layer 126 is an epitaxially grown layer which has been epitaxially grown using a single crystal silicon layer in a bottom layer, which is the first impurity silicon layer 125 in this embodiment mode as a seed layer. Hereinafter, the single crystal silicon layer 126 is referred to as a second single crystal silicon layer 126 for convenience. The epitaxial growth can be either solid-state growth or vapor growth. Note that, since the second single crystal silicon layer 126 is the epitaxially grown layer using the single crystal silicon layer as a seed layer (the first impurity silicon layer 125 in this embodiment mode), both of the second single crystal silicon layer 126 and the single crystal silicon layer have crystals with almost the same crystal planes and crystal axes (crystal directions). Further, the second single crystal silicon layer 126 as the epitaxially grown layer is intrinsic (referred to as i-type) or weak n-type (referred to as n⁻-type).

The first unit cell 120 preferably has a thickness greater than or equal to 1 μm, which can absorb sunlight as a photoelectric conversion layer. For example, the thickness of the first unit cell 120 is set to be 1 μm to 20 μm, preferably 1 μm to 10 μm.

Note that in this specification, "ion doping" refers to a method in which an object is irradiated with the ions generated from a source gas without mass separation and an element included in the ions are added to the object. "Ion implantation" refers to a method in which an object is irradiated with ions generated from a source gas with performing mass separation and elements included in the ions are added to the object.

One of the first electrode 116 and the second electrode 132 corresponds to a positive electrode and the other corresponds to a negative electrode. The first electrode 116 is provided on the first impurity silicon layer 125 side in the first unit cell 120. The second electrode 132 is provided on the second impurity silicon layer 128 side in the unit cell 120. Further, the auxiliary electrode 134 is formed in contact with the first electrode 116. The auxiliary electrode 134 is exposed from the same side as the second electrode 132.

In the photoelectric conversion device 100 described in this embodiment mode, the second electrode 132 is formed so as to have a grid shape (or a comb shape or a pectinate shape) when it is seen from above. Such a shape is employed so that an effective area for light which is incident on the first unit cell 120 is increased as much as possible. In the photoelectric conversion device, since the second electrode 132 side is the light incident side, it is preferable that an area of the second electrode 132 which covers the surface of the first unit cell 120 be reduced as much as possible and that an area of the surface of the first unit cell 120 be exposed widely to the utmost extent.

Further, as the supporting substrate 110 which fixes the first unit cell 120, a substrate having an insulating surface or an insulating substrate is used. For example, any of different types of glass used in the electronics industry, such as aluminosilicate glass, aluminoborosilicate glass, and barium borosilicate glass, a quartz substrate; a ceramic substrate; a sapphire substrate, or the like can be used. Preferably, an inexpensive glass substrate which can have large area is used.

The insulating layer 112 is provided between the supporting substrate 110 and the first unit cell 120. As the insulating layer 112, a single-layer film or a stacked layer film formed of two or more layers can be used; note that a layer forming a bonding surface with the supporting substrate 110 functions as a layer for fixing the first unit cell 120 to the supporting substrate 110. In this specification, this layer is also referred to as "a bonding layer", for convenience. The layer for forming the bonding surface, which is a layer forming the outermost surface of the insulating layer 112 in this embodiment mode, preferably has an average surface roughness (Ra) of less than or equal to 0.5 nm, more preferably less than or equal to 0.3 nm in film formation. Note that the average surface roughness (Ra) in this specification refers to centerline average roughness defined by JIS B0601 which is expanded three dimensionally so as to correspond to a plane. Since as the average surface roughness in film formation of the layer for forming the bonding surface becomes smaller, a bonding at the bonding surface is strengthened, it is preferable that the average surface roughness is small. Note that, as the insulating layer 112, a blocking layer for preventing diffusion of an impurity or a stress relieving layer for strengthening the bonding may be provided as appropriate.

Next, an example of a method for manufacturing the photoelectric conversion device 100 of this embodiment mode is described with reference to FIGS. 4A to 4E, FIGS. 5A to 5D, and FIGS. 6A to 6D.

An embrittlement layer 108 is formed at a predetermined depth from one surface of a single crystal silicon substrate 101. Further, an impurity silicon layer 122 having one conductivity type, the first electrode 116, and the insulating layer 112 are formed on the one surface of the single crystal silicon substrate 101. The impurity silicon layer 122, the first electrode 116, and the insulating layer 112 are formed so as to be stacked in this order on the one surface of the single crystal silicon substrate 101.

Here, the embrittlement layer in this specification refers to a region weakened by irradiating the single substrate with ions, and the region at which separation into a single crystal silicon layer and a separated single crystal silicon substrate (single crystal silicon substrate) is occurred in a separation step to be described later (the step refers to a step for separating the single crystal silicon substrate by heat treatment in this embodiment mode) and the periphery of the region. Although a region from the surface to be irradiated to the embrittlement layer of the single crystal silicon substrate is weakened by the ion irradiation in some degree in some cases, the embrittlement layer in this specification refers to the region to be separated later and the periphery thereof.

A forming order of the embrittlement layer 108, the impurity silicon layer 122, the first electrode 116, and the insulating layer 112 and a forming method thereof are not limited to one, and the following alternatives (1) to (4) can be given. (1) A protection layer is formed on one surface of the single crystal silicon substrate. The single crystal silicon substrate is irradiated with the ions or the cluster ions from the surface on which the protection layer is formed to form the embrittlement layer in the region at a predetermined depth in the single crystal silicon substrate, and then an impurity element imparting one conductivity type is added to the single crystal silicon substrate to form the first impurity silicon layer on the one surface side of the single crystal silicon substrate. After removing the protection layer, a first electrode is formed over the first impurity silicon layer on the surface side where the protection layer was formed and then an insulating layer is formed over the first electrode. (2) The protection layer is formed on one surface of the single crystal silicon substrate. An impurity element imparting one conductivity type is added to the single crystal silicon substrate from the surface on which the protection layer is formed to form the first impurity silicon layer, and then the resulting single crystal silicon substrate is irradiated with the ions or the cluster ions from the surface on which the protection layer is formed to form the embrittlement layer in the region at a predetermined depth in the single crystal silicon substrate. After removing the protection layer, a first electrode is formed over the first impurity silicon layer on the surface side where the protection layer was formed and then an insulating layer is formed over the first electrode. (3) The first electrode is formed on one surface of the single crystal silicon substrate. The single crystal silicon substrate is irradiated with the ions or the cluster ions from the surface on which the first electrode is formed to form the embrittlement layer in the region at a predetermined depth in the single crystal silicon substrate. An impurity element imparting one conductivity type is added to the resulting single crystal silicon substrate from the surface on which the first electrode is formed to form the first impurity silicon layer on the one surface side of the single crystal silicon substrate, and then the insulating layer is formed over the first electrode. (4) The first electrode is formed on one surface of the single crystal silicon substrate. An impurity element imparting one conductivity type is added to the single crystal silicon substrate from the surface on which the first electrode is formed to form the first impurity silicon layer on the one surface side of the single crystal silicon substrate. The resulting single crystal silicon substrate is irradiated with the ions or the cluster ions from the surface on which the first electrode is formed to form the embrittlement layer in the region at a predetermined depth in the single crystal silicon substrate, and then the insulating layer is formed over the first electrode. In this embodiment mode, forming order (1) is described as an example.

Figure 4A:
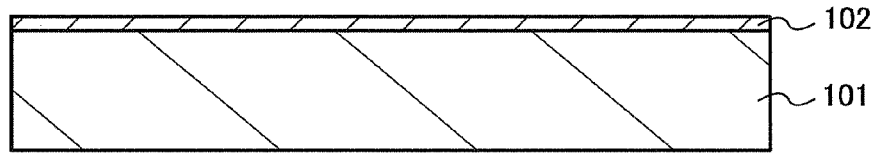
FIGS. 4A to 4E are cross sectional views illustrating one example of a method for manufacturing a photoelectric conversion device.
Figure 4B:
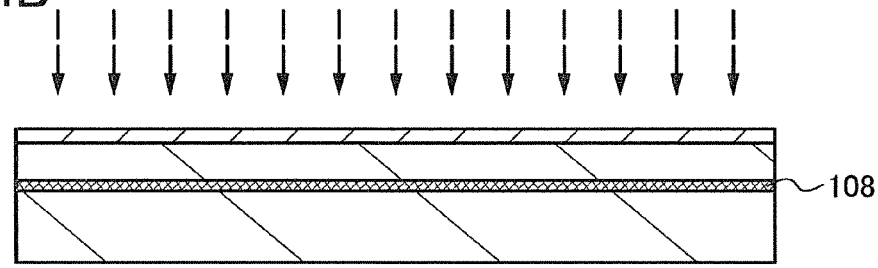

A protection layer 102 is formed on one surface of the single crystal silicon substrate 101 (see FIG. 4A) and the single crystal silicon substrate 101 is irradiated with ions or cluster ions from the surface on which the protection layer 102 is formed to form the embrittlement layer 108 in the region at a predetermined depth from the one surface side of the single crystal silicon substrate (see FIG. 4B).

There is no particular limitation on the shape of a plane face of the single crystal silicon substrate 101. But the shape of a plane face of the single crystal silicon substrate 101 is preferably substantially quadrangular if a supporting substrate to which the single crystal silicon substrate 101 is fixed later is rectangular in shape. For example, as the single crystal silicon substrate 101, a single crystal silicon substrate which is p-type and which has a resistivity of about 1Ω to 40Ω can be used. Note that a polycrystalline silicon substrate may be used instead of the single crystal silicon substrate. In this case, the first unit cell 120 has a polycrystalline silicon layer, not a single crystal silicon layer.

Figure 7A:
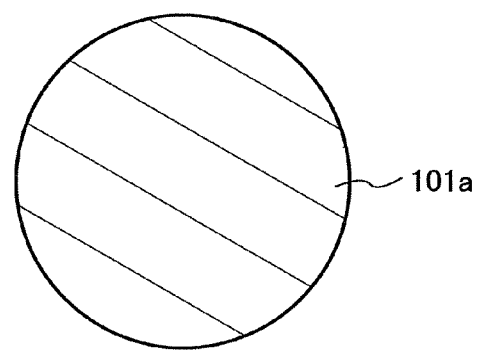
FIGS. 7A to 7D are views each illustrating one mode in which a single crystal silicon substrate in a predetermined shape is cut out from a circular single crystal silicon substrate.
Figure 7B:
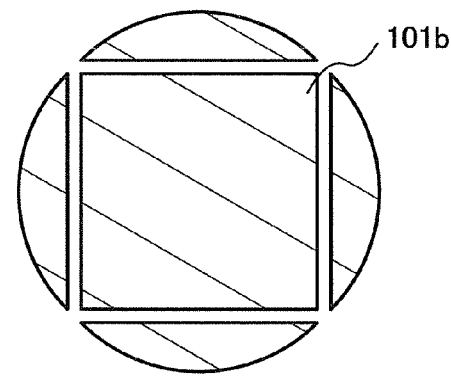
Figure 7C:
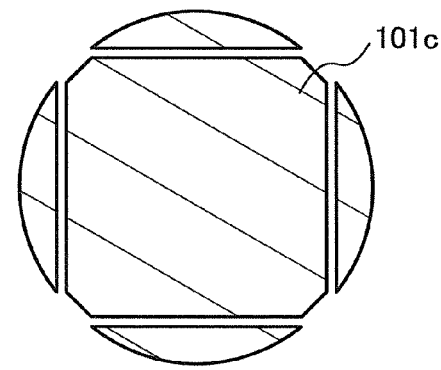
Figure 7D:
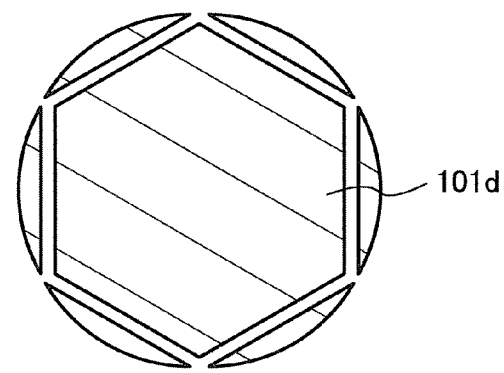

Many single crystal silicon substrates put in to public circulation, which have a circular shape in many cases, may be used as it is or can be cut into substrates having a desired shape. For example, a single crystal silicon substrate 101a having a circular shape may be used as illustrated in FIG. 7A, or may be cut to form a silicon substrate 101b or a silicon substrate 101c having a roughly-quadrangular shape as illustrated FIGS. 7B and 7C. FIG. 7B illustrates the case where the single crystal silicon substrate 101b is cut out to have a quadrangular shape of maximum size with its corners inscribed in the periphery of the circular single crystal silicon substrate 101a. The angle at each corner of the single crystal silicon substrate 101b is about 90 degrees. FIG. 7C illustrates the case where the single crystal silicon substrate 101c is cut out so that the distance between the opposing lines is longer than that of the rectangular region with the maximum size whose corners are inscribed in the periphery of the circular single crystal semiconductor substrate 101a. The angle of each corner of the single crystal silicon substrate 101c is not 90° and the single crystal silicon substrate 101c has a polygonal shape, not a rectangular shape. Further, a hexagonal crystal silicon substrate 101d may be cut out as illustrated in FIG. 7D. FIG. 7D illustrates the case where the single crystal semiconductor substrate 101d is cut out to have a hexagonal shape of maximum size with its corners inscribed in the periphery of the circular single crystal silicon substrate 101a. When the single crystal silicon substrate is cut out to have a hexagonal shape, the amount of a material loss corresponding to a cutting margin is lower than that in the case of a rectangular substrate. Further, when a plurality of photoelectric conversion layers are formed over one supporting substrate to form a solar cell module, the single crystal silicon substrate may be cut out to have a hexagonal shape. In order to form the plurality of photoelectric conversion layers over one supporting substrate, first, a plurality of single crystal silicon substrates are bonded to the supporting substrate. In the case of the hexagonal single crystal silicon substrates, it is easier to arrange the single crystal silicon substrates without any space therebetween than in the case of another polygonal single crystal silicon substrate and the number of the single crystal silicon substrates to be bonded to the supporting substrate is larger than that in the case of another polygonal single crystal silicon substrate.

In FIG. 4A, the protection layer 102 is a layer for preventing the surface of the single crystal silicon substrate 101 from being etched or being damaged in formation of the embrittlement layer 108 and the impurity silicon layer 122, and is formed using a silicon oxide layer, a silicon nitride layer, a silicon oxynitride layer, or a silicon nitride oxide layer, or the like. For example, as the protection layer 102, a chemical oxide with a thickness of 2 nm to 5 nm is formed on the surface of the single crystal silicon substrate 101 with treatment with ozone water or a hydrogen peroxide solution or a treatment in an ozone atmosphere. An oxide layer with a thickness of 2 nm to 10 nm may be formed, as the protection layer 102, over the surface of the single crystal silicon substrate 101 by a thermal oxidation method or oxygen radical treatment. Further, the protection layer 102 with a thickness of 2 nm to 50 nm may be formed by a plasma CVD method.

Note that a silicon oxynitride layer refers to a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide layer refers to a layer that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The embrittlement layer 108 is a weakened region where a crystal structure is partly disordered. The embrittlement layer 108 is formed by irradiation with, for example, ions or cluster ions and addition of elements forming the ions or the cluster ions. Here, the single crystal silicon substrate 101 is irradiated with ions or cluster ions to form the embrittlement layer 108 in a region at a predetermined depth in the single crystal silicon substrate 101. Ions or cluster ions are preferably generated using a source gas containing hydrogen. With irradiation with ions or cluster ions generated using a source gas containing hydrogen, hydrogen is added to the single crystal silicon substrate 101 to form the embrittlement layer 108. Note that the embrittlement layer 108 is formed at a certain depth of the single crystal silicon substrate 101 and the depth is in proportion to the acceleration voltage. Note that, with irradiation with ions or cluster ions using a source gas containing fluorine or helium instead of hydrogen, addition of fluorine or helium may be performed. Further, addition of a plurality of elements, such as hydrogen and fluorine or hydrogen and helium, may be performed. As the ions or cluster ions generated from the source gas containing hydrogen, $H^+$ ions, $H_2^+$ ions, and $H_3^+$ ions are given. Preferably, $H_3^+$ ions is contained at a proportion greater than or equal to 50%, more preferably greater than or equal to 80% in the total amount of ion species ($H^+$ ions, $H_2^+$ ions, and $H_3^+$ ions) for irradiation to form the embrittlement layer 108. Further, irradiation of ions or cluster ions are preferably performed using an ion doping apparatus in which a mass separation is not performed. A percentage of a single type of ions out of plural types of generated ions is set to greater than or equal to 50%, whereby a region at the same depth of the single crystal silicon substrate can be weakened intensively. Further, addition efficiency of hydrogen can be improved by using $H_3^+$ ions. By irradiation with ions or cluster ions controlling an accelerating voltage and a dosage thereof, the embrittlement layer 108, which is a region locally doped with high concentration, can be formed in a region at a predetermined depth in the single crystal silicon substrate 101. For example, the embrittlement layer 108 is provided with microvoids to have a porous structure. When the embrittlement layer 108 is formed by irradiation with hydrogen, it is preferable that the embrittlement layer 108 contains hydrogen at a $5\times10^{20}$ atoms/cm$^3$ in hydrogen atom equivalent.

Note that a step of irradiation with ions or cluster ions can also be performed using an ion implantation apparatus. The ion implantation apparatus is a mass-separation apparatus in which mass separation is performed on generated ions and irradiation with a particular type of ions is performed. Therefore, when the ion implantation apparatus is used, irradiation with only a single type of ions selected from $H^+$ ions, $H_2^+$ ions, and $H_3^+$ ions is performed.

The thickness of the single crystal silicon layer separated from the single crystal silicon substrate 101, namely the thickness of the single crystal silicon layer to be fixed to the supporting substrate later is determined depending on the depth at which the embrittlement layer 108 is formed. The depth at which the embrittlement layer 108 is formed can be controlled by the accelerating voltage and the like in irradiation with ions or cluster ions. The thinner the single crystal silicon layer separated from the single crystal silicon substrate 101 is, the thicker the rest of the single crystal silicon substrate is. Accordingly, the number of times of reusing the substrate can be increased. However, in order to thin the single crystal silicon layer to be separated, the embrittlement layer 108 needs to be formed at shallower region and the acceleration voltage needs to be lower. When the acceleration voltage is low, the irradiation takes a longer time and the takt time goes worse; therefore, the embrittlement layer 108 needs to be formed at a depth in consideration of the productivity or the like.

With use of $H_3^+$ ions, the embrittlement layer 108 can be easily formed at a shallower region in the single crystal silicon substrate 101 compared with use of $H^+$ ions. For example, the embrittlement layer 108 is formed in a region at depth A from the one surface side of the single crystal silicon substrate 101. When an accelerating voltage of $H^+$ ions is set to B, an accelerating voltage of $H_3^+$ ions can be set to approximately 3 B. This is because when the single crystal silicon substrate is irradiated with $H_3^+$ ions, $H_3^+$ ions collide with atoms forming the single crystal silicon substrate or atoms forming a top layer of the single crystal silicon substrate to be separated into H atoms or $H^+$ ions. If the accelerating voltage can be increased, the takt time in irradiation with ions can be reduced. Therefore, when the single crystal silicon layer which is to be separated is made thin using $H_3^+$ ions, reduction of productivity can be prevented. Further, by making the separated single crystal silicon layer thin, the number of times of reusing the rest of the substrate can be increased.

The doping with the cluster ions typified by $H_3^+$ ions can be performed using an ion doping apparatus in such a manner that hydrogen plasma is generated from a source gas including hydrogen, the cluster ions generated in the hydrogen plasma are accelerated by voltage without mass separation, and irradiation is performed. With use of the ion doping apparatus, the single crystal silicon substrate 101 even with a large area can be homogeneously doped. That is, an ion doping method is preferably used.

For example, irradiation with ions or cluster ions is performed at a dosage of $1\times10^{16}$ ions/cm$^2$ to $5\times10^{16}$ ions/cm$^2$ mainly using $H_3^+$ ions to add hydrogen, whereby the embrittlement layer 108 can be formed. Hydrogen is added at a dosage of $3\times10^{16}$ atoms/cm$^2$ to $1.5\times10^{17}$ atoms/cm$^2$ in hydrogen atom equivalent to form the embrittlement layer 108.

Here, an example of forming the embrittlement layer 108 is described. For example, the protection layer 102 with a thickness of 50 nm is formed over the single crystal silicon substrate 101. Then, ion doping is performed under the condition where an $H_2$ gas is used for a source gas, the acceleration voltage is 25 kV, the RF electric power is 100 W, and the dosage is $2.2\times10^{16}$ ions/cm$^2$. With the embrittlement layer 108 formed under such a condition, a single crystal silicon layer with a thickness of about 120 nm can be separated from the single crystal silicon substrate 101 by heat treatment to be performed later.

Note that, as illustrated in FIG. 4B, the protection layer 102 is irradiated with ions or cluster ions and element (which is hydrogen in the case of $H^+$ ions, $H_2^+$ ions, and $H_3^+$ ions) forming the ions or cluster ions is added through the protection layer 102, whereby damage, such as damage to the surface of the single crystal silicon substrate 101 due to etching, can be prevented.

Figure 8:
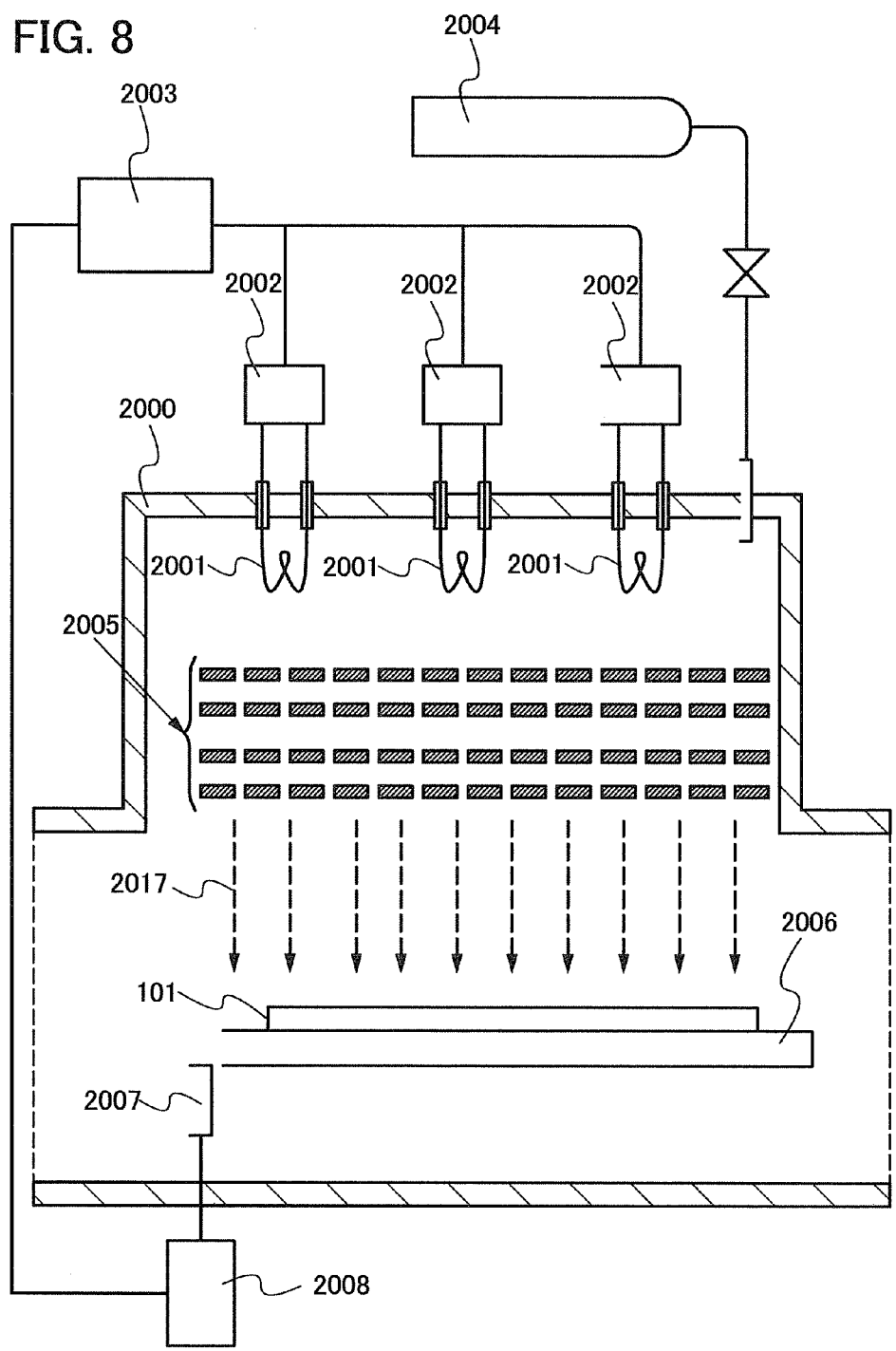
FIG. 8 is a conceptual view illustrating a structure of an ion doping apparatus.

Here, FIG. 8 illustrates an example of a schematic diagram, which describes a structure of an ion doping apparatus that irradiates the single crystal silicon substrate 101 with a plurality of types of ions generated from an ion source 2000 without mass separation. A predetermined source gas containing hydrogen or the like is supplied from a gas supply portion 2004 to the ion source 2000. The ion source 2000 is provided with filaments 2001. A filament power source 2002 applies arc discharge voltage to each filament 2001 to control the amount of current that flows to the filament 2001. The source gas supplied from the gas supply portion 2004 is exhausted by an exhaustion system.

The ions generated from the ion source 2000 are extracted through an extraction electrode system 2005, and an ion beam 2017 is thus formed. The single crystal silicon substrate 101 disposed on a mounting board 2006 is irradiated with the ion beam 2017. The proportions of the plurality of types of ions in the ion beam 2017 are calculated with a mass spectrometer tube 2007 provided in the periphery of the mounting board 2006. The ion density calculated with the mass spectrometer tube 2007 is converted into signals by using a mass spectrometer 2008 and the results may be fed back to a power source controller 2003. The power source controller 2003 can control the filament power sources 2002 in accordance with calculation results on the ion density.

When the proportion of $H_3^+$ ions is high, the embrittlement layer 108 can contain hydrogen at a concentration greater than or equal to $1\times10^{20}$ atoms/cm$^3$, preferably greater than or equal to $5\times10^{20}$ atoms/cm$^3$. Since the region containing hydrogen at high concentration is formed locally in the single crystal silicon substrate 101, a crystal structure is damaged and microvoids are formed. Therefore, the embrittlement layer 108 formed in the single crystal silicon substrate 101 has a porous structure. When heat treatment is performed at a comparatively low temperature (less than or equal to 600° C.), the microvoids formed in the embrittlement layer 108 change in volume, whereby the single crystal silicon substrate 101 can be separated along the embrittlement layer 108. The concentration of hydrogen in the embrittlement layer 108 depends on the dosage, the acceleration voltage, or the like of the ions or cluster ions.

Note that the depth at which the embrittlement layer 108 is formed can be homogenized when irradiation with the ions or cluster ions is performed in such a manner that a linear ion beam longer than one side of the single crystal silicon substrate 101 with a substantially quadrilateral shape scans the surface of the single crystal silicon substrate 101.

Figure 4C:
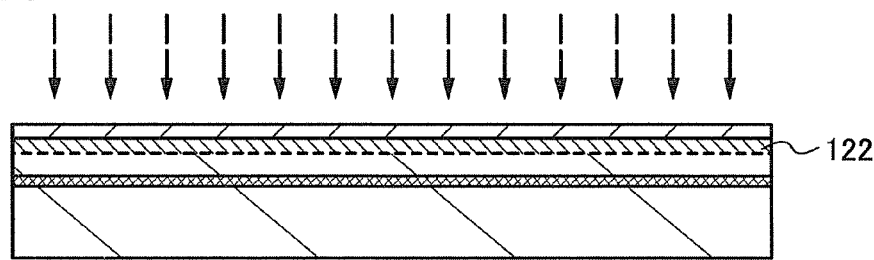

Next, the impurity silicon layer 122 is formed on the one surface side of the single crystal silicon substrate 101 by adding an impurity element imparting one conductivity type from the surface side where the protection layer 102 is formed (see FIG. 4C). The impurity element is added to the single crystal silicon substrate 101 through the protection layer 102 to form the impurity silicon layer 122 between the single crystal silicon substrate 101 and the protection layer 102.

The impurity silicon layer 122 is formed by addition of the impurity element imparting one conductivity type by an ion doping method, an ion implantation method, or a laser doping method. For example, boron is added as the impurity element imparting one conductivity type, thereby forming a p-type the impurity silicon layer 122. Boron is added preferably using an ion doping apparatus in such a manner that ions generated from a source gas containing $B_2H_6$ or $BF_3$ are accelerated by voltage without mass separation and the substrate is irradiated with the ions. The source gas for adding the impurity element imparting one conductivity type can include hydrogen or a rare gas; in this case, a gas formed from $B_2H_6$ or $BF_3$ to which hydrogen or helium is added can be used as a source gas. Even when the area of the single crystal silicon substrate 101 exceeds 300 mm diagonally, an area to be irradiated with the ion beam can be enlarged, and the process can be efficient. For example, a linear ion beam whose long side length is more than 300 mm is formed and delivered from one end to the other end of the single crystal silicon substrate 101; thus, the impurity silicon layer 122 can be formed homogeneously over the entire surface of the single crystal silicon substrate 101.

Further, the impurity silicon layer 122 is not limited to single crystal silicon or polycrystalline silicon and may be formed using microcrystalline silicon or amorphous silicon. For example, the impurity silicon layer 122 can be formed by a plasma CVD method using a source gas which is obtained by adding a doping gas containing boron, such as diborane, to a silane based gas. In the case where the impurity silicon layer 122 is formed by a plasma CVD method, before formation of the protection layer 102 or after removal thereof, a native oxide film or the like formed over the single crystal silicon substrate 101 is removed and then the impurity silicon layer 122 is formed. When the impurity silicon layer 122 is formed using microcrystalline silicon or amorphous silicon, the impurity silicon layer 122 is preferably formed to be thin in order to prevent reduction of carrier collection efficiency. Note that when the impurity silicon layer 122 is formed before formation of the embrittlement layer 108, the impurity silicon layer 122 can be formed by a thermal diffusion method.

Figure 4D:
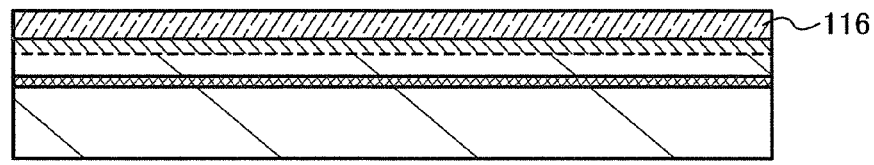

Next, the protection layer 102 is removed, and then the first electrode 116 is formed over the impurity silicon layer 122 (see FIG. 4D).

The first electrode 116 needs to be formed from a material which resists the temperature of heat treatment later performed for separating the single crystal silicon substrate 101; therefore, a metal with a high melting point is preferred. Specifically, the heat resistance to the temperature about the strain point of the supporting substrate 110 is necessary. For example, a metal material such as titanium, molybdenum, tungsten, tantalum, chromium, or nickel is applied. A stacked structure of the aforementioned metal material and nitride of the metal material can be applied. For example, a stacked structure of a titanium nitride layer and a titanium layer, a stacked structure of a tantalum nitride layer and a tantalum layer, a stacked structure of a tungsten nitride layer and a tungsten layer, and the like are given. When the stacked structure is formed using the nitride, the nitride is formed on a surface to be in contact with the impurity silicon layer 122. By the formation of the nitride, the first electrode 116 and the impurity silicon layer 122 can have closer contact to each other. Further, a surface of the first electrode 116 preferably has an average surface roughness (Ra) of less than or equal to 0.5 nm, more preferably less than or equal to 0.3 nm. Needless to say, it is preferable that the average surface roughness (Ra) is preferably as small as possible. When the surface of the first electrode 116 is superior in smoothness, a favorable bonding with the supporting substrate 110 can be performed. Of course, by forming a layer which is superior in smoothness as a layer which form a bonding surface (which is a layer forming an outermost surface of the insulating layer 112 in this embodiment mode), the bonding with the supporting substrate 110 can be performed; however, when the first electrode 116, which is a bottom layer, is superior in smoothness, a superiority in smoothness of the insulating layer 112, which is a top layer, can be realized easily. In addition, depending on circumstances, a direct bonding between the first electrode 116 and the supporting substrate can be formed without formation of the insulating layer on the bonding surface. Specifically, titanium is preferable because the surface of the first electrode 116 is superior in smoothness when the first electrode 116 is formed using titanium. The first electrode 116 can be formed to have a thickness greater than or equal to 100 nm by a vapor deposition method or a sputtering method. In the case where a native oxide layer or the like is formed over the impurity silicon layer 122, the native oxide layer or the like is removed and then the first electrode 116 is formed.

Figure 4E:
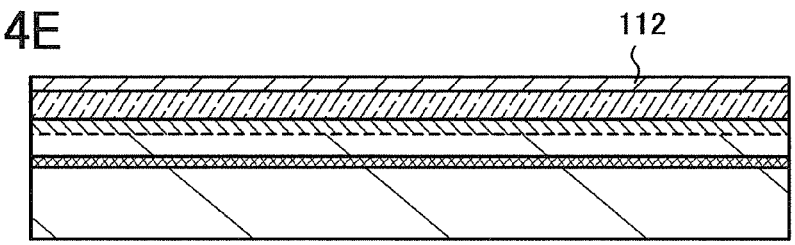

The insulating layer 112 is formed over the first electrode 116 (see FIG. 4E). The insulating layer 112 may be a single-layer film or a stacked film having two or more layers. The bonding surface for forming the bonding with the supporting substrate (or a material layer provided over the supporting substrate) preferably has smoothness, more preferably smoothness and hydrophilic surface. As for the smoothness of the bonding surface, specifically, an average surface roughness (Ra) is less than or equal to 0.5 nm, preferably less than or equal to 0.3 nm because a favorable bonding with the supporting substrate can be realized. Needless to say, it is preferable that the average surface roughness (Ra) is as small as possible. As a layer forming the bonding surface, which is the insulating layer 112 in this embodiment mode, a silicon oxide layer, a silicon nitride layer, a silicon oxynitride layer, or a silicon nitride oxide layer is formed. As a method for forming the insulating layer 112, a plasma CVD method, a photo CVD method, a thermal CVD method (including a low pressure CVD method or a normal pressure CVD method) or the like may be applied. Preferably, a plasma CVD method is applied to form a layer having favorable smoothness.

As the layer forming the bonding surface, a layer which can have smoothness and can form a hydrophilic surface is preferably formed; specifically, a silicon oxide layer formed by a plasma CVD method using an organosilane based gas as a source gas is preferable. With use of such a silicon oxide layer, a bonding between the supporting substrate and the unit cell which is to be formed later can be strengthened. As the organosilane based gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and tris-dimethylaminosilane ($SiH(N(CH_3)_2)_3$).

In addition, as the layer for forming the bonding surface, silicon nitride, silicon nitride oxide, silicon oxide, or silicon oxynitride, which is formed by a plasma CVD method using a silane based gas, such as silane, disilane, or trisilane, as a source gas for film formation, can also be used. For example, a silicon nitride layer formed by a plasma CVD method using silane and ammonia as a source gas for film formation can be applied. The source gas may further contain hydrogen. Alternatively, a silicon nitride oxide layer can be formed by a plasma CVD method using a dinitrogen monoxide gas, in addition to silane and ammonia, for a source gas.

For example, the insulating layer 112 is formed using a stack of a 50-nm-thick silicon oxynitride layer, a 50-nm-thick silicon nitride oxide layer, and a 50-nm-thick silicon oxide layer. These insulating layers can be formed by a plasma CVD method. In this case, the layer for forming the bonding surface is the silicon oxide layer and the average surface roughness (Ra) of a surface of the silicon oxide layer after film formation is preferable set to be less than or equal to 0.5 nm, preferably less than or equal to 0.3 nm. Such a silicon oxide layer can be formed by a plasma CVD method using a TEOS gas as a source gas. When the insulating layer 112 includes a silicon insulating layer including nitrogen, specifically a silicon nitride layer or a silicon nitride oxide layer, diffusion of impurities from the supporting substrate 110 which is bonded later can be prevented.

In any case, the layer forming the bonding surface is not limited to an insulating layer containing silicon as long as the layer for forming the bonding surface is an insulating film having smoothness, specifically, having an average surface roughness (Ra) of less than or equal to 0.5 nm, preferably less than or equal to 0.3 nm. The insulating layer 112 formed over the first electrode 116 needs to be formed at a temperature at which hydrogen is not desorbed from the embrittlement layer 108 formed in the single crystal silicon substrate 101, preferably at 350° C. or lower.

Figure 5A:
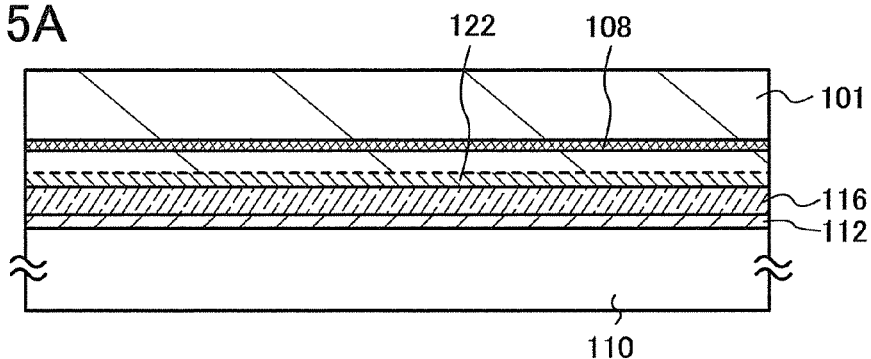
FIGS. 5A to 5D are cross sectional views illustrating one example of the method for manufacturing the photoelectric conversion device.

The one surface side of the single crystal silicon substrate 101 and one surface side of the supporting substrate 110 are disposed to face each other and bonded to each other (see FIG. 5A). In this embodiment mode, the insulating layer 112 formed over the single crystal silicon substrate 101 and the one surface side of the supporting substrate 110 are in contact with and bonded to each other. The bonding surface corresponds to the one surface of the insulating layer 112 (the surface not in contact with the first electrode 116) and the one surface of the supporting substrate 110.

The bonding surfaces (which are the one surface of the insulating layer 112 and the one surface of the supporting substrate 110) should be cleaned sufficiently in advance. This is because a bonding defect can be caused if the bonding surface had particles such as microscopic dust. Specifically, it is preferable to clean each bonding surface. For example, the bonding surface is cleaned by performing ultrasonic cleaning with pure water and an ultrasonic of 100 kHz to 2 MHz, megasonic cleaning, or two fluid cleaning with nitrogen, dried air, and pure water. Further carbon dioxide or the like is added to pure water for cleaning and resistivity is reduced to less than or equal to 5 MΩcm, whereby generation of static electricity may be prevented.

The bonding surface of the single crystal silicon substrate 101 and the bonding surface of the supporting substrate 110 are in contact with and bonded to each other. In this embodiment mode, the one surface side of the insulating layer 112 and the one surface side of the supporting substrate 110 are in contact and bonded to each other. This bonding is formed by an operation of van der Waals forces or hydrogen bonding. For example, by making the single crystal silicon substrate 101 and the supporting substrate 110 face each other and pressing one part thereof from the outside, a distance between the bonding surfaces is locally shortened, whereby the bonding by an operation of van der Waals forces or hydrogen bonding can spread throughout the bonding surface. When one or both of the bonding surfaces have hydrophilic surfaces, a hydroxyl group or a water molecule functions as an adhesive and water molecules diffuse in later heat treatment. The remaining composition forms a silanol group (Si—OH) and the bonding is formed by hydrogen bonding. Further, this bonding portion forms a siloxane bonding (O—Si—O) by release of hydrogen to become a covalent bond, which forms firmer bonding. Each of the bonding surfaces (the one surface of the insulating layer 112 and the one surface of the supporting substrate 110) of both of the substrates (the single crystal silicon substrate 101 and the supporting substrate 110) preferably has an average surface roughness (Ra) of less than or equal to 0.5 nm, preferably less than or equal to 0.3 nm. Further, the total average surface roughness (Ra) of both of the substrates is less than or equal to 0.7 nm, preferably less than or equal to 0.6 nm, more preferably less than or equal to 0.4 nm. When these conditions for the bonding surface are satisfied, a favorable bonding can be realized and a strong bonding can be formed.

Figures 1, 23A:
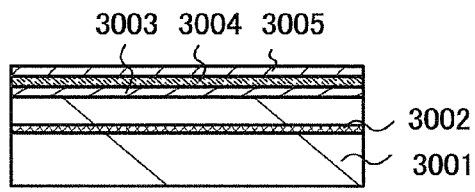
FIGS. 23A-1 to 23E are schematic views illustrating a structure of a measured sample and a manufacturing method thereof.
Figures 2, 23A:
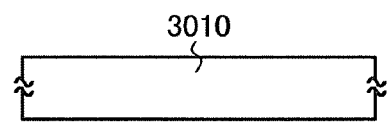

Note that described in aforementioned Reference 1 is as follows: a single crystal silicon substrate is bonded to a surface of a paste for forming an electrode and heat treatment is performed, whereby an organic solvent in the paste for forming an electrode is evaporated to form a bottom electrode layer; a single crystal silicon plate is bonded to the bottom electrode layer; and the paste for forming an electrode functions as a material for the bottom electrode layer and adhesive (see FIG. 2 and description thereof in Reference 1). That is, in Reference 1, the paste for forming an electrode which forms the bottom electrode layer functions as adhesive. On the other hand, a structure according to this embodiment mode is a structure in which the bonding is formed by making the insulating layer and the supporting substrate in contact each other. Therefore, the bonding method according to this embodiment mode is completely different to that of Reference 1.

The bonding surface may be activated in order to perform a favorable bonding of the supporting substrate 110 and the single crystal silicon substrate 101. For example, one or both of the bonding surfaces are irradiated with an atom beam or an ion beam. When an atomic beam or an ion beam is used, an inert gas neutral atom beam or inert gas ion beam of argon or the like can be used. It is also possible to activate the bonding surface by plasma treatment or radical treatment. Such surface treatment facilitates forming a bond between different materials even at temperatures of 400° C. or lower. Further, one or both of the bonding surfaces may be cleaned with ozone-containing water, oxygen-containing water, hydrogen-containing water, pure water, or the like. Such cleaning treatment can make the bonding surface hydrophilic and increase the number of hydroxyl groups at the bonding surface, thereby further strengthening the bonding. Further, as surface treatment for performing a favorable bonding, the bonding surface may be subjected to sputter etching. For example, the surface treatment is performed in a such a manner that an inert gas (an Ar gas, for example) and/or a reactive gas (an $O_2$ gas or an $N_2$ gas, for example) are/is introduced into a chamber which is set to a vacuum state and a surface to be processed (which is the one surface of the supporting substrate 110 or the outermost surface of the insulating layer 112 in this embodiment mode) is applied with a bias voltage to be in a plasma state. In plasma, an electron and a cation of Ar are present, and the cation of Ar is accelerated in a cathode direction (the surface to be processed side). With collision of the accelerated cation of Ar with the surface to be processed, the surface to be processed can be subjected to sputter etching. At this time, a projection portion of the surface to be processed is subjected to sputter etching preferentially and smoothness of the surface to be processed can be improved.

After bonding the single crystal silicon substrate 101 and the supporting substrate 110 to each other, heat treatment or pressure treatment is preferably performed. Heat treatment or pressure treatment can increase the bonding strength. If the heat treatment is performed, the temperature of the heat treatment is set at a temperature that is lower than or equal to the strain point of the supporting substrate 110 and is a temperature which does not cause change in volume of the embrittlement layer 108 formed in the single crystal silicon substrate 101, preferably at a temperature higher than or equal to 200° C. and lower than 410° C. Note that this heat treatment is performed and then the heat treatment for separation may be successively performed. Further, it is preferable that in a device or a place where the bond is performed, heat treatment is successively performed at greater than or equal to 200° C. to strengthen the bond. The pressure treatment is performed so that pressure is applied perpendicularly to the bonding surface, in consideration of the pressure resistance of the supporting substrate 110 and the single crystal silicon substrate 101.

Note that, an insulating layer may be formed on the supporting substrate 110 side in advance and may be used as the bonding surface. That is, the insulating layer formed on the supporting substrate side and the insulating layer formed on the single crystal silicon substrate side are bonded as the bonding surfaces. Further, a silicon insulating layer containing nitrogen, such as a silicon nitride layer or a silicon nitride oxide layer may be formed on the supporting substrate 110 side. The silicon insulating layer containing nitrogen can function as a blocking layer which prevents contamination with impurities from the supporting substrate 110.

Heat treatment is performed and the single crystal silicon substrate 101 is separated. This separation of the single crystal silicon substrate 101 is performed using the embrittlement layer 108 or the periphery of the embrittlement layer 108 as a boundary. Accordingly, part of the single crystal silicon substrate 101, which is fixed to the supporting substrate 110, is separated. A single crystal silicon layer 124 separated from the single crystal silicon substrate 101 is left over the supporting substrate 110, whereby a so-called SOI structure can be obtained. Hereinafter, the single crystal silicon layer 124 is referred to as a first single crystal silicon layer 124, for convenience. The first single crystal silicon layer 124 has almost the same crystallinity as the single crystal silicon substrate 101. Further, by separating the first single crystal silicon layer 124 from the single crystal silicon substrate 101, a separated single crystal silicon substrate 103 can be obtained (see FIG. 5B).

The heat treatment for separating the first single crystal silicon layer 124 from the single crystal silicon substrate 101 using the embrittlement layer 108 as a boundary is preferably performed at a temperature higher than or equal to 410° C. and less than the strain point of the supporting substrate 110. Further, the heat treatment is preferably performed at a temperature higher than or equal to a film formation temperature of the insulating layer 112. When the temperature of the heat treatment is set to be higher than or equal to 600° C., preferably higher than or equal to 630° C. and less than the strain point of the supporting substrate 110, the impurity element in the impurity silicon layer 122 can be activated without distortion of the supporting substrate 110. When the heat treatment is performed at, for example, higher than or equal to 450° C. and less than 700° C., the microvoids formed in the embrittlement layer 108 change in volume, whereby separation of the single crystal silicon substrate 101 occurs along the embrittlement layer 108. Since the insulating layer 112 forms a bond with the supporting substrate 110, the first single crystal silicon layer 124 is formed over the supporting substrate 110. The thickness of the first single crystal silicon layer 124 approximately corresponds to the depth at which the embrittlement layer 108 is formed. Further, the insulating layer 112, the first electrode 116, and the impurity silicon layer 122 are formed between the supporting substrate 110 and the first single crystal silicon layer 124.

The separated single crystal silicon substrate 103, which is a single crystal silicon substrate obtained by separating the first single crystal silicon layer 124 from the single crystal silicon substrate 101, can be reused after recycling treatment. The separated single crystal silicon substrate 103 may be used as a single crystal silicon substrate for manufacturing a photoelectric conversion device or for another purpose. If the separated single crystal silicon substrate 103 is reused repeatedly as a single crystal silicon substrate from which a single crystal silicon layer is separated, a plurality of photoelectric conversion devices can be manufactured from one material substrate. Further, the thinner the thickness of the first single crystal silicon layer 124 which is separated is, the thicker the separated single crystal silicon substrate 103 can be. In addition, the number of times of reusing can be increased and resources can be used effectively.

Figure 5B:
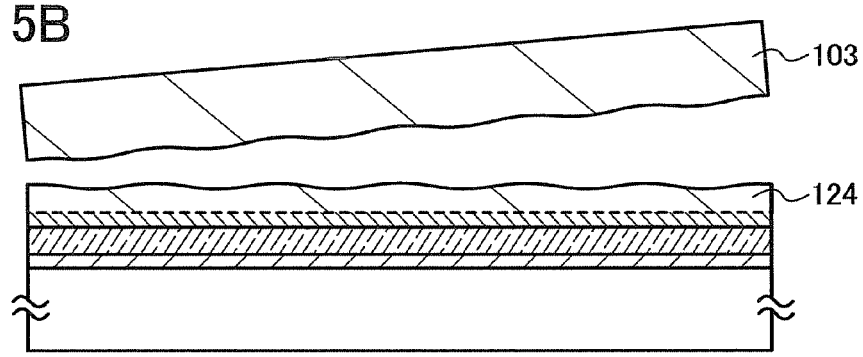
Figure 5C:
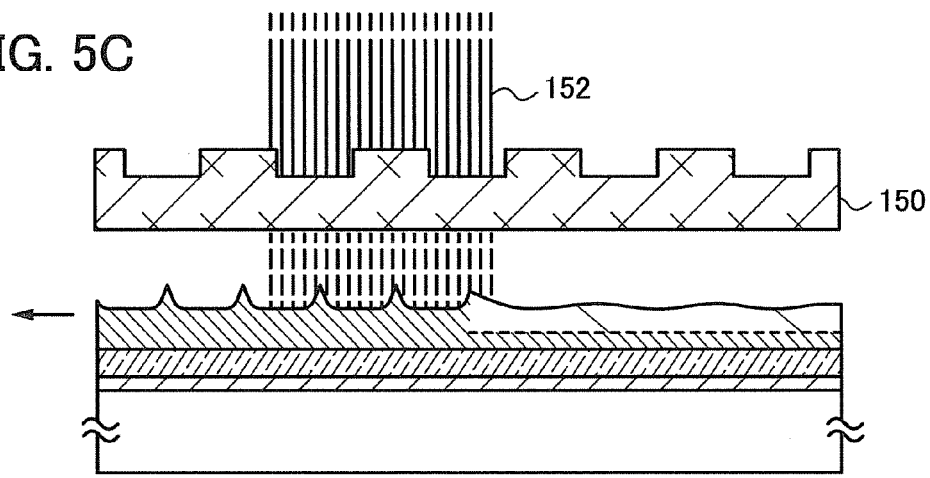
Figure 5D:
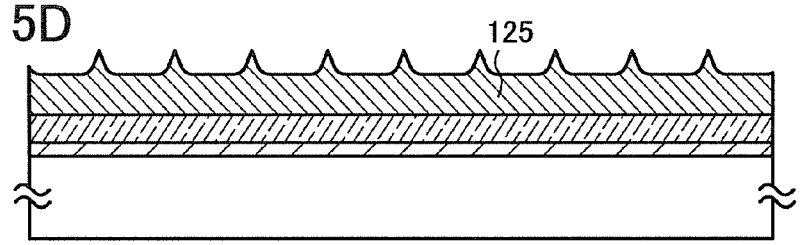

The first single crystal silicon layer 124 is irradiated with a laser beam 152 through the optical modulator to form a surface uneven structure formed by projections with regular intervals (see FIGS. 5C and 5D). As a method for forming the surface uneven structure, aforementioned Embodiment Mode 1 is applied. Here, by passing the optical modulator, the laser beam 152 is given a light intensity distribution in which a strength and weakness appears regularly. The laser beam 152 has the light intensity distribution in which a pattern of the optical modulator is reflected on the light intensity distribution and in which the strength and weakness appears regularly at a surface to be irradiated of the first single crystal silicon layer 124. As a result, differences occur in light intensity of the laser beam absorbed by the surface to be irradiated of the first single crystal silicon layer 124, whereby regular differences can be generated in a crystal condition of the first single crystal silicon layer 124 between a region melted and a region not completely melted, or a region which drops in temperature quickly and a region which drops in temperature slower than the region drops in temperature quickly, and the like. For example, a region with low intensity in the light intensity distribution is not melted completely and a region with high intensity in the light intensity distribution is melted, or a region with low intensity of the light intensity distribution drops in temperature quickly and a region with high intensity in the light intensity distribution drops in temperature slowly, and the like. That is, when strength and weakness of the light intensity distribution are regular, the region melted not completely and the region melted, or the region which drops in temperature quickly and the region which drops in temperature slowly appear regularly. Then, the region with low intensity in the light intensity distribution becomes a crystal nucleus and crystal growth progresses in a direction toward the region with high intensity in the light intensity distribution. The region with high intensity in the light intensity distribution and the region with low intensity in the light intensity distribution can be given regularly by the optical modulator. As a result, crystal growth progresses in different directions and crystals meet each other, whereby projections are formed to form unevenness on the surface.

Further, in this embodiment mode, an example is described, in which the impurity element contained in the impurity silicon layer 122 below the first single crystal silicon layer 124 is diffused into the first single crystal silicon layer 124 by irradiation with the laser beam 152 to form a first impurity silicon layer 125 having a surface uneven structure. Needless to say, the first impurity silicon layer 125 in this case has the same conductivity type as the impurity silicon layer 122 (see FIG. 5D). Note that depending on a condition of irradiation with the laser beam 152, a single crystal silicon layer having a surface uneven structure can be obtained without diffusion of the impurity element from the impurity silicon layer 122.

In this embodiment mode, a phase shift mask 150 is arranged over a separation surface of the first single crystal silicon layer 124 and irradiation with the laser beam 152 is performed through the phase shift mask 150. The phase shift mask 150 has a structure in which projection portions and recessed portions are arranged alternately by forming grooves with regular intervals on a quartz substrate. The phase of the laser beam 152 passing through the recessed portion is not inverted and the phase of the laser beam 152 passing through the projection portion is shifted by $\pi$, whereby light intensity distribution in which strength and weakness (the maximum point and the minimum point) are repeated regularly is given. Then, the region with low intensity in the light intensity distribution of the laser beam for irradiation becomes a crystal nucleus and crystal growth progresses in a direction toward the region with high intensity in the light intensity distribution. Then, crystals meet each other, whereby projections are formed to form unevenness on the surface.

The description of the laser beam 20 in aforementioned Embodiment Mode 1 is applied to the laser beam 152. Specifically, irradiation with the laser beam 152 is performed with a laser which can emit a laser beam having a wavelength within range of wavelength which can be absorbed by silicon. Further, the energy of the laser beam 152 is preferably set in such a range that the first single crystal silicon layer 124 is melted partly in a region where the minimum point of the light intensity distribution is irradiated and the first single crystal silicon layer 124 is not evaporated. For example, the laser beam 152 can be emitted with a XeCl excimer laser or a YAG laser. Note that when the thickness of the first single crystal silicon layer 124 is set to about the same wavelength as the laser beam 152, silicon can be melted easily.

An example of the irradiation treatment with the laser beam 152 will be described below. As the laser beam 152, a liner laser with a beam width (short axis) of 360 µm and a beam length (long axis) of 120 mm is used, which is obtained by using a XeCl excimer laser with wavelength of 308 nm and a repetition rate of 30 Hz is processed with an optical system. The supporting substrate 110 over which the first single crystal silicon layer 124 is fixed is arranged on a stage and irradiated with the laser beam 152 while scanning the stage at a scanning speed of 1 mm/sec in a direction parallel to the short axis direction of the linear laser beam 152. The energy density of the laser beam 152 is set to 600 mJ/cm$^2$ at this time. With treatment in the above described condition, the projections with regular intervals are formed on the surface of the first single crystal silicon layer 124 and the surface uneven structure can be formed.

FIG. 5D illustrates the first impurity silicon layer 125 with an uneven structure which is obtained by irradiation with the laser beam to form projections with regular intervals. The maximum difference in height (P–V) on a surface of the first impurity silicon layer 125 is larger compared to that of the first single crystal silicon layer 124 separated from the single crystal silicon substrate 101 illustrated in FIG. 5B. That is, the maximum difference in height (P–V) on the surface of the silicon layer after irradiation with the laser beam 152 through the phase shift mask 150 is larger than that before irradiation. For example, as for a difference in height of the surface with an uneven structure (a height of projections), the maximum difference in height (a P–V value) of the silicon layer (which is the first impurity silicon layer 125 in this embodiment mode) after the irradiation with the laser beam 152 is set to greater than or equal to 50 nm, preferably greater than or equal to 150 nm.

Note that crystal defects are easily generated in the first single crystal silicon layer 124 (see FIG. 5B) separated from the single crystal silicon substrate 101 due to damage or the like caused in a process for forming the embrittlement layer or in a separation process. However, in this embodiment mode, by irradiation with the laser beam 152 through the phase shift mask 150, the crystal defects can be repaired or reduced while unevenness can be formed on the surface of the single crystal silicon layer separated from the single crystal silicon substrate. The defects existing in the region for performing photoelectric conversion cause reduction of the carrier collection efficiency and reduction of the photoelectric conversion efficiency because the defects cause a trap of carrier, and the like. Further, the single crystal silicon layer (which is the first impurity silicon layer 125 in this embodiment mode) separated from the single crystal silicon substrate is to be a seed layer for performing epitaxial growth later. Therefore, if the crystal defects exist in a region which is to be the seed layer, the epitaxial growth could be interrupted. In this embodiment mode, since the all or part of the first single crystal silicon layer 124 is melted by irradiation with the laser beam 152 from a top surface of the first single crystal silicon layer 124, the defects can be repaired in a cooling process after melting.

Here, in the case where irradiation with a laser beam having a wavelength in the ultraviolet region is performed to repair the crystal defects, the thickness of the first single crystal silicon layer 124 is preferably less than or equal to 200 nm, more preferably less than or equal to 100 nm. This is because energy necessary for repairing the crystal defects can be reduced when the thickness of the single crystal silicon layer whose crystal defects are to be repaired is reduced. The less energy the laser beam has, the lower the cost can be.

Further, the supporting substrate 110 is not heated directly in such laser treatment like the irradiation with the laser beam 152, whereby elevation in temperature of the supporting substrate 110 can be suppressed. Therefore, even a glass substrate, which has low heat resistance, can be used as the supporting substrate 110, such laser treatment as the irradiation with the laser beam 152 is preferable. In addition, the aforementioned laser treatment can also activate the first impurity silicon layer 125 (or the impurity silicon layer 122).

Figure 6A:
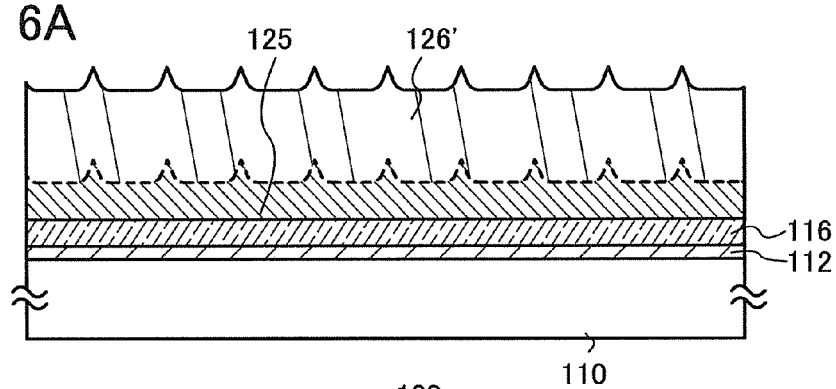
FIGS. 6A to 6D are cross sectional views illustrating one example of the method for manufacturing the photoelectric conversion device.

A second single crystal silicon layer 126' is formed over the first impurity silicon layer 125 (see FIG. 6A). The second single crystal silicon layer 126' is formed by epitaxial growth of a silicon layer (which is the first impurity silicon layer 125 in this embodiment mode) which is formed by being separated from the single crystal silicon substrate, and irradiating with the laser beam to form a surface uneven structure. The second single crystal silicon layer 126' can be formed by solid-phase growth or vapor-phase growth.

An example of formation of the second single crystal silicon layer 126' by solid-phase growth will be described. A silicon layer is formed on the first impurity silicon layer 125. As the silicon layer, an amorphous silicon layer is formed by a CVD method or the like and the thickness thereof may be set in accordance with the thickness of the first impurity silicon layer 125 as appropriate. Then, heat treatment is performed thereon and the silicon layer formed on the first impurity silicon layer 125 is epitaxially grown (solid-state growth). As a result, the second single crystal silicon layer 126' is formed on the first impurity silicon layer 125. As the heat treatment, a heating by a furnace, laser irradiation, RTA (rapid thermal annealing), or a combination thereof can be used. For example, the amorphous silicon layer is formed on the first impurity silicon layer 125 and heat treatment is performed by RTA at a temperature in a range from 500° C. to 800° C. for 5 sec to 180 sec, thereby epitaxially growing the amorphous silicon layer. As one example, an amorphous silicon layer with a thickness of 1 µm is formed on the first impurity silicon layer 125. The RTA apparatus is used and heat treatment is performed under conditions that the process temperature is 750° C. and the process time is 180 sec, whereby solid-phase growth of the amorphous silicon layer occurs and the second single crystal silicon layer 126' can be obtained.

Further, instead of use of a CVD method or the like, the amorphous silicon layer can be formed on the first impurity silicon layer 125 using a liquid silicon material. Specifically, a polysilane layer is formed on the first impurity silicon layer 125 using a liquid silicon material (typically, cyclopentasilane) by a coating method such as a spin coating method, an inkjet method, or the like, and the polysilane layer is baked to obtain the amorphous silicon layer. Then, heat treatment is performed as described above, and the first impurity silicon layer 125 is epitaxially grown as a seed layer.

Also, an example of formation of the second single crystal silicon layer 126' by vapor-phase growth will be described. At the same time as a silicon layer is formed on the first impurity silicon layer 125, the first impurity silicon layer 125 below the silicon layer is epitaxially grown (vapor-phase grown), whereby the second single crystal silicon layer 126' is formed. For example, by forming the silicon layer on the first impurity silicon layer 125 by a plasma CVD method in a predetermined condition, the silicon layer can be, at the same time as deposition, epitaxially grown using the first impurity silicon layer 125 as a seed layer. As a result, the second single crystal silicon layer 126' can be formed on the first impurity silicon layer 125. A plasma CVD method is performed under a condition in which a microcrystalline silicon is formed, for example. Specifically, a plasma CVD method is performed under such conditions where the flow rate of a hydrogen gas is 50 times or more, preferably 100 times or more, as large as that of a silane gas under an atmosphere containing the silane gas and the hydrogen gas at least. Further, an atmospheric plasma CVD method can be used instead of a plasma CVD method. Since the pressure in an atmospheric plasma CVD method is higher compared with that in a normal plasma CVD method, film formation can be performed at a high speed.

Note that in the case where a material layer different from the single crystal silicon, for example, a native oxide layer or the like is formed on the surface of the first impurity silicon layer 125, the material layer is removed and then epitaxially growth is performed. This is because the material layer whose material is different from the single crystal silicon layer, which is formed over the single crystal silicon layer, interrupts epitaxial growth. For example, a native oxide layer can be removed using hydrofluoric acid. Specifically, process may be performed using hydrofluoric acid until the surface of the first impurity silicon layer 125 exhibits a water repellent property. The removal of the oxide layer from the surface of the first impurity silicon layer 125 can be confirmed by repelling of water. Further, in the epitaxial growth, plasma treatment is performed using a mixture of hydrogen and a rare gas, such as hydrogen and helium or hydrogen, helium and argon, before addition of a silane based gas, such as silane, whereby a native oxide and an element contained in the air (oxygen, nitrogen, and carbon) on the surface of the first impurity silicon layer 125 can be removed.

When the single crystal silicon layer separated from the single crystal silicon substrate has a thickness thick enough to absorb sunlight as the photoelectric conversion layer (for example, 1 μm), the second single crystal silicon layer 126' is not needed to be provided. However, as the single crystal silicon layer (which is the first impurity silicon layer 125 in this embodiment mode) separated from the single crystal silicon substrate gets thicker, the thickness of the single crystal silicon substrate left after the separation gets thinner, whereby the number of times of reusing is reduced. Therefore, as described in this embodiment mode, epitaxial growth is utilized and the single crystal silicon layer is adjusted to be thick enough to absorb sunlight, whereby consumption of a resource (silicon) can be suppressed. The single crystal silicon layer (which is the first impurity silicon layer 125 in this embodiment mode) separated from the single crystal silicon substrate is irradiated with a laser beam in order to form unevenness. At this time, reduction of crystal defects in the single crystal silicon layer (which is the first impurity silicon layer 125 in this embodiment mode) separated from the single crystal silicon substrate, which is to be a seed layer, can be realized. Accordingly, the favorable single crystal silicon layer can be made thicker and the photoelectric conversion device improved in its photoelectric conversion efficiency can be manufactured.

Accordingly, the first impurity silicon layer 125 and the second single crystal silicon layer 126' obtained by epitaxial growth of the first impurity silicon layer 125 can be obtained. An uneven shape of the surface of the first impurity silicon layer 125 is reflected on a surface of the second single crystal silicon layer 126'. That is, the surface of the second single crystal silicon 126' also has an uneven shape.

Figure 6B:
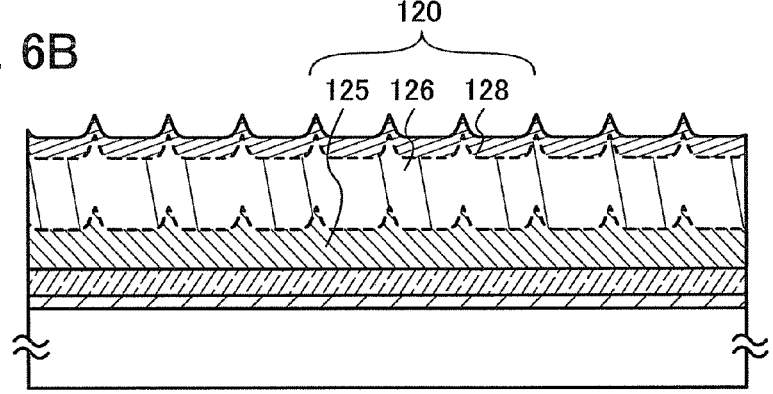

An impurity element imparting conductivity type opposite to that of the first impurity silicon layer 125 (the impurity silicon layer 122) is added to one surface side of the second single crystal silicon layer 126' (which is an opposite side of the first impurity silicon layer 125) and a second impurity silicon layer 128 is formed (see FIG. 6B). In this embodiment mode, the second impurity silicon layer 128 is formed on the surface layer side of the second single crystal silicon layer 126', and a portion of the second single crystal silicon layer 126' where the silicon layer 128 is not formed forms the second single crystal silicon layer 126.

For example, since FIG. 4C shows an example in which boron is added to the impurity silicon layer 122 to be p-type, phosphorus or arsenic as the impurity element imparting conductivity type opposite to that of the first impurity silicon layer 125 (the impurity silicon layer 122) is added to the second single crystal silicon layer 126' to form the second impurity silicon layer 128 which is n-type. Addition of the impurity element may be performed by an ion doping method, an ion implantation method, or a laser doping method. For example, the second impurity silicon layer 128 is formed to have a thickness of 50 nm to 100 nm. Note that it is preferable that RTA treatment or laser treatment is performed after formation of the second impurity silicon layer 128 to activate the impurity element contained in the second impurity silicon layer 128.

The second impurity silicon layer 128 is not limited to single crystal silicon or polycrystal silicon and may be formed from microcrystalline silicon or amorphous silicon. For example, the second impurity silicon layer 128 can be formed by a plasma CVD method using a source gas which is obtained by adding a doping gas containing phosphorus, such as phosphine, to a silane based gas. When the second impurity silicon layer 128 is formed by a plasma CVD method, a native oxide layer formed over the second single crystal silicon layer 126' is removed, and then the second impurity silicon layer 128 is formed. When the second impurity silicon layer 128 is formed from microcrystalline silicon or amorphous silicon, the second impurity silicon layer 128 is preferably formed to be thin in order to prevent recombination of carriers.

Further, the second impurity silicon layer 128 can also be formed by epitaxial growth. For example, the second impurity silicon layer 128 can be formed as follows: a source gas containing a silane based gas mixed with a doping gas is used and the impurity silicon layer is epitaxially grown at the same time as formation of the impurity silicon layer by a plasma CVD method.

When the second impurity silicon layer 128 is formed by adding the impurity element to the second single crystal silicon layer 126', a surface of the second impurity silicon layer 128 has the same shape as the surface of the second single crystal silicon layer 126' and has an uneven shape. Further, in the case where the second impurity silicon layer 128 is formed over the second single crystal silicon layer 126', the uneven shape on the surface of the second single crystal silicon layer 126' is reflected on the surface of the second impurity silicon layer, whereby the surface of the second impurity silicon layer has the uneven shape.

Accordingly, the first unit cell 120 in which the first impurity silicon layer 125 having one conductivity type, the second single crystal silicon layer 126, and the second impurity silicon layer 128 having a conductivity type opposite to the one conductivity type are sequentially stacked can be obtained. The first unit cell 120 is set to have a thickness of 1 µm to 20 µm, preferably 1 µm to 10 µm, whereby the first unit cell 120 can absorb sufficient sunlight. The thickness of each of the first impurity silicon layer 125, the second single crystal silicon layer 126, and the second impurity silicon layer 128, which are included in the first unit cell 120, is determined in consideration of productivity, such as the takt time and the cost, and the photoelectric conversion efficiency. For example, a single crystal silicon layer (which is the first impurity silicon layer 125 in this embodiment mode) separated from the single crystal silicon substrate 101 is set to have a thickness of 20 nm to 1000 nm, preferably 40 nm to 300 nm, and an epitaxially grown layer (which is the second single crystal silicon layer 126' in this embodiment mode) is set to have a thickness of 0.5 µm to 20 µm, preferably 1 µm to 10 µm.

A surface of the first unit cell 120, which is the surface of the second impurity silicon layer 128 here, has the uneven structure. In this embodiment mode, since the surface of the second impurity silicon layer 128 is a light incident surface, reflection of incident light is reduced due to the uneven structure of the surface and a light confinement effect can be realized.

Figure 6C:
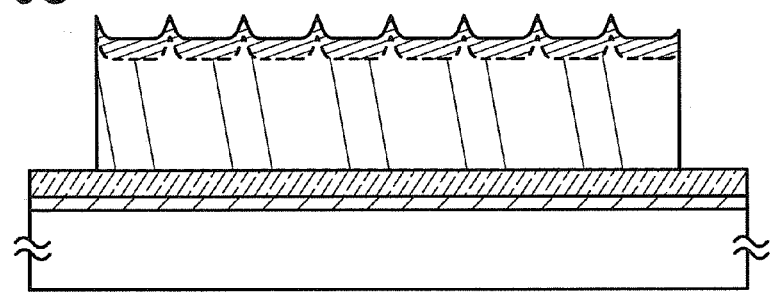
Figure 6D:
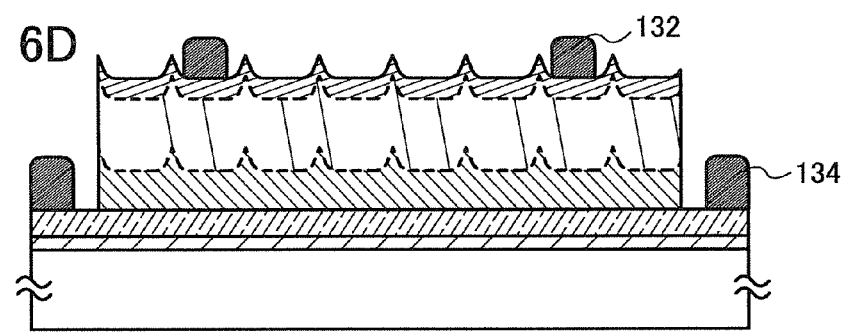

The first impurity silicon layer 125, the second single crystal silicon layer 126, and the second impurity silicon layer 128, which are provided over the first electrode 116, are selectively etched to expose part of the first electrode 116 (see FIG. 6C). Then the second electrode 132 over the second impurity silicon layer 128 and the auxiliary electrode 134 in contact with the first electrode 116 are formed (see FIG. 6D).

Electric energy converted from light in the photoelectric conversion device is needed to be extracted. The electric energy can be extracted from electrodes which correspond to the positive electrode and the negative electrode. The first electrode 116 and the second electrode 132 function as the positive electrode and the negative electrode, respectively. However, in this embodiment mode, the first impurity silicon layer 125, the second single crystal silicon layer 126, and the second impurity silicon layer 128 are provided over the first electrode 116 and the supporting substrate 110 is provided below the first electrode 116. Therefore in this state, it is difficult to extract electricity to the outside. Accordingly, the auxiliary electrode 134 which is electrically connected to the first electrode 116 and which can be led is preferably formed.

In this embodiment mode, the layers formed over the first electrode 116 are selectively etched to expose an end portion of the first electrode 116 and the auxiliary electrode 134 is formed so as to be in contact with the exposed first electrode 116. Specifically, a mask is formed over the second impurity silicon layer 128 using a resist, an insulating layer, such as a silicon nitride layer, or the like, and the mask is used for etching to expose the part of the first electrode 116. The etching may be dry etching with use of a fluorine based gas such as NF$_3$ or SF$_6$ under the condition where at least the etching selectivity ratio of the first electrode 116 with respect to the layers (the first impurity silicon layer 125 to the second impurity silicon layer 128) formed over the first electrode 116 is sufficiently high. After the etching, the mask which has rendered unnecessary is removed.

The second electrode 132 is formed to have a grid shape (or a comb shape or a pectinate shape) when it is seen from above,
as shown in FIG. 3A. In this manner, light can be made to enter the first unit cell 120. The shape of the second electrode 132 is not particularly limited; however, needless to say, it is preferable that the area covering the first unit cell 120 (the second impurity silicon layer 128) is made as small as possible because the effective area where light enters increases.

The auxiliary electrode 134 can be formed through the same steps as those for forming the second electrode 132. Further, the auxiliary electrode 134 can function as an extraction electrode. Note that the auxiliary electrode 134 is not necessarily provided and presence or the shape of the auxiliary electrode 134 and an electrode structure of the photoelectric conversion device may be selected as appropriate by designers. With formation of the auxiliary electrode 134 as in this embodiment mode, the extraction electrode can be led freely and the electric energy is easily extracted to the outside.

The second electrode 132 and the auxiliary electrode 134 are each formed using nickel, aluminum, silver, lead-tin (solder), or the like by a printing method or the like. For example, the second electrode 132 and the auxiliary electrode 134 can be formed using a nickel paste or a silver paste by a screen printing method.

Thus, the photoelectric conversion device 100 can be manufactured.

Figure 9:
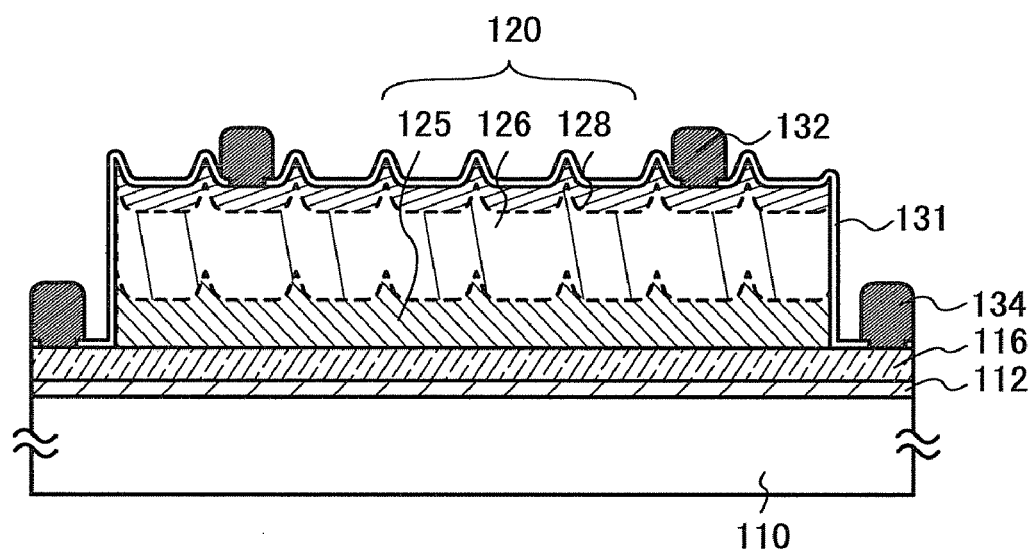
FIG. 9 is a cross sectional view illustrating one example of a photoelectric conversion device.

Note that a passivation layer 131 which also functions as an antireflection layer is preferably formed over the first unit cell 120 (see FIG. 9).

The reflection at a light incidence surface leads to loss of incident light, which is a factor of decreasing photoelectric conversion efficiency. According to the present invention, the surface uneven structure, which has a surface on which unevenness is formed, reduces reflection of light and reflection can be further reduced by forming the antireflection layer. For example, the passivation layer 131 whose refractive index is between the refractive index of air and the refractive index of a silicon, that is a material of the light incidence surface of the first unit cell 120, and which does not interrupt light incidence is formed over the light incidence surface of the first unit cell 120 (over the second impurity silicon layer 128 in this embodiment mode). As the passivation layer 131, a silicon nitride layer, a silicon nitride oxide layer, a magnesium fluoride layer, or the like can be used. Thus, the reflection of the light which enters the photoelectric conversion device can be prevented.

The passivation layer 131 is provided between the first unit cell 120 and the second electrode 132 and between the first unit cell 120 and the auxiliary electrode 134 in FIG. 9. In this case, after the passivation layer 131 is formed over the first unit cell 120, the passivation layer 131 is etched to form opening portions so that part of the second impurity silicon layer 128 and part of the first electrode 116 are exposed. Alternatively, the passivation layer 131 provided with opening portions can be formed by a lift-off method or the like. Then, the second electrode 132, which is in contact with the second impurity silicon layer 128 through the opening portion provided in the passivation layer 131, is formed by a printing method. The auxiliary electrode 134, which is in contact with the first electrode 116 through the opening portion provided in the passivation layer 131, is formed in the same step.

Note that the example in which the photoelectric conversion device is manufactured using the single crystal silicon substrate 101 is described in this embodiment mode; however, the photoelectric conversion device according to the present invention can be provided using the polycrystalline silicon substrate.

The photoelectric conversion device according to this embodiment mode has the surface uneven structure on the light incident side, which can reduce reflection of incident light. Accordingly, the photoelectric conversion efficiency of the photoelectric conversion device can be improved. Since the surface uneven structure is formed by laser treatment using the optical modulator, a silicon material to be wasted is further reduced than in the case of using etching or the like. Further, crystal defects can be reduced by laser treatment and thus the favorable photoelectric conversion layer can be formed.

Further, in the photoelectric conversion device according to this embodiment mode, the photoelectric conversion layer, which is thin silicon, is formed by bonding the single crystal silicon substrate and the supporting substrate with the insulating layer interposed therebetween and separating part of the single crystal silicon substrate. Accordingly, the thin silicon is the single crystal silicon, whereby high efficiency can be realized. Further, the single crystal silicon substrate is bonded to the supporting substrate by Van der Waals forces and hydrogen bond. After that, the bond is changed into a covalent bond by heat treatment. Accordingly, the bond can be further strengthened than in a method in which the bond is formed using a conductive paste or the like functioning as adhesive, and the bond can be maintained for a long time, whereby reliability can be improved.

By making the single crystal silicon layer thicker using epitaxial growth and adjusting it to a desired thickness, consumption of silicon as the material can be suppressed. Further, by separating the surface layer of the single crystal silicon substrate to obtain the single crystal silicon layer, the single crystal silicon substrate which has been separated can be reused. In addition, $H_3^+$ ions are used in order to separate the single crystal silicon layer from the single crystal silicon substrate, whereby the thin single crystal silicon layer can be separated without reduction of productivity. When the single crystal silicon layer is separated to be thin, the single crystal silicon substrate from which he single crystal silicon layer has been separated is left to be thick and the number of times of reusing can be increased. Accordingly, resources can be used efficiently, and a material cost can be reduced.

Figure 10A:
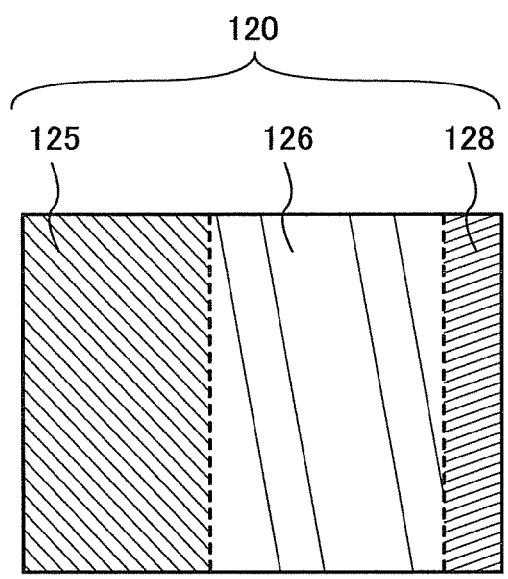
FIG. 10A is a cross sectional view illustrating a unit cell of a photoelectric conversion device and FIG. 10B is an energy band diagram corresponding to FIG. 10A.

FIG. 10A is a cross sectional schematic view illustrating an example of the first unit cell 120 included in the photoelectric conversion device of this embodiment mode. Note that an uneven structure is omitted for convenience in the cross sectional schematic view in this embodiment mode. In this case, the p-type impurity silicon layer 125 (p-layer), the i-type second single crystal silicon layer 126 (i-layer), and the n-type impurity silicon layer 128 (n-layer) are sequentially stacked in the first unit cell 120. The first unit cell 120 has a single crystal silicon layer with an energy gap (Eg) of about 1.1 eV. Light enters from the n-type second impurity silicon layer 128 (the n-layer) side.

Figure 10B:
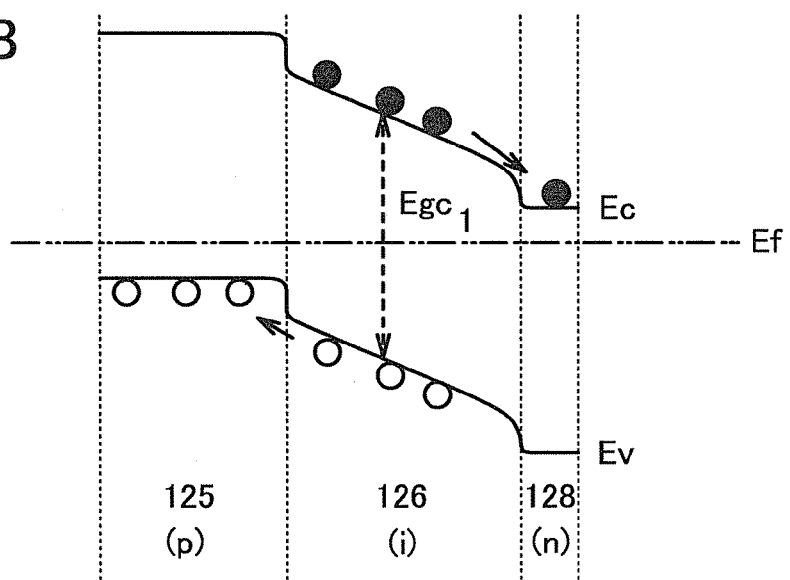

FIG. 10B is an energy band diagram corresponding to the first unit cell 120 in FIG. 10A. In FIG. 10B, $Egc_1$ indicates the energy gap of the second single crystal silicon layer 126, which is about 1.1 eV. Ec indicates the level of the lower limit of a conduction band, Ev indicates the level of the upper limit of a valence band, and Ef indicates Fermi level.

Of the carriers (electrons and holes) generated by optical excitation, electrons (which are denoted by black circles in FIG. 10B) flow to the n-layer side, whereas holes (which are denoted by white circles in FIG. 10B) flow to the p-layer side and are collected. The single crystal silicon substrate is separated to form the first single crystal silicon layer 124, epitaxial growth is performed to form the second single crystal silicon layer 126' and the n-type second impurity silicon layer 128 is formed in an upper part of the second single crystal silicon layer 126', so that p-i-n junction can be formed. Accordingly, with drift of the carries due to an internal electric field, so that carrier collection efficiency can be increased and photoelectric conversion efficiency can be improved.

Note that this embodiment mode can be combined with any of the other embodiment modes and embodiments, as appropriate.

Embodiment Mode 3

In this embodiment mode, an example of a method for manufacturing a photoelectric conversion device which is different from that in the aforementioned embodiment mode will be described. Described in the aforementioned embodiment mode is the example in which laser treatment is performed on the first single crystal silicon layer 124 which has been separated from the single crystal silicon substrate 101, using the optical modulator to form the uneven structure on a surface. In this embodiment mode, a method for forming unevenness on a second single crystal silicon layer, which is obtained by epitaxial growth of the single crystal silicon layer separated from the single crystal silicon substrate 110, by performing laser treatment using an optical modulator will be described. Note that other structures are based on the aforementioned embodiment mode and description thereof is omitted.

Figure 11A:
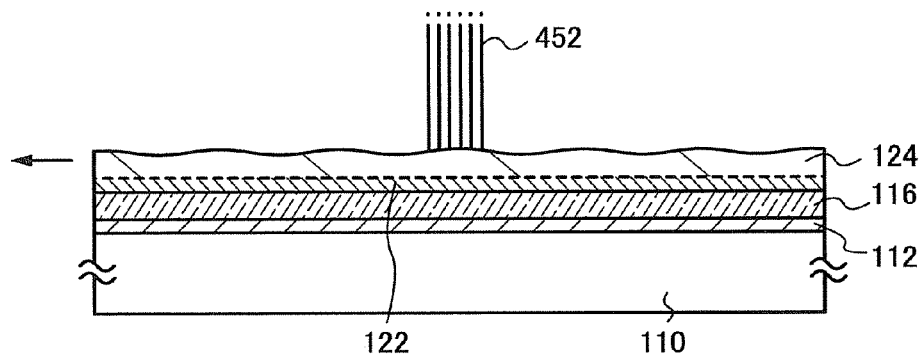
FIGS. 11A to 11C are cross sectional views illustrating one example of a method for manufacturing a photoelectric conversion device.

The aforementioned steps up to FIG. 5B are performed and the impurity silicon layer 122 and the first single crystal silicon layer 124 fixed with the insulating layer 112 and the first electrode 116 interposed therebetween over the supporting substrate 110, are obtained. Next, a separation surface of the first single crystal silicon layer 124 is irradiated with a laser beam 452 and crystal defects are repaired to obtain a first single crystal silicon layer 124" (see FIGS. 11A and 11B). As the laser beam 452, for example, a XeCl excimer laser or a second harmonic of a YAG laser is preferably used. The separation surface of the first single crystal silicon layer 124 is irradiated with the laser beam 452 and part or whole of the first single crystal silicon layer 124 is melted and recrystallized, whereby the crystal defects of the first single crystal silicon layer 124 are repaired. Preferably, the first single crystal silicon layer 124 is partly melted by irradiation with the laser beam 452. By partly melting the first single crystal silicon layer 124, crystal growth can be made to progress from a solid-state portion which is not melted (typically, a lower part). Thus, the crystal defects can be repaired without reduction of crystallinity. For example, the separation surface side of the first single crystal silicon layer 124 is melted by irradiation with the laser beam 452 and recrystallized in a later cooling process using the lower part in solid state as a seed layer. Through the cooling step, the crystal defects of the first single crystal silicon layer 124 can be repaired.

Figure 11B:
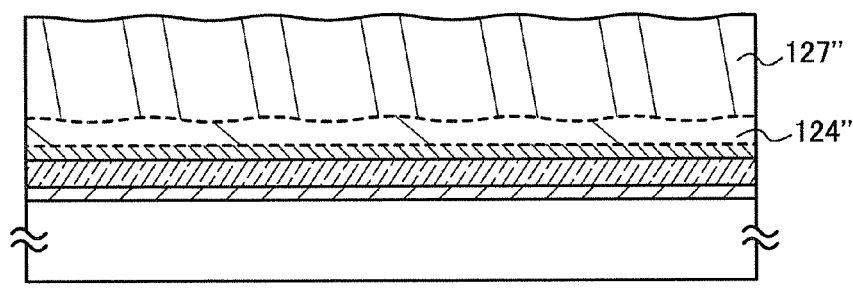

Using the first single crystal silicon layer 124" whose crystal defects have been repaired as a seed layer, epitaxially grown is performed to form a second single crystal silicon layer 127" (see FIG. 11B). The epitaxial growth can be either solid-phase growth or vapor-phase growth similarly to the Embodiment Mode 2.

Figure 11C:
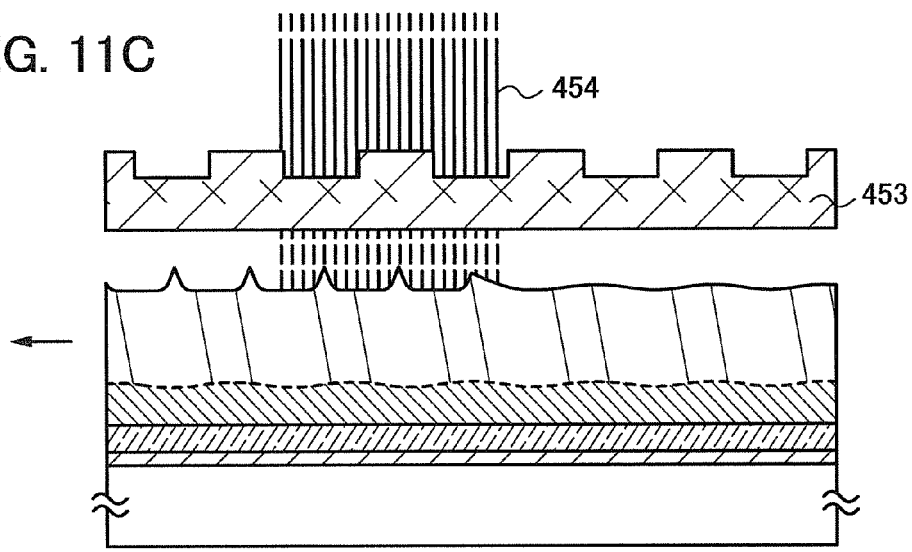
Figure 12A:
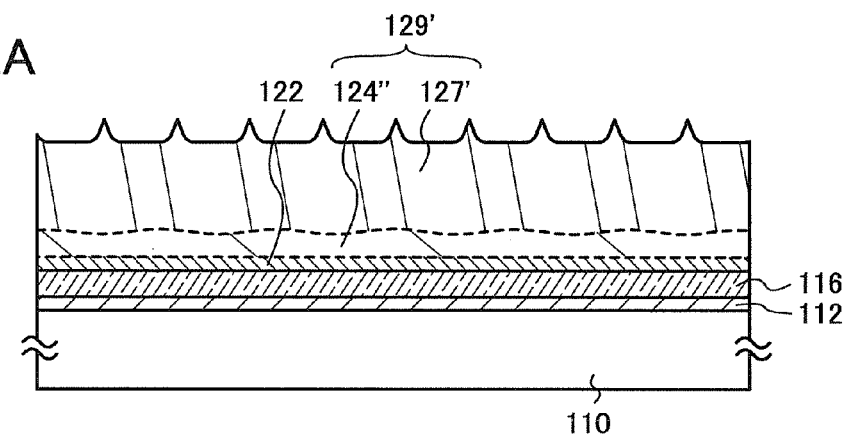
FIGS. 12A and 12B are cross sectional views illustrating one example of the method for manufacturing the photoelectric conversion device.

The second single crystal silicon layer 127" is irradiated with a laser beam 454 through an optical modulator to form projections with regular intervals, so that a second single crystal silicon layer 127' having an uneven structure on its surface is obtained (see FIG. 11C and FIG. 12A).

A method for forming the uneven structure with regular intervals on the surface is the same methods in aforementioned Embodiment Mode 1 and in FIG. 5C of Embodiment Mode 2. A phase shift mask 453 which is one mode of the optical modulator is arranged over the second single crystal silicon layer 127" and the second single crystal silicon layer 127" is irradiated with the laser beam 454 through the phase shift mask 453. The phase shift mask 453, for example, has a structure in which a pattern which do not invert a phase and a pattern which shift phase by π are arranged alternately. The laser beam 454 with which the second single crystal silicon layer 127" is irradiated has a light intensity distribution on which the pattern of the phase shift mask 453 is reflected. As a result, a melted state on which the light intensity distribution of the laser beam 454 is reflected is generated and crystal growth is controlled. Then, crystal growth progresses in different directions and crystals meet each other, whereby projections are formed and unevenness is formed on the surface. In this manner, a single crystal silicon layer 129' is obtained, which is a stacked layer formed using the first single crystal silicon layer 124" and the second single crystal silicon layer 127' obtained by epitaxially growing using the first single crystal silicon layer 124" as a seed layer and having the uneven structure on its surface.

Figure 12B:
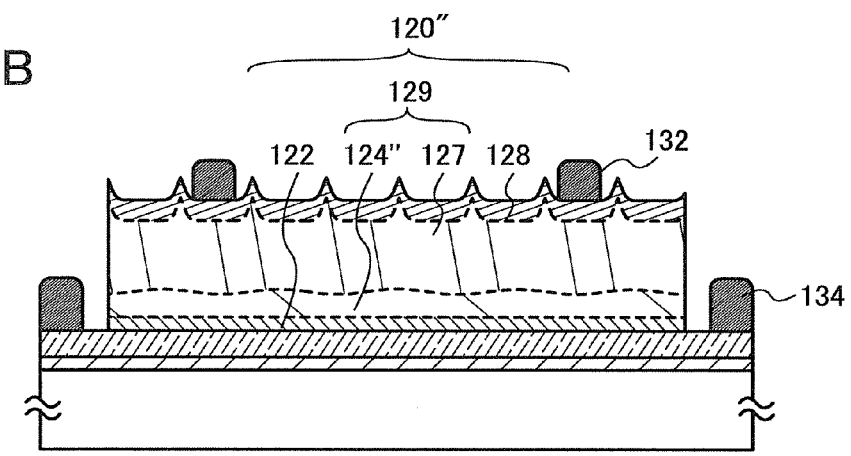

An impurity element imparting a conductivity type opposite to that of the impurity silicon layer 122 is added to one surface of the second single crystal silicon layer 127' (which is the opposite side to the impurity silicon layer 122) to form a second impurity silicon layer 128 (see FIG. 12B). In this embodiment mode, the second impurity silicon layer 128 is formed on the surface layer side of the second single crystal silicon layer 127', and a portion of the second single crystal silicon layer 127' where the silicon layer 128 is not formed forms the second single crystal silicon layer 127. Accordingly, a surface of the second impurity silicon layer 128 has the same shape as the surface of the second single crystal silicon layer 127' and has an uneven shape. Note that the second impurity silicon layer 128 may be formed from microcrystalline silicon or amorphous silicon or may be formed by epitaxial growth, as described in Embodiment Mode 2. In this case, the uneven shape of the second single crystal silicon layer 127' below the second impurity silicon layer is reflected on the surface of the second impurity silicon layer.

In this manner, the first unit cell 120" in which the impurity silicon layer 122 having one conductivity type, the single crystal silicon layer 129 which is the stacked layer formed of the first single crystal silicon layer 124" and the second single crystal silicon layer 127, and the second impurity silicon layer 128 having a conductivity type opposite to the one conductivity type are sequentially stacked can be obtained. Hereinafter, through steps after the step of FIG. 6C, the photoelectric conversion device as illustrated in FIG. 12B can be manufactured.

The method for manufacturing the photoelectric conversion device in this embodiment mode is a method in which laser treatment is performed on a surface of a light incident side through the optical modulator, which forms a surface uneven structure directly. Accordingly, the uneven structure formed by laser treatment can be used as a surface textual structure directly.

Figure 12C:
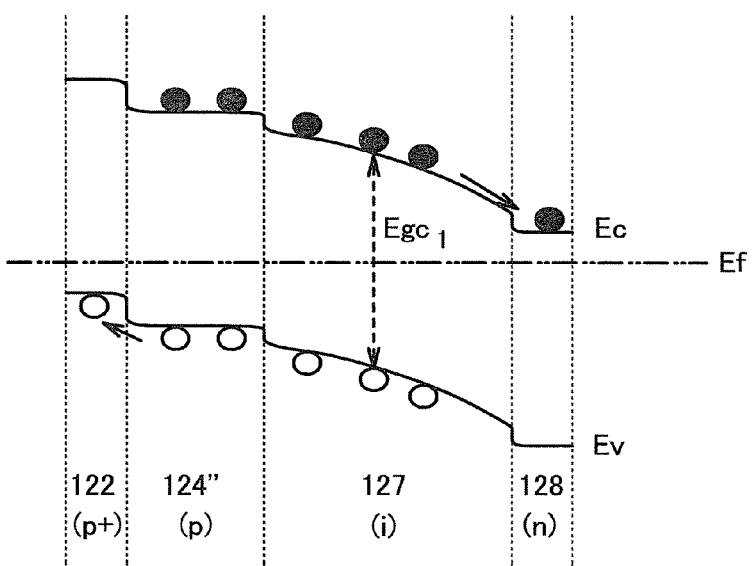
FIG. 12C is an energy band diagram corresponding to FIG. 12B.

In addition, in the photoelectric conversion device according to this embodiment mode, a back surface field (BSF) can be formed. An energy band diagram is illustrated in FIG. 12C. For example, when a p-type substrate is used for the single crystal silicon substrate 101, the first single crystal silicon layer 124" which is p-type can be obtained. Further, an impurity element imparting p-type conductivity is added to the single crystal silicon substrate 101 to form the impurity silicon layer 122, so that the impurity silicon layer 122, which is a high concentration p-type region (which is denoted by p$^+$), and the first single crystal silicon layer 124", which is a p-type region (which is denoted by p) with lower concentration than that of the impurity silicon layer 122 can be arranged. That is, in the first unit cell 120", an n-layer (the second impurity silicon layer 128), an i-layer (the second single crystal silicon layer 127), a p-layer (the first single crystal silicon layer 124"), and a p$^+$-layer (the impurity silicon layer 122) can be arranged in this manner from a side which is irradiated with light. Accordingly, the BSF can be formed and the light confinement effect prevents recombination of carriers (electrons and holes) generated by optical excitation and increases carrier collecting efficiency. Accordingly, the photoelectric conversion efficiency of the photoelectric conversion device can be improved.

Note that this embodiment mode can be combined with any of the other embodiment modes and embodiments, as appropriate.

Embodiment Mode 4

In this embodiment mode, a method for manufacturing a photoelectric conversion device which is different from those in Embodiment Mode 2 and Embodiment Mode 3 will be described with reference to FIGS. 13A to 13E, FIGS. 14A to 14D, and FIGS. 15A to 15D. Specifically, a method for forming an embrittlement layer 108, a first electrode 116, and an insulating layer 112 for a single crystal silicon substrate 101 will be described. Note that other structures are based on the aforementioned embodiment modes and description thereof is omitted.

The forming order (1) in [0066] of the embrittlement layer 108, the first electrode 116, and the insulating layer 112 is described in Embodiment Mode 2. In this embodiment mode, forming orders (2) to (4) in [0066] are described.

Figure 13A:
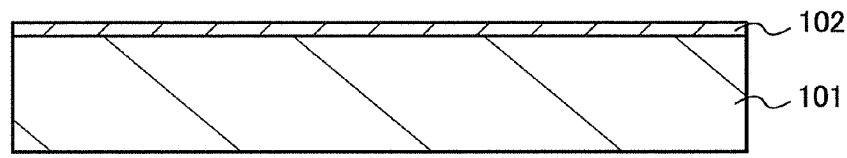
FIGS. 13A to 13E are cross sectional views illustrating a modified example of a method for manufacturing a photoelectric conversion device.
Figure 13B:
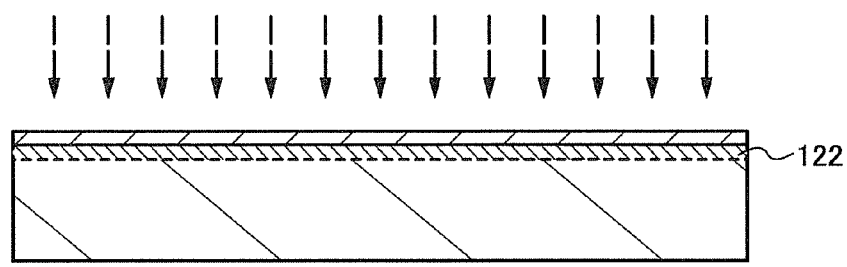

For example, as illustrated in FIG. 13A, a protection layer 102 is formed on one surface side of the single crystal silicon substrate 101. An impurity element imparting one conductivity type is added to the single crystal silicon substrate 101 from the surface on which the protection layer 102 is formed to form an impurity silicon layer 122 (see FIG. 13B). The impurity silicon layer 122 is formed on the surface side of the single crystal silicon substrate 101 and between the protection layer 102 and the single crystal silicon substrate 101.

Figure 13C:
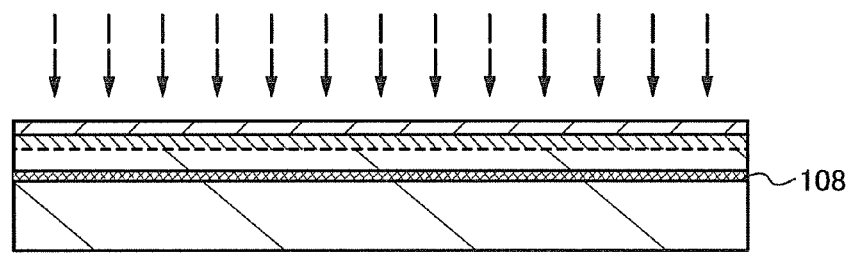
Figure 13D:
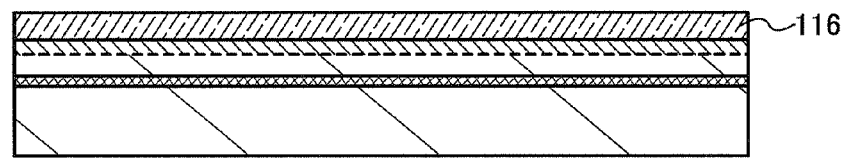
Figure 13E:
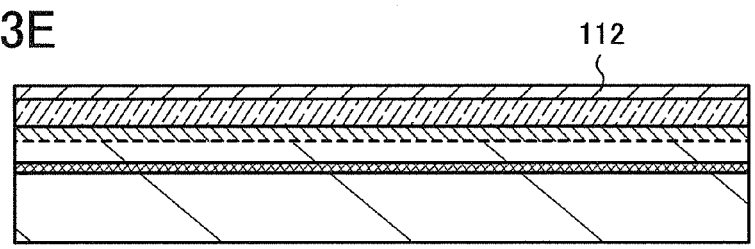

Next, the single crystal silicon substrate 101 is irradiated with ions or cluster ions from the surface on which the protection layer 102 is formed to form the embrittlement layer 108 in a region at a predetermined depth from the surface of the single crystal silicon substrate 101 (see FIG. 13C).

Next, a material layer, such as the protection layer 102, which is formed over the impurity silicon layer 122, is removed. After that the first electrode 116 is formed (see FIG. 13D). Then the insulating layer 112 is formed over the first electrode 116 (see FIG. 13E). Hereinafter, the photoelectric conversion device may be manufactured based on the aforementioned embodiment modes.

According to such a forming order, in formation of the embrittlement layer 108, hydrogen is added through the impurity silicon layer 122 by irradiation with ions or cluster ions generated by a source gas containing hydrogen. Accordingly, hydrogenation of the impurity silicon layer 122 can also be performed.

Figure 14A:
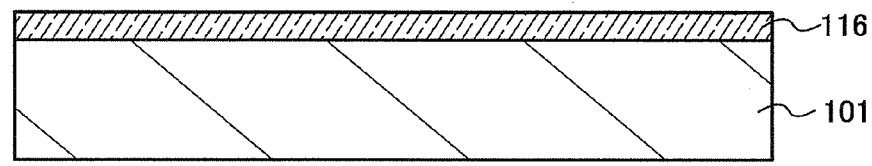
FIGS. 14A to 14D are cross sectional views illustrating a modified example of a method for manufacturing a photoelectric conversion device.

Alternatively, for example, as illustrated in FIG. 14A, the first electrode 116 is formed on one surface of the single crystal silicon substrate 101. The first electrode 116 is formed after a material layer formed over the single crystal silicon substrate 101, such as a native oxide layer, is removed.

Figure 14B:
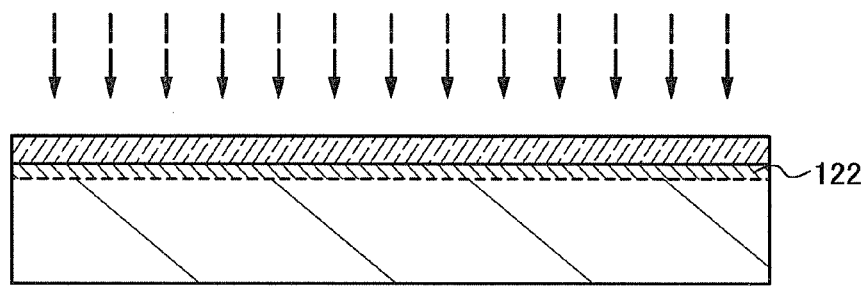

Next, an impurity element imparting one conductivity type is added from the surface of the single crystal silicon substrate 101 on which the first electrode 116 is formed to form the impurity silicon layer 122 (see FIG. 14B). The impurity silicon layer 122 is formed on the one surface side of the single crystal silicon substrate 101 and between the first electrode 116 and the single crystal silicon substrate 101.

Figure 14C:
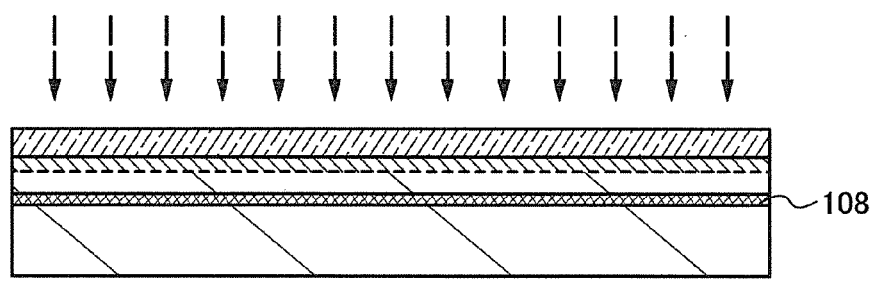
Figure 14D:
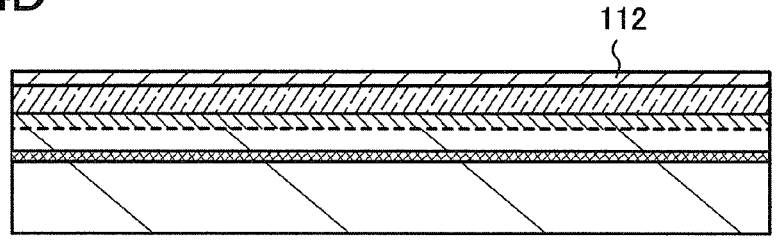

Next, the single crystal silicon substrate 101 is irradiated with ions or cluster ions from the surface on which the first electrode 116 is formed to form the embrittlement layer 108 in a region at a predetermined depth in the single crystal silicon substrate 101 (see FIG. 14C). After that, the insulating layer 112 is formed over the first electrode 116 (see FIG. 14D). Hereinafter, the photoelectric conversion device may be manufactured based on the aforementioned embodiment modes.

Figure 15A:
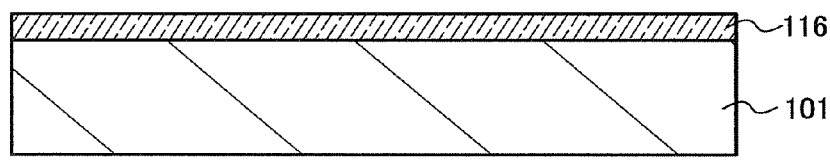
FIGS. 15A to 15D are cross sectional views illustrating a modified example of a method for manufacturing a photoelectric conversion device.
Figure 15B:
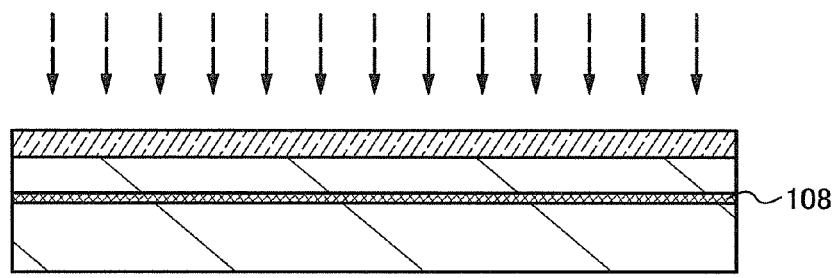
Figure 15C:
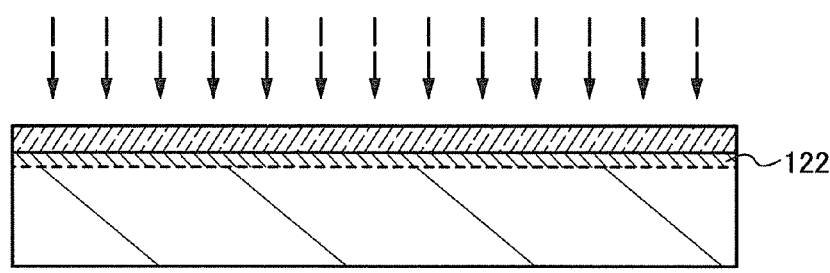

Alternatively, for example, as illustrated in FIGS. 15A to 15D, after the first electrode 116 is formed on the one surface side of the single crystal silicon substrate 101 (see FIG. 15A), the surface on which the first electrode 116 is formed is irradiated with ions or cluster ions to form the embrittlement layer 108 in a region at a predetermined depth in the single crystal silicon substrate 101 (see FIG. 15B).

Figure 15D:
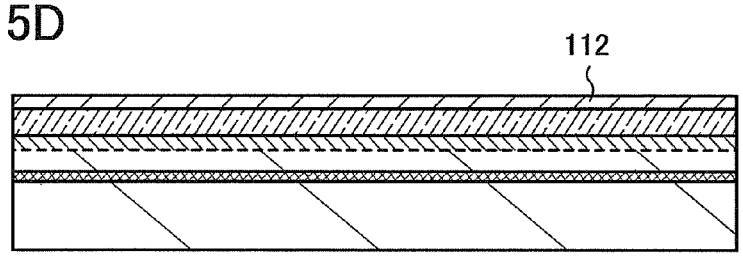

Next, after an impurity element imparting one conductivity type is added from the surface on which the first electrode 116 is formed to form the impurity silicon layer 122 on the one surface of the single crystal silicon substrate 101 (see FIG. 15C), the insulating layer 112 is formed over the first electrode 116 (see FIG. 15D). The impurity silicon layer 122 is formed between the single crystal silicon substrate 101 and the first electrode 116. Hereinafter, the photoelectric conversion device may be manufactured based on the aforementioned embodiment modes.

With the forming orders illustrated in FIGS. 14A to 14D and FIGS. 15A to 15D, the first electrode 116 functions as a protection layer in the step of adding an impurity element or irradiating with ions or cluster ions, whereby another protection layer is not required to be formed. Therefore, steps for providing and removing a protection layer can be omitted and a process can be shortened.

Note that this embodiment mode can be combined with any of the other embodiment modes and embodiments, as appropriate.

Embodiment Mode 5

In this embodiment mode, an example a separated single crystal silicon substrate 103 from which a first single crystal silicon layer 124 is separated is subjected to recycling treatment will be described.

In aforementioned FIG. 5B, the separated single crystal silicon substrate 103 from which the first single crystal silicon layer 124 is separated is obtained. The separated single crystal silicon substrate 103 can be reused repeatedly as a single crystal silicon substrate after recycling treatment.

As the recycling treatment of the separated single crystal silicon substrate, polishing treatment, etching treatment, thermal treatment, laser beam irradiation treatment, or the like can be used. For polishing treatment, chemical mechanical polishing, mechanical polishing, liquid jet polishing, or the like can be given. By polishing treatment, the substrate can be made to have a surface with a high planarity.

Preferably, a surface which is a separation surface of the separated single crystal silicon substrate 103 is removed by wet etching. After that, the resulting surface is subjected to polishing treatment to be planarized.

First, crystal defects and an insulating layer which are left on the separation surface of the separated single crystal silicon substrate 103 are removed by wet etching. In some cases, at an end portion of the single crystal silicon substrate, a single crystal silicon layer cannot be separated, and the end portion is left remaining in a projecting shape after separation. Further, in the case where the end portion is left remaining in a projecting shape, the insulating layer and the like formed over the single crystal silicon substrate exist in some cases. Such projecting portions are removed by this wet etching. In this wet etching, hydrofluoric acid based solution is used when the insulating layer is removed. In addition, when the crystal defects or the projecting portions are removed, tetra methyl ammonium hydroxide (TMAH) or the like can be used.

Then, the surface of the separated single crystal silicon substrate 103 which has been subjected to etching treatment is subjected to polishing treatment, such as CMP treatment and mechanical polishing treatment. In order to planarize the surface of the separated single crystal silicon substrate 103, the surface of the separated single crystal silicon substrate 103 is preferably polished by about 1 μm to 10 μm. After polishing, since polishing particles and the like are left on the surface of the separated single crystal silicon substrate 103, cleaning with hydrofluoric acid, RCA cleaning, cleaning with water containing ozone, or cleaning with a mixture of ammonium hydroxide and a hydrogen peroxide solution (also referred to as APM cleaning or SC1 cleaning) is preferably performed on the surface of the separated single crystal silicon substrate 103.

In this manner, the separated single crystal silicon substrate 103 can be recycled as a single crystal silicon substrate. The recycled single crystal silicon substrate may be repeatedly used as a single crystal silicon substrate as a material for manufacturing a photoelectric conversion device or may be used for another purpose. For example, the photoelectric conversion device can be manufactured with use of the single crystal silicon substrate obtained by recycling treatment of the separated single crystal silicon substrate, repeating the steps illustrated FIGS. 4A to 4E, FIGS. 5A to 5D, and FIGS. 6A to 6D. That is, a plurality of photoelectric conversion devices can be manufactured from one single crystal silicon substrate. Therefore, resources can be used effectively, which can lead to reduction of a cost.

Note that this embodiment mode can be combined with any of the other embodiment modes and embodiments, as appropriate.

Embodiment Mode 6

In this embodiment mode, an example of a photoelectric conversion device in which a plurality of unit cells is stacked will be described. In this embodiment mode, a so-called tandem photoelectric conversion device in which two unit cells are stacked will be described. Note that in this embodiment mode, the structure and the manufacturing method of the supporting substrate 110 to the first unit cell 120 are based on the aforementioned embodiment modes, and the repeated description thereof is omitted.

Further, the photoelectric conversion device described in this embodiment mode has a structure in which the unit cells with photoelectric conversion layers having different energy gaps are stacked, specifically, in which a unit cell with a photoelectric conversion layer having larger energy gap than that of a first unit cell 120 is provided over the first unit cell 120. In this embodiment mode, the photoelectric conversion layer of the first unit cell 120 is formed from single crystal silicon and the photoelectric conversion layer of a second unit cell 230 is formed from non-single-crystal silicon. Hereinafter, an example of a method for manufacturing the tandem photoelectric conversion device and a structure thereof will be described.

Figure 16A:
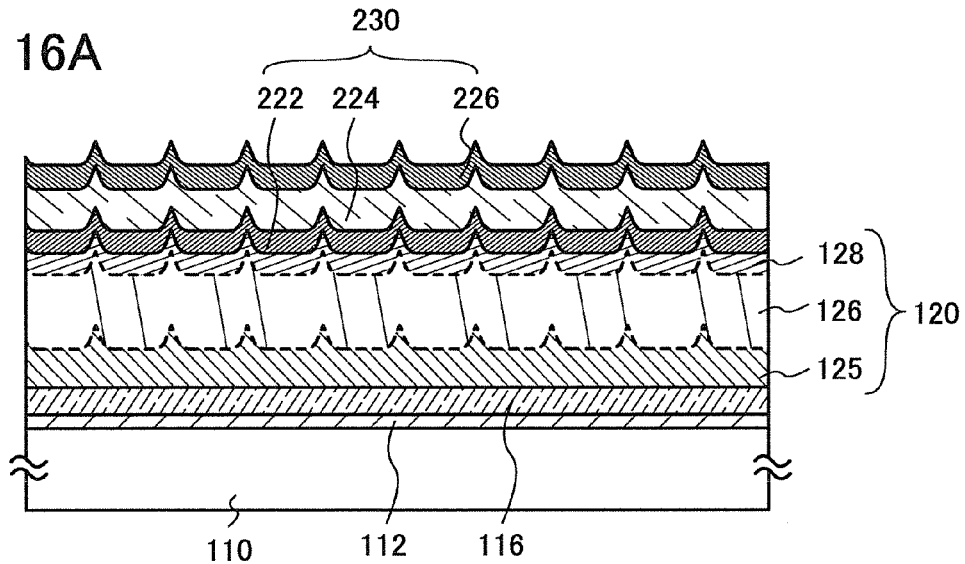
FIGS. 16A to 16C are cross sectional views illustrating one example of a method for manufacturing a tandem photoelectric conversion device.

A third impurity silicon layer 222 having one conductivity type, an amorphous silicon layer 224, and a fourth impurity silicon layer 226 having a conductivity type opposite to the one conductivity type are sequentially formed over the first unit cell 120 (FIG. 16A).

The third impurity silicon layer 222 is formed using a non-single-crystal silicon layer having a conductivity type opposite to that of the second impurity silicon layer 128 of the first unit cell 120, specifically, an amorphous silicon layer or a microcrystalline silicon layer. Here, the third impurity silicon layer 222 is formed using a p-type amorphous silicon layer or a p-type microcrystalline silicon layer. In addition, the third impurity silicon layer 222 is formed to have a thickness of 10 nm to 100 nm. The non-single-crystal silicon layer 224 is formed using an i-type amorphous silicon layer which does not include an impurity element imparting a conductivity type, to have a thickness of 100 nm to 300 nm, preferably, greater than or equal to 100 nm and less than or equal to 200 nm. The fourth impurity silicon layer 226 is formed using an amorphous silicon layer or a microcrystalline silicon layer having a conductivity type opposite to that of the third impurity silicon layer 222 and an n-type amorphous silicon layer or an n-type microcrystalline silicon layer is formed, here. The fourth impurity silicon layer 226 is formed to have a thickness of 10 nm to 100 nm.

The non-single-crystal silicon layer 224 is formed by a plasma CVD method using a silane based gas as a source gas. Specifically, a hydride of silicon typified by silane or disilane, or another silane based gas such as a fluoride of silicon or a chloride of silicon can be used. The silane based gas or the silane based gas including hydrogen and/or a rare gas may be used as the source gas. The non-single-crystal silicon layer 224 can be formed using the source gas with use of a plasma CVD apparatus which generates plasma by applying a high-frequency electric power with an electric power frequency of 10 MHz to 200 MHz. Instead of applying the high-frequency electric power, a microwave electric power with an electric power frequency of 1 GHz to 5 GHz, typically 2.45 GHz may be applied. The third impurity silicon layer 222 and the fourth impurity silicon layer 226 are similarly formed by a plasma CVD apparatus in such a manner that, in the case of forming a p-type non-single-crystal silicon layer, diborane is added as a doping gas to the source gas. In the case of forming an n-type non-single-crystal silicon layer, phosphine is added as the doping gas. Note that the non-single-crystal silicon layer 224 also can be formed by a sputtering method. When amorphous silicon is used as the non-single-crystal silicon layer 224, the energy gap is 1.75 eV. With such materials, light in the wavelength region that is shorter than 800 nm is absorbed, whereby photoelectric conversion can be performed.

As described above, the second unit cell 230 can be obtained in which the third impurity silicon layer 222 having one conductivity type, the non-single-crystal silicon layer 224, and the fourth impurity silicon layer 226 having a conductivity type opposite to the one conductivity type are sequentially stacked.

Figure 16B:
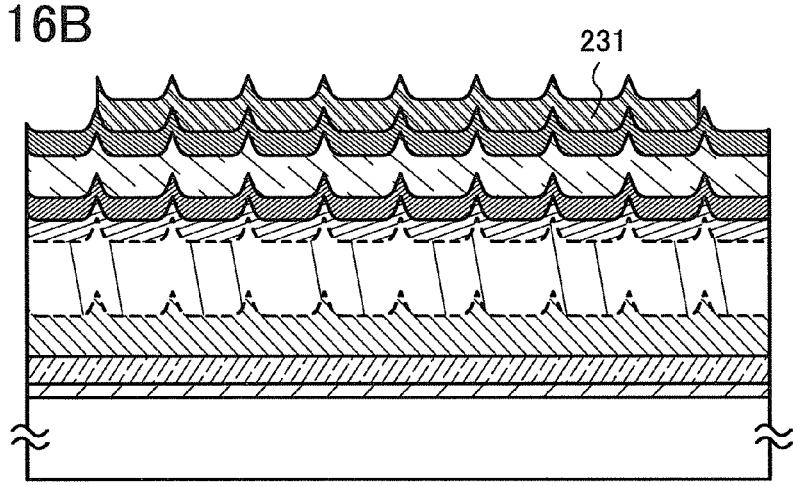

A second electrode 231 is formed over the fourth impurity silicon layer 226 (see FIG. 16B). The second electrode 231 is formed using a transparent conductive material. In this manner, light can enter from the second electrode 231 side. As the transparent conductive material, metal oxide such as indium tin oxide (ITO) alloy, zinc oxide, tin oxide, an alloy of indium oxide and zinc oxide, or the like is used. The second electrode 231 has a thickness of 40 nm to 200 nm, preferably 50 nm to 100 nm. In addition, the sheet resistance of the second electrode 231 may be about 20 Ω/square to 200 Ω/square.

The second electrode 231 is formed by a sputtering method or a vacuum evaporation method. In this embodiment mode, it is preferable that the second electrode 231 is formed using a shadow mask so that the second electrode 231 is selectively formed in a region where the first unit cell 120 and the second unit cell 230 overlap with each other. The second electrode 231 formed selectively can be used as a mask for etching to expose part (preferably an end portion) of the first electrode 116.

Note that a conductive high molecular material (also referred to as a conductive polymer) can be used for the second electrode 231 instead of the aforementioned metal oxide. As the conductive macromolecular material, π electron conjugated conductive polymer can be used. For example, polyaniline and/or a derivative thereof, polypyrrole and/or a derivative thereof, polythiophene and/or a derivative thereof, and a copolymer of two or more kinds of those materials can be used.

Figure 16C:
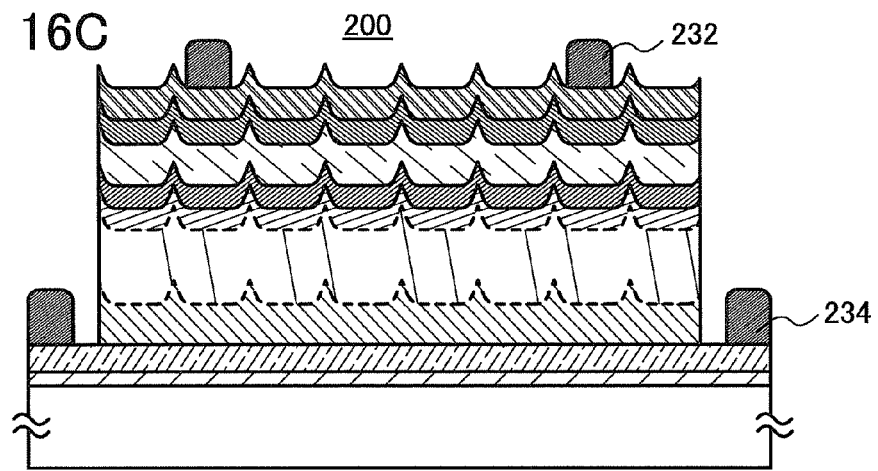

The fourth impurity silicon layer 226, the non-single-crystal silicon layer 224, the third impurity silicon layer 222, the second impurity silicon layer 128, the second single crystal silicon layer 126, and the first impurity silicon layer 125 are etched using the second electrode 231 as a mask to expose part of the first electrode 116. Then, a first auxiliary electrode 234 which is connected to the first electrode 116 and a second auxiliary electrode 232 which is connected to the second electrode 231 are formed (see FIG. 16C).

The etching may be dry etching using a fluorine based gas such as $NF_3$, $SF_6$, or the like under the condition where the etching selectivity ratio of the first electrode 116 with respect to the layers formed over the first electrode 116 (the first impurity silicon layer 125 to the fourth impurity silicon layer 226) is sufficiently high. Since the second electrode 231 can be used as a mask here, a new mask for etching is not necessary. Needless to say, a mask can be formed using resist or an insulating layer.

The second auxiliary electrode 232 is formed so as to have a grid shape (or a comb shape or a pectinate shape) as the second electrode 132 illustrated in FIG. 3A when it is seen from above. This is because the photoelectric conversion device 200 of this embodiment mode has the structure in which light enters from the second electrode 231 side and because an effective area for light which is incident on the second unit cell 230 and the first unit cell 120 is increased.

The first auxiliary electrode 234 is formed in contact with the first electrode 116 which is exposed by the above etching. The first auxiliary electrode 234 is formed, so that the first auxiliary electrode 234 functions as an extraction electrode and can be led freely.

The first auxiliary electrode 234 and the second auxiliary electrode 232 may be formed using nickel, aluminum, silver, lead-tin (solder), or the like by a printing method. For example, the first auxiliary electrode 234 and the second auxiliary electrode 232 can be formed using a nickel paste or a silver paste by a screen printing method.

As described above, the tandem photoelectric conversion device can be formed. In the photoelectric conversion device according to this embodiment mode, projections with regular intervals are formed at least on the surface of the first unit cell 120 (the surface of the second impurity silicon layer 128) to form unevenness. Therefore, the second unit cell 230 and the second electrode 231 are formed over the first unit cell 120 whose surface is provided with unevenness and an uneven structure is reflected on a surface of the second electrode 231, so that and unevenness is formed on the surface of the second electrode 231. With the uneven structure of the surface of the second electrode 231, light confinement effect can be realized. Accordingly, the photoelectric conversion efficiency can be improved.

Further, the photoelectric conversion device according to this embodiment mode has a structure in which the first unit cell 120 and the second unit cell 230 are stacked over the supporting substrate 110 and the photoelectric conversion layer of the second unit cell 230 has larger energy gap than that of the first unit cell 120. Specifically, the photoelectric conversion layer of the second unit cell 230 is formed using a non-single-crystal silicon layer, and the photoelectric conversion layer of the first unit cell 120 is formed using a single crystal silicon layer. The photoelectric conversion layers having different energy gaps are stacked, whereby a wavelength range of light that can be absorbed is increased and photoelectric conversion efficiency can be improved. In particular, the wavelengths of sunlight widely range from a short wavelength to a long wavelength, and light of a wide wavelength range can be efficiently absorbed by use of the structure described in this embodiment mode. In addition, a photoelectric conversion layer with a large energy gap is arranged on the light incident side, whereby light with a short wavelength and a long wavelength can be efficiently absorbed.

Although not shown here, it is preferable that a passivation layer which serves as an antireflection layer be formed for the tandem photoelectric conversion device, as illustrated in FIG. 9. Further, the first unit cell 120″ described in Embodiment Mode 3 can be used instead of the first unit cell 120.

Figure 17A:
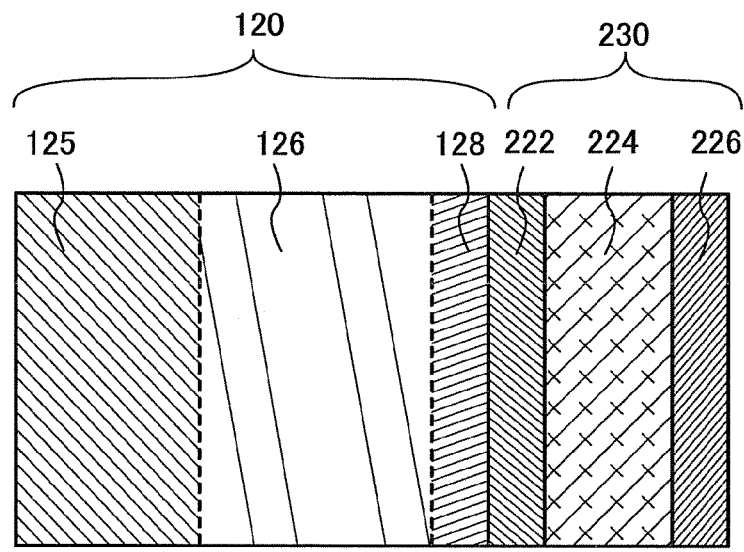
FIG. 17A is a cross sectional view of unit cells of a tandem photoelectric conversion device and 17B is an energy band diagram corresponding to FIG. 17A.

Here, FIG. 17A is a cross sectional schematic diagram illustrating an example of the first unit cell 120 and the second unit cell 230 included in the photoelectric conversion device of this embodiment mode. In this case, the p-type first impurity silicon layer 125 (p-layer), the i-type second single crystal silicon layer 126 (i-layer), and the n-type second impurity silicon layer 128 (n-layer) are arranged in the first unit cell 120 while the p-type third impurity silicon layer 222 (p-layer), the i-type non-single-crystal silicon layer 224 (i-layer), and the n-type fourth impurity silicon layer 226 (n-layer) are stacked in the second unit cell 230. In addition, the first unit cell 120 has a single crystal silicon layer having an energy gap of 1.12 eV and the second unit cell 230 has a non-single-crystal silicon layer having an energy gap of 1.75 eV. Light enters from the n-type fourth impurity silicon layer 226 (the n-layer) side. Accordingly, the second unit cell 230 having a non-single-crystal silicon layer with a large energy gap is located on the light incident side, and the first unit cell 120 having a single crystal silicon layer with a small energy gap is arranged behind the second unit cell 230.

Figure 17B:
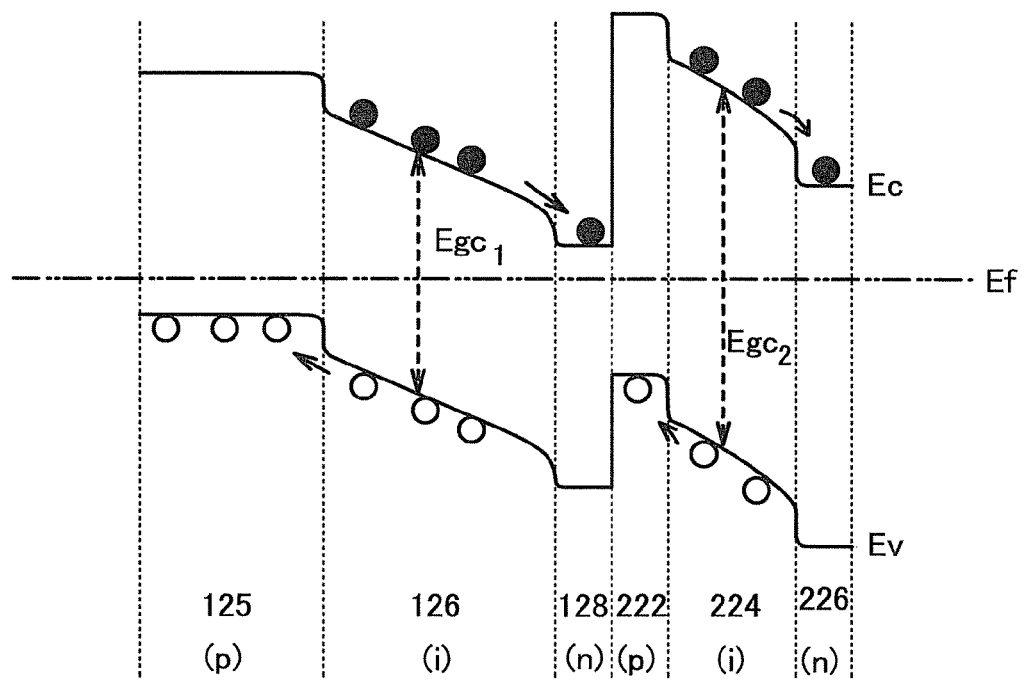

FIG. 17B is an energy band diagram corresponding to the first unit cell 120 and the second unit cell 230 of FIG. 17A. In the energy band diagram, $Egc_1$ indicates the energy gaps of the second single crystal silicon layer 126, which is about 1.1 eV. $Egc_2$ indicates the energy gap of the non-single-crystal silicon layer 224, which is about 1.8 eV Ec indicates the level of the lower limit of a conduction band, Ev indicates the level of the upper limit of a valence band, and Ef indicates Fermi level.

As illustrated in the energy band diagram of FIG. 17B, electrons of carriers generated by optical excitation flow to the n-layer side and holes of carriers generated by optical excitation flow to the p-layer side. A p-n junction is formed at a connection portion of the first unit cell 120 and the second unit cell 230, and a diode is inserted in a direction opposite to the direction of current flow in terms of an equivalent circuit.

In this case, a recombination center is formed at the bonding interface between the second impurity silicon layer 128 and the third impurity silicon layer 222 so that recombination current flows at this bonding interface. The second impurity silicon layer 128 is formed and the third impurity silicon layer 222 having a conductivity type opposite to that of the second impurity silicon layer 128 is formed thereover, whereby the p-n junction can be formed at the connection portion of the first unit cell 120 and the second unit cell 230.

As described above, in the tandem photoelectric conversion device, when the first unit cell 120 having a single crystal silicon layer is used as a bottom cell, light with a long wavelength greater than or equal to 800 nm can be absorbed and converted into electricity, which contributes to improvement in photoelectric conversion efficiency. In addition, when the second unit cell 230 having a non-single-crystal silicon layer is used as a top cell, light with a short wavelength less than 800 nm can be absorbed and converted into electricity, which contributes to improvement in photoelectric conversion efficiency.

The photoelectric conversion device in this embodiment mode has the uneven structure on the light incident side and reflection of light can be reduced. Further, the unit cell having the non-single-crystal silicon layer is stacked over the unit cell having the single crystal silicon layer, so that the photoelectric conversion device in this embodiment mode has a structure in which the unit cells having different energy gaps are stacked. In addition, the photoelectric conversion device in this embodiment mode has a structure in which the unit cell having the photoelectric conversion layer with a large energy gap (the non-single-crystal silicon layer) is arranged on the light incident side. Therefore, the wavelength range of light that is absorbed by the photoelectric conversion device can be wider, and sunlight that covers a wide wavelength range can be efficiently absorbed. Thus, the photoelectric conversion efficiency can be improved and the photoelectric conversion device with excellent photoelectric conversion characteristics can be manufactured.

Note that this embodiment mode can be combined with any of the other embodiment modes and embodiments, as appropriate.

Embodiment Mode 7

In this embodiment mode, a photoelectric conversion device in which a plurality of unit cells is stacked, specifically, a so-called stacked photoelectric conversion device in which three unit cells are stacked is described with reference to the drawings.

Figure 18:
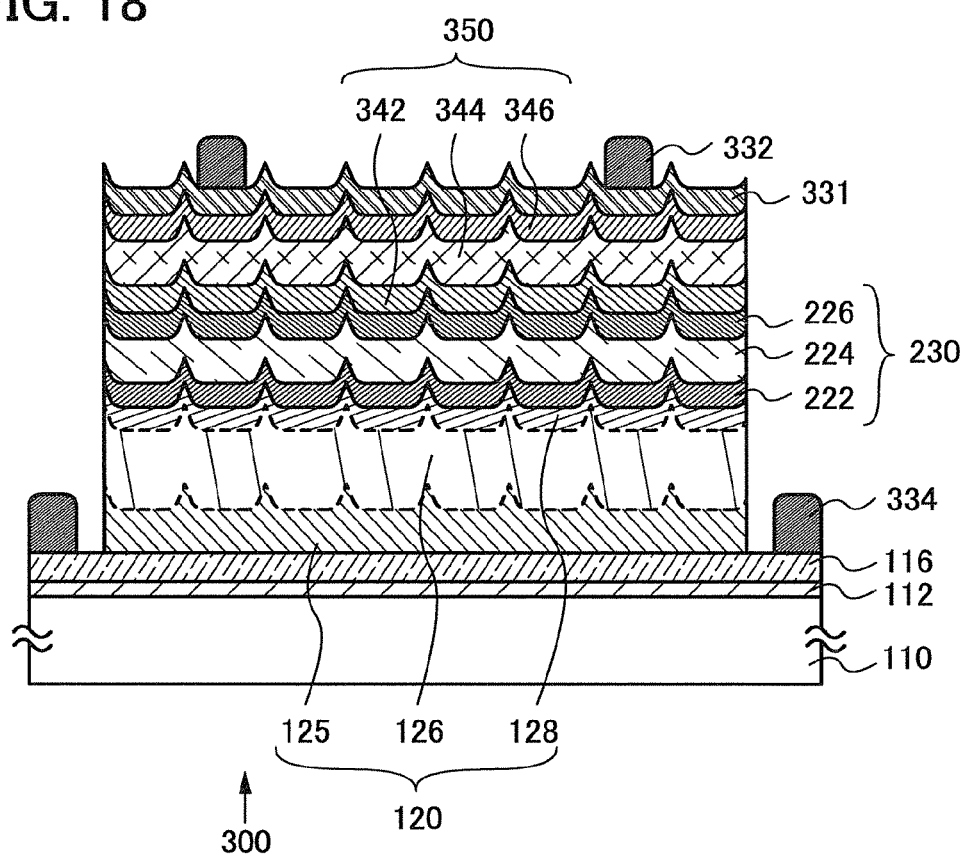
FIG. 18 is a cross sectional view illustrating one example of a stacked photoelectric conversion device.

FIG. 18 is a cross sectional schematic diagram of an example of the stacked photoelectric conversion device 300 in which three unit cells are stacked. The photoelectric conversion device 300 has a structure in which a first unit cell 120 using a single crystal silicon layer as a photoelectric conversion layer, a second unit cell 230 using a non-single-crystal silicon layer as a photoelectric conversion layer, and a third unit cell 350 using a non-single-crystal silicon layer as a photoelectric conversion layer are sequentially stacked over a supporting substrate 110. A first electrode 116 is provided between the supporting substrate 110 and the first unit cell 120, and an insulating layer 112 is provided between the first electrode 116 and the supporting substrate 110. In addition, a first auxiliary electrode 334 is selectively provided in contact with the first electrode 116. A second electrode 331 is provided over the third unit cell 350, and a second auxiliary electrode 332 is selectively provided in contact with the second electrode 331.

The photoelectric conversion device 300 preferably has a structure in which light can enter from the third unit cell 350 side, and it is preferable to arrange the unit cells so that energy gaps of the photoelectric conversion layers decrease from the third unit cell 350 side. For example, when the first single crystal silicon layer of the first unit cell 120 has an energy gap of 1.12 eV, the non-single-crystal silicon layer 224 of the second unit cell 230 located closer to the light incidence side than the first unit cell 120 preferably has an energy gap larger than 1.12 eV, and the non-single-crystal semiconductor layer 344 of the third unit cell 350 located further closer to the light incidence side than the second unit cell 230 preferably has the largest energy gap. The unit cells each have different energy gaps and are arranged so that the energy gaps are arranged in descending order from the light incident side, whereby the unit cells can absorb light with different wavelength ranges and sunlight with wide wavelength range can be absorbed efficiently.

As for the structure and the method for forming the supporting substrate 110 to the second unit cell 230, description based on the aforementioned embodiment modes is omitted or simplified.

After formation up to the first unit cell 120 is performed, the third impurity silicon layer 222 having one conductivity type, the non-single-crystal silicon layer 224, and the fourth impurity silicon layer 226 having a conductivity type opposite to the one conductivity type, which are included in the second unit cell 230, are formed. Then, a fifth impurity silicon layer 342 having one conductivity type, the non-single-crystal silicon layer 344, and a sixth impurity silicon layer 346 having a conductivity type opposite to the one conductivity type are formed over the second unit cell 230, thereby forming the third unit cell 350. The fifth impurity silicon layer 342 has a conductivity type opposite to that of the fourth impurity silicon layer 226 of the second unit cell 230. That is, in the photoelectric conversion device 300, the first impurity silicon layer 125 having one conductivity type, the second single crystal silicon layer 126, the second impurity silicon layer 128 having a conductivity type opposite to the one conductivity type, the third impurity silicon layer 222 having the one conductivity type, the non-single-crystal silicon layer 224, the fourth impurity silicon layer 226 having a conductivity type opposite to the one conductivity type, the fifth impurity silicon layer 342 having one conductivity type, the non-single-crystal silicon layer 344, and the sixth impurity silicon layer 346 having a conductivity type opposite to the one conductivity type are sequentially formed over the first electrode 116.

The fifth impurity silicon layer 342 of the third unit cell 350 is similar to the third impurity silicon layer 222 of the second unit cell 230, and the sixth impurity silicon layer 346 is similar to the fourth impurity silicon layer 226. That is, when the fifth impurity silicon layer 342 is set to be p-type, the sixth impurity silicon layer 346 is set to be n-type, whereas when the fifth impurity semiconductor layer 342 can be set to be n-type, the sixth impurity semiconductor layer 346 can be set to be p-type. When a p-type impurity silicon layer is used, diborane is added to a source gas; on the other hand, when an n-type impurity silicon layer is used, phosphine is added to a source gas.

In the photoelectric conversion device, the uneven structure formed on the first unit cell 120 is reflected on the second unit cell 230, and further, reflected on the third unit cell 350 and the second electrode 331 which are formed thereover. That is, a surface of the second electrode 331 has an uneven structure, so that light confinement effect can be realized. Accordingly, the photoelectric conversion efficiency can be improved.

Note that the first unit cell 120" described in Embodiment Mode 3 can be used instead of the first unit cell 120.

Figure 19A:
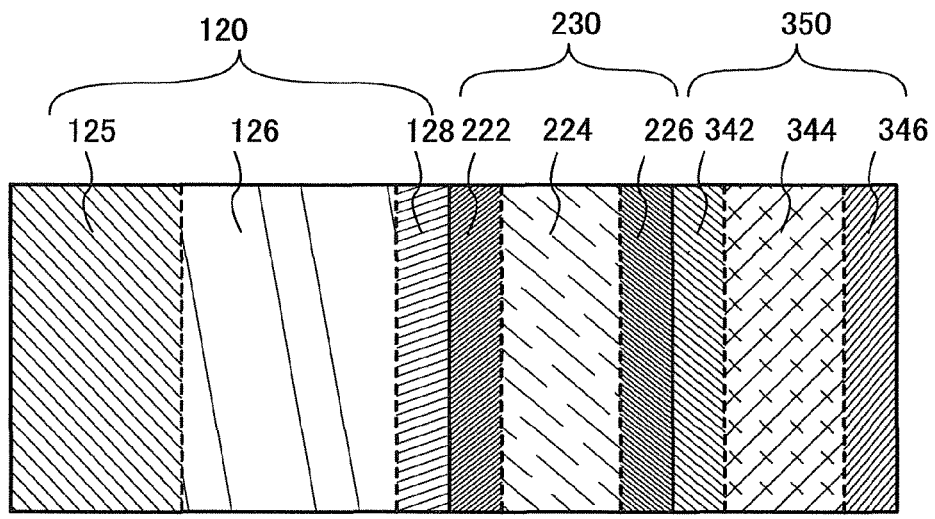
FIG. 19A is a cross sectional view of unit cells of a stacked photoelectric conversion device and FIG. 19B is ab energy band diagrams corresponding to FIG. 19A.

Here, FIG. 19A is a cross sectional schematic diagram illustrating an example of the first unit cell 120, the second unit cell 230, and the third unit cell 350 which are included in the photoelectric conversion device of this embodiment mode. In this case, the p-type first impurity silicon layer 125 (p-layer), the i-type second single crystal silicon layer 126 (i-layer), and the n-type second impurity silicon layer 128 (n-layer) are arranged in the first unit cell 120. The p-type third impurity silicon layer 222 (p-layer), the i-type non-single-crystal silicon layer 224 (i-layer), and the n-type fourth impurity silicon layer 226 (n-layer) are arranged in the second unit cell 230. The p-type fifth impurity silicon layer 342 (p-layer), the i-type non-single-crystal silicon layer 344 (i-layer), and the n-type sixth impurity silicon layer 346 (n-layer) are arranged in the third unit cell 350.

Figure 19B:
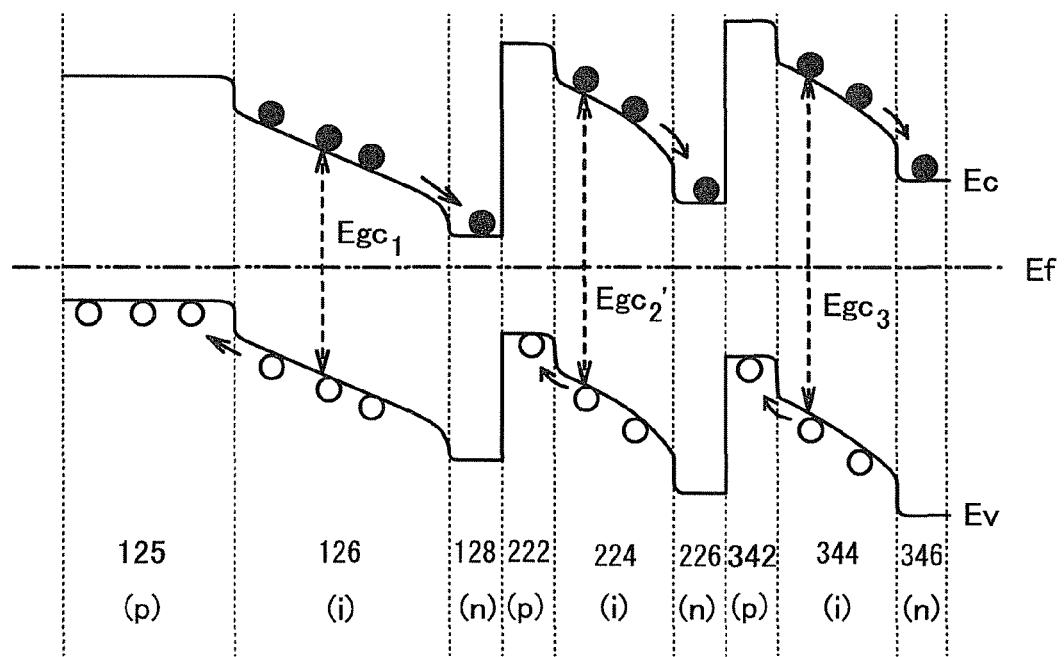

FIG. 19B is an energy band diagram corresponding to the first unit cell 120, the second unit cell 230, and the third unit cell 350 of FIG. 19A. In the energy band diagram, $Egc_1$ indicates an energy gap of the second single crystal silicon layer 126, $Egc_2'$ indicates an energy gap of the non-single-crystal silicon layer 224, and $Egc_3$ indicates an energy gap of the non-single-crystal silicon layer 344. Ec indicates the level of the lower limit of a conduction band, Ev indicates the level of the upper limit of a valence band, and Ef indicates Fermi level. In addition, the first unit cell 120 has a single crystal silicon layer having an energy gap of $Egc_1$, the second unit cell 230 has a non-single-crystal silicon layer having an energy gap of $Egc_2'$ which is larger than $Egc_1$, and the third unit cell 350 has a non-single-crystal silicon layer having an energy gap of $Egc_3$ which is larger than $Egc_2'$. Note that light enters from the n-type sixth impurity silicon layer 346 side (n-layer). Accordingly, the unit cells each having a photoelectric conversion layer are arranged in such a manner that their energy gaps are arranged in descending order from the light incident side.

As illustrated in the energy band diagram of FIG. 19B, electrons of carriers generated by optical excitation flow to the n-layer side and holes of carriers generated by optical excitation flow to the p-layer side. A p-n junction is formed at a connection portion of the first unit cell 120 and the second unit cell 230, and a diode is inserted in a direction opposite to the direction of current flow in terms of an equivalent circuit. In this case, a recombination center is formed at the bonding interface between the second impurity silicon layer 128 and the third impurity silicon layer 222 so that recombination current flows at this bonding interface. When the third impurity silicon layer 222 having a conductivity type opposite to that of the second impurity silicon layer 128 is formed over the second impurity silicon layer 128, the recombination center can be formed at the bonding interface. A p-n junction is also formed at a connection portion of the second unit cell 230 and the third unit cell 350, and a diode is inserted in a direction opposite to the direction of current flow in terms of an equivalent circuit. In this case, a recombination center is formed at the bonding interface between the fourth impurity silicon layer 226 and the fifth impurity silicon layer 342 so that recombination current flows at this bonding interface.

In this manner, the photoelectric conversion device is formed to be a stacked photoelectric conversion device and have the surface uneven structure. Therefore, the wavelength range of light that is absorbed can be extended and reflection of light can be reduced, which contributes to further improvement in photoelectric conversion efficiency.

Note that this embodiment mode can be combined with any of the other embodiment modes and embodiments, as appropriate.

Embodiment Mode 8

Figure 20A:
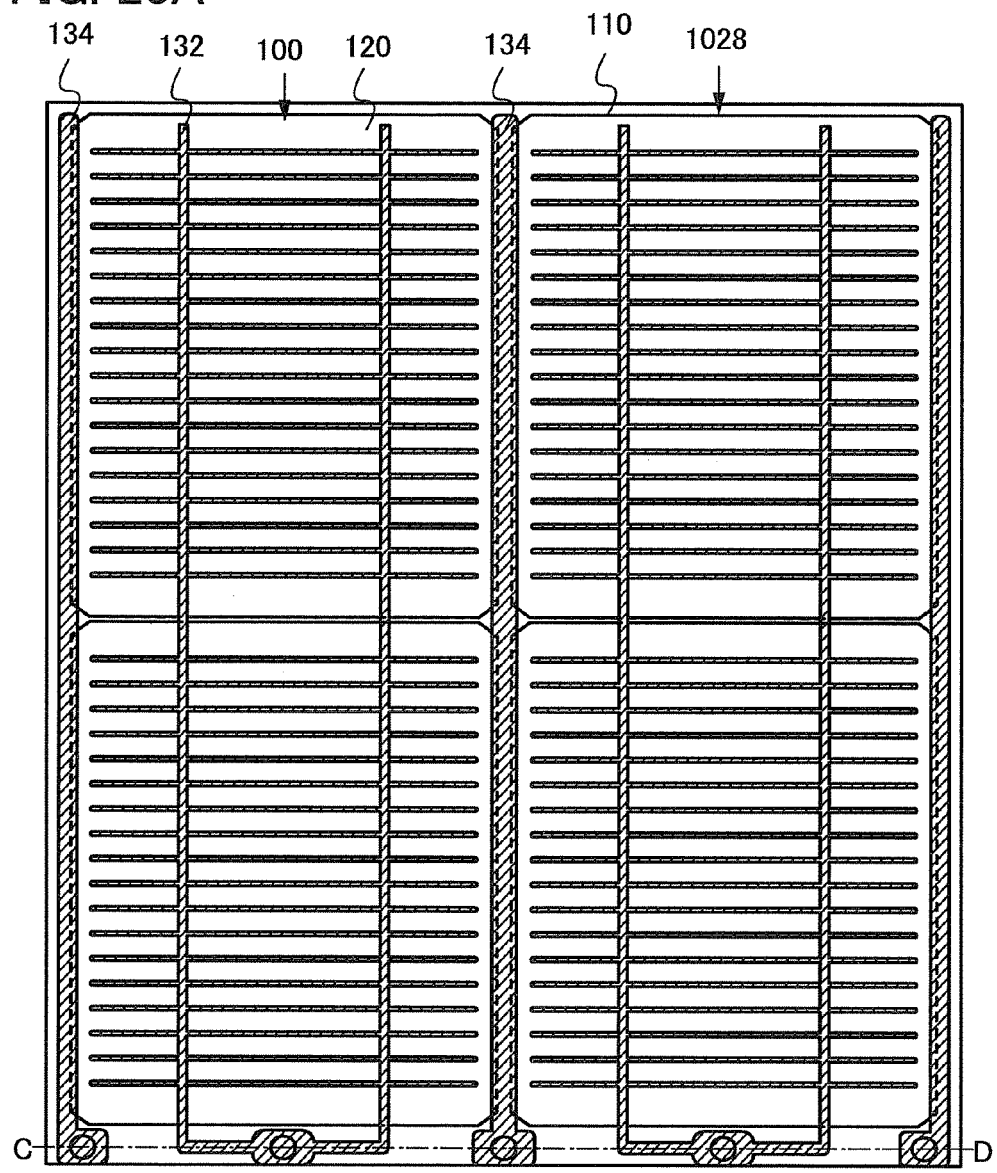
FIGS. 20A and 20B are conceptual views illustrating a structure of a solar photovoltaic module.
Figure 20B:
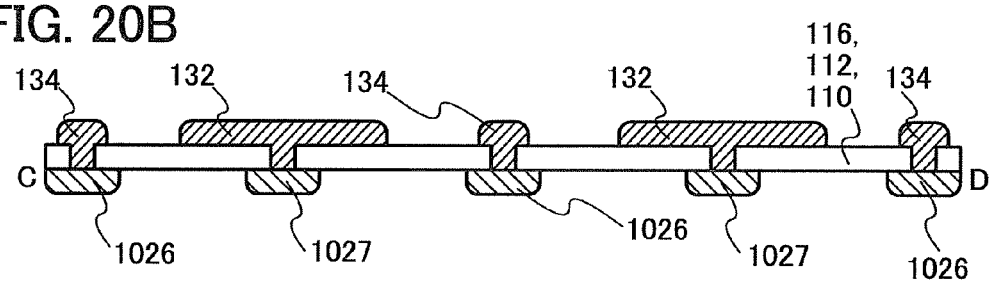

A solar photovoltaic module can be manufactured using the photoelectric conversion device obtained by Embodiment Modes 2 to 7. In this embodiment mode, an example of a solar photovoltaic module using the photoelectric conversion device described in Embodiment Mode 2 is illustrated in FIGS. 20A and 20B. Needless to say, the photoelectric conversion device described in another embodiment mode may be used.

A photovoltaic power generation module 1028 has a first unit cell 120 provided over one surface of a supporting substrate 110. Between the supporting substrate 110 and the first unit cell 120, an insulating layer 112 and a first electrode 116 are provided sequentially from the supporting substrate 110 side. The first electrode 116 is connected to an auxiliary electrode 134.

The auxiliary electrode 134 is formed on the one surface side of the supporting substrate 110 (the side on which the first unit cell 120 is formed) and connected to a first back surface electrode 1026 to be used for a connector, in the end region of the supporting substrate 102. The second electrode 132 is formed on the one surface side of the supporting substrate 110 (the side on which the first unit cell 120 is formed) and connected to a second back surface electrode 1027 to be used for a connector, in the end region of the supporting substrate 110. FIG. 20B is a cross sectional view along a line C-D. The auxiliary electrode 134 is connected to the first back surface electrode 1026 through a penetration opening of the supporting substrate 110, and the second electrode 132 is connected to the second back surface electrode 1027 through a penetration opening of the supporting substrate 110.

In this manner, the supporting substrate 110 is provided with the first unit cell 120 to form a photoelectric conversion device 100. Thus, the solar photovoltaic module 1028 can be made thin.

Note that this embodiment mode can be combined with any of the other embodiment modes and embodiments, as appropriate.

Embodiment Mode 9

Figure 21:
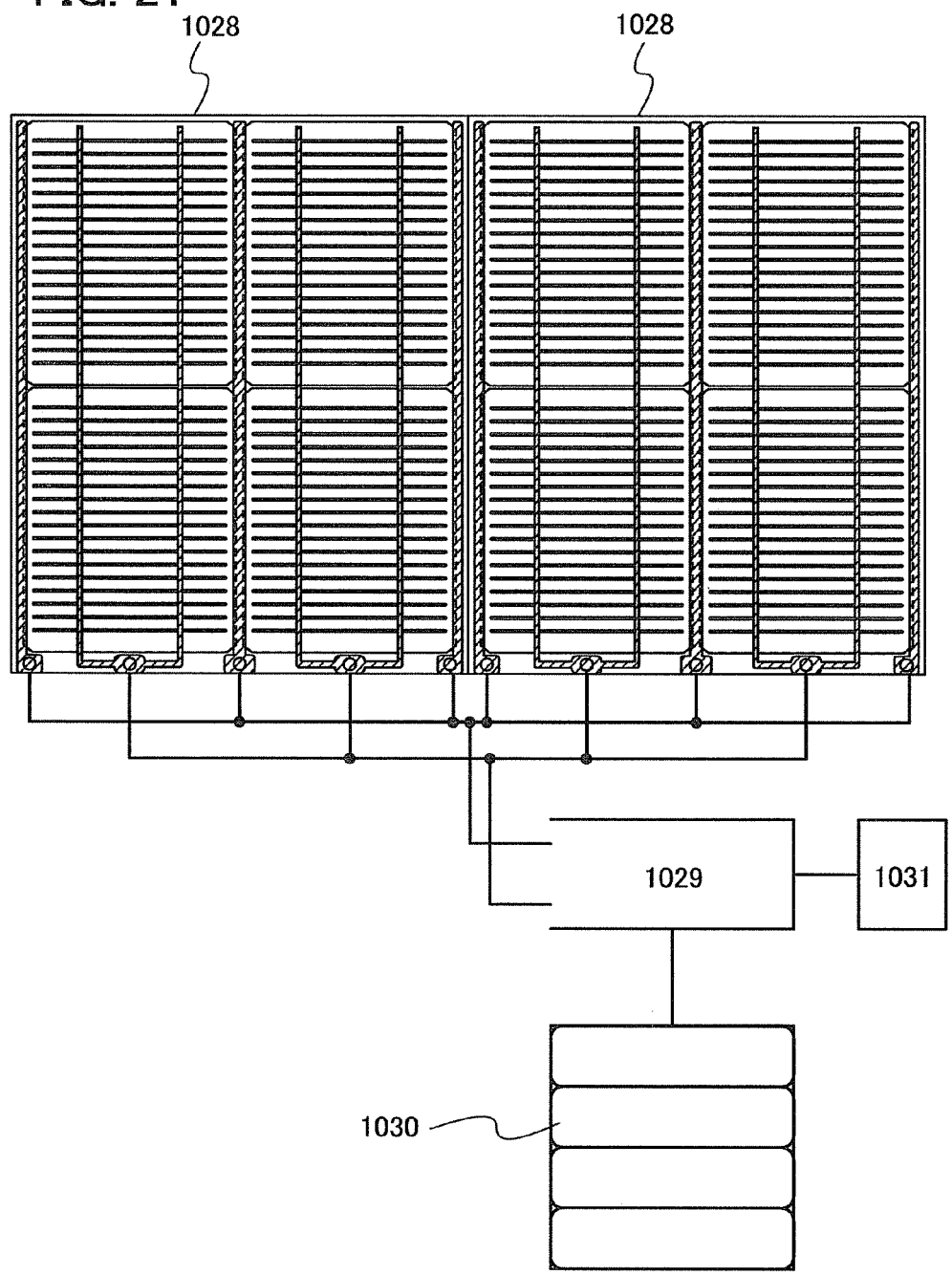
FIG. 21 is a conceptual view illustrating one example of a solar photovoltaic system.

FIG. 21 illustrates an example of a solar photovoltaic system using the solar photovoltaic module 1028 described in Embodiment Mode 8. The output power of one or a plurality of photovoltaic power generation modules 1028 charges a battery 1030 using a charge control circuit 1029. When the amount of charge in the battery 1030 is large, the output power is output directly to a load 1031 in some cases.

When an electric double layer capacitor is used as the battery 1030, the battery 1030 can be charged quickly without the need for chemical reaction in charging. Furthermore, by using the electric double layer capacitor, the lifetime and the charge-discharge efficiency can be increased by about eight times and one and half time, respectively as compared to the case of using a lead storage battery utilizing a chemical reaction. The load 1031 can be applied to various uses such as lighting, such as a fluorescent light, a light-emitting diode, and an electroluminescence panel, and small electronic devices.

Note that this embodiment mode can be combined with any of the other embodiment modes and embodiments, as appropriate.

Embodiment 1

Hereinafter, description is made as follows: unevenness with regular intervals can be formed on a surface of a silicon layer by irradiation with a laser beam using a phase shift mask as an optical modulator and reflectivity of incident light can be reduced and absorptance can be improved by formation of the unevenness with regular intervals. In this embodiment, a structure of a sample measured, a manufacturing method thereof, and a pattern shape of a used phase shift mask will be described.

First, the pattern shape of the used phase shift mask will be described. The phase shift mask was manufactured by forming grooves on a quartz glass substrate to form projection portions and recessed portions. Note that a region at low level (the bottom of the groove) formed by forming the grooves on the quartz glass substrate was defined as the recessed portion and a region at high level (the region left as it is) was defined as the projection portion. The grooves were formed on the quartz glass substrate so that a difference Δt, which was the difference between a surface of the recessed portion and a surface of the projection portion, was 316 nm.

Figure 22A:
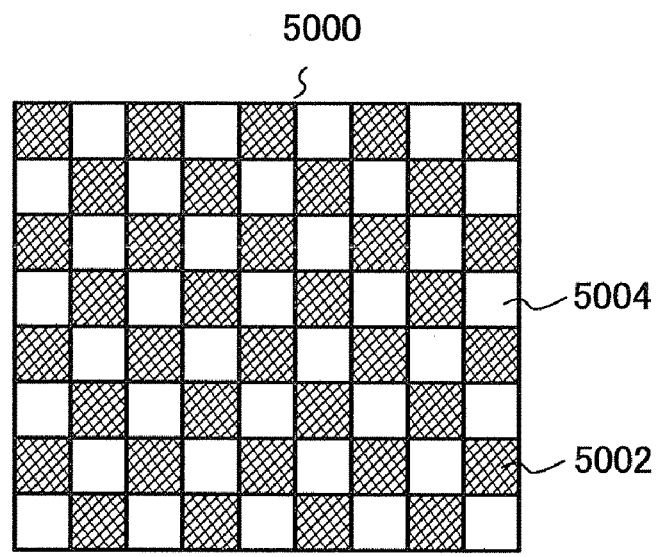
FIGS. 22A and 22B are plan views each illustrating a pattern shape of a phase shift mask.
Figure 22B:
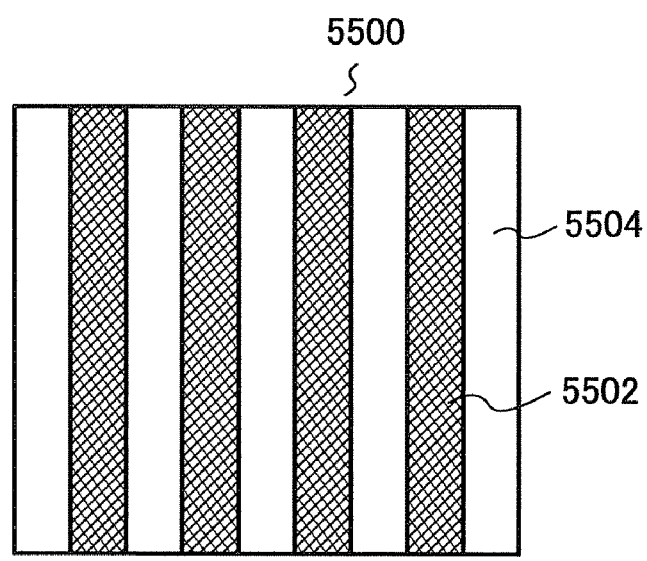

FIG. 22A is a top view illustrating a phase shift mask 5000 and FIG. 22B is a top view illustrating a phase shift mask 5500. A checker flag (checkered) pattern formed using a recessed portion 5002 and a projection portion 5004 is formed on the phase shift mask 5000. This pattern is a rectangular pattern in which the recessed portion 5002 and the projection portion 5004 each have a size of 2 μm square when it is seen from above. The recessed portion 5002 with a size of 2 μm square and the projection portion 5004 with a size of 2 μm square are arranged alternately to form the checker flag pattern. Accordingly, the recessed portions 5002 are arranged at intervals of 2 μm. Similarly, the projection portions 5004 are arranged at intervals of 2 μm. A stripe pattern formed using a recessed portion 5502 and a projection portion 5504 is formed on the phase shift mask 5500. This pattern is a linear pattern in which the recessed portion 5502 and the projection portion 5504 each have a width of 2 μm when it is seen from above. The recessed portions 5502 with a width of 2 μm and the projection portions 5504 with a width of 2 μm are arranged alternately to form a so-called line-and-space pattern. The recessed portions 5502 are arranged at intervals of 2 μm. Similarly, the projection portions are arranged at intervals of 2 μm. Samples used for measurement to be described in the following embodiments were manufactured by irradiation with a laser beam using the phase shift mask illustrated in FIG. 22A or 22B.

Figure 23B:
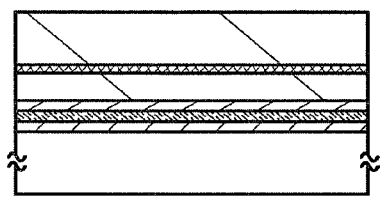

Next, the method for manufacturing the sample used for measurement will be described. FIGS. 23A-1 to 23E are cross sectional views illustrating the method for manufacturing the sample to be measured and the structure thereof. In the following embodiments, the measurement is performed using the sample formed through a process of FIGS. 23A-1 to 23E or a partly modified process of FIGS. 23A-1 to 23E. The basic structure of the sample used for the measurement is illustrated in FIG. 23E. Specifically, a single crystal silicon layer 3013 is formed over a glass substrate 3010 with a silicon oxide layer 3005, a silicon nitride oxide layer 3004, and a silicon oxynitride layer 3003 interposed therebetween. Hereinafter, the manufacturing process illustrated in FIGS. 23A-1 to 23E will be described.

A single crystal silicon substrate 3001 and the glass substrate 3010 were prepared. The silicon oxynitride layer 3003 with a thickness of 50 nm, the silicon nitride oxide layer 3004 with a thickness of 50 nm, and the silicon oxide layer 3005 with a thickness of 50 nm were sequentially stacked over one surface of the single crystal silicon substrate 3001. The silicon oxide layer 3005 was formed by a plasma CVD method using a TEOS gas as a source gas for film formation. An embrittlement layer 3002 was formed in a region at a predetermined depth from the one surface of the single crystal silicon substrate 3001. The embrittlement layer 3002 was formed with use of an ion doping apparatus by irradiating the single crystal silicon substrate 3001 with ions or cluster ions generated from a source gas containing hydrogen. Note that the single crystal silicon substrate 3001 was irradiated with ions or cluster ions for forming the embrittlement layer 3002 from a side provided with the silicon nitride oxide layer 3004 after formation of the silicon nitride oxide silicon layer 3004. As the glass substrate 3010, a non-alkali glass substrate (product name: AN100) with a thickness of 0.7 mm was used (see FIGS. 23A-1 and 23A-2).

Figure 24:
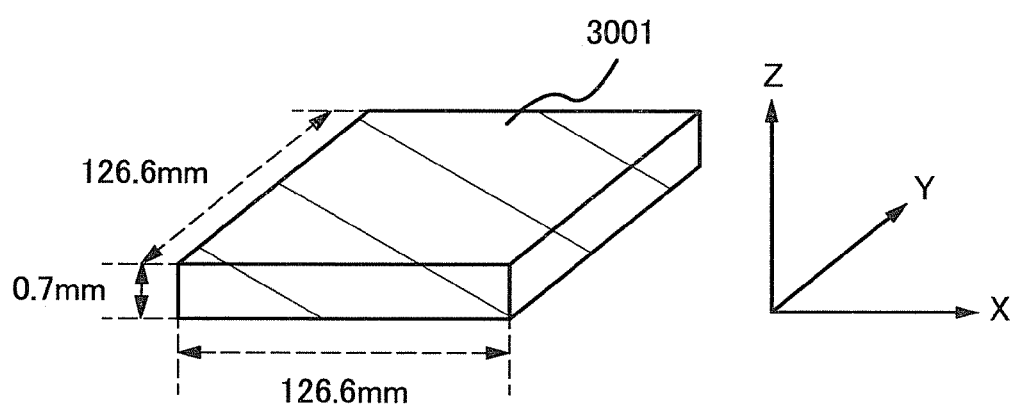
FIG. 24 is a view illustrating a single crystal silicon substrate used for forming a measured sample.

Note that a rectangular substrate with a size of 5-inch square (126.6 mm square) and a thickness of 0.7 mm was used for the single crystal silicon substrate 3001, as illustrated in a perspective view of FIG. 24. The single crystal silicon substrate 3001 had a plane orientation (100) in a Z direction and a plane orientation <100> in a XY direction. Further, the conductivity type of the single crystal silicon substrate 3001 was p-type and resistivity thereof was 1 Ω·cm to 40 Ω·cm.

The single crystal silicon substrate 3001 over which the silicon oxynitride layer 3003 to the silicon oxide layer 3005 had been formed and the glass substrate 3010 were disposed to face each other and the silicon oxide layer 3005 and the glass substrate 3010 were in contact with and bonded to each other. In this manner, the glass substrate 3010 and the single crystal silicon substrate 3001 were bonded to each other (see FIG. 23B). Then, heat treatment was performed and the single crystal silicon substrate 3001 was separated along the embrittlement layer 3002 or the periphery of the embrittlement layer 3002. Thus a single crystal silicon layer 3012 was formed over the glass substrate 3010. The single crystal silicon layer 3012 was separated from the single crystal silicon substrate 3001 and a separated single crystal silicon substrate 3011 from which the single crystal silicon layer 3012 had been separated was obtained (see FIG. 23C).

The single crystal silicon layer 3012 formed over the glass substrate 3010 was irradiated with a laser beam 3052 through a phase shift mask 3050. The single crystal silicon layer 3012 was irradiated with the laser beam 3052 from a surface which was a separation surface of the single crystal silicon layer 3012 (see FIG. 23D). The single crystal silicon layer 3012 was irradiated with the laser beam 3052 through the phase shift mask 3050, so that a single crystal silicon layer 3013 having unevenness with regular intervals on a surface which was the separation surface was formed (see FIG. 23E).

In the following embodiments, measurement results and observation results of the samples formed using the phase shift mask and the manufacturing process described in this embodiment will be described.

Embodiment 2

In this embodiment, a sample I was formed and results will be described, which were obtained by observing an uneven structure with regular intervals formed on a surface of a silicon layer by irradiation with a laser beam through a phase shift mask.

Figure 25A:
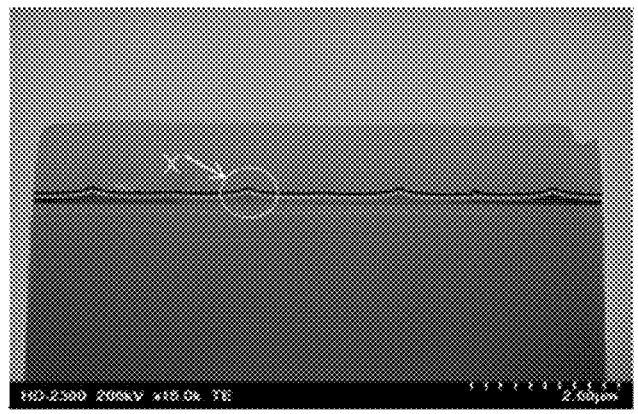
FIGS. 25A to 25C are STEM images of cross section of measured sample, which are obtained with a scanning transmission electron microscope.
Figure 25B:
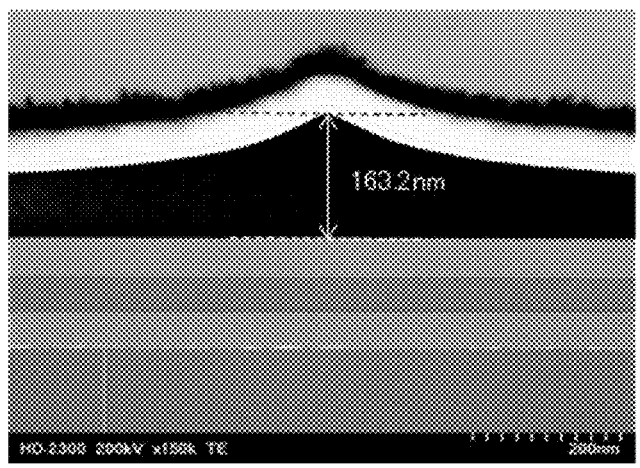
Figure 25C:
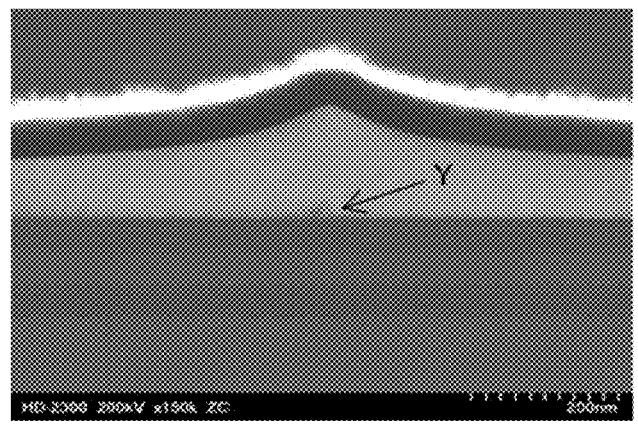

FIGS. 25A to 25C are photographs of cross sections of the sample I. The photographs of cross sections are STEM images photographed with a scanning transmission electron microscope (STEM).

The sample I was formed through the process of FIG. 23A-1 to 23E. The single crystal silicon layer 3013 was formed over the glass substrate 3010 with the silicon oxide layer 3005, the silicon nitride oxide layer 3004, and the silicon oxynitride layer 3003 interposed therebetween. Note that the thickness of the single crystal silicon layer 3012 obtained by the separation step in FIG. 23C was about 100 nm. Further, the phase shift mask 5500 having the stripe pattern shape illustrated in FIG. 22B was disposed, as the phase shift mask 3050, over the single crystal silicon layer 3012 formed over the glass substrate 3010, and irradiated with the laser beam 3052. As for a position of the phase shift mask 3050, since interference effect could not be achieved if the phase shift mask was disposed too close to the single crystal silicon layer 3012, the phase shift mask 3050 was disposed 0.5 mm away from a surface of the single crystal silicon layer 3012. Note that, besides the method in which the phase shift mask is disposed over an object to be processed and the object is irradiated with the laser beam described in this embodiment, an image (the pattern) of the phase shift mask can be transferred to the object to be processed (which is the single crystal silicon layer 3012 in this embodiment) using a transferring optical system. As the laser beam 3052, a linear laser beam with a beam width (short axis) of 360 μm and a length (long axis) of 120 mm was used. The linear laser beam was produced by forming a beam obtained with a XeCl excimer laser having a wavelength of 308 nm, a pulse width of 25 nsec, and a repetition rate of 30 Hz into a linear shape by an optical system. Then, irradiation with the laser beam 3052 was performed while a stage on which the glass substrate 3010 provided with the single crystal silicon layer 3012 was disposed was scanned in a direction parallel to a short axis direction of the linear laser beam 3052 at a scanning speed of 1 mm/sec. The energy density of the laser beam 3052 was 600 mJ/cm². Further, when irradiation with the laser beam 3052 was performed, the inside of a chamber was set to a nitrogen atmosphere and the stage was heated to heat the glass substrate 3010 to a temperature of 500° C.

As shown in FIG. 25A, projections with regular intervals can be observed on a surface of the single crystal silicon layer 3013. In addition, FIG. 25A shows that the interval between the adjacent projections is about 2 μm and that the projections on which the pattern shape of the phase shift mask is reflected are formed. Note that, in FIG. 25A, the single crystal silicon layer 3013 is a black layer located below a white layer and layers over the white layer are coating layers for photographing with STEM.

FIGS. 25B and 25C are enlarged cross sectional photographs of a region X in FIG. 25A. Note that FIG. 25B is a phase contrast image (TE image) and FIG. 25C is a Z-contrast image (ZC image). The height of the projection in the region X is about 163.2 nm, which is lager than the thickness of the single crystal silicon layer formed by separation. Further, a defect Y can be seen near the projection, whereby it is considered that crystals growing in different directions meet each other to form the projection. A melting state is maintained for a longer period in a region with high light intensity of the laser beam modulated by the phase shift mask (the center of the recessed portion of the phase shift mask and the center of the projection portion of the phase shift mask) than that in a region with low light intensity of the laser beam modulated by the phase shift mask (a boundary between the recessed portion and the projection portion of the phase shift mask). Therefore, the crystal growth progresses from the region with low light intensity of the laser beam toward the region with high light intensity of the laser beam. That is, since the crystals grow from the boundary between the recessed portion and the projection portion of the phase shift mask toward the center of the recessed portion and the center of the projection portion, it is guessed that the crystals which have been growing meet each other to form the projection at the center of the recessed portion and the center of the projection portion.

Embodiment 3

In this embodiment, samples A to D were formed and results will be described, which was obtained by observing an uneven structure formed over a surface of the silicon layer and evaluating optical characteristics thereof.

First, a structure and a manufacturing method of each of the samples A to D will be described.

The sample A was formed through the process of FIG. 23A-1 to 23E. The single crystal silicon layer 3013 was formed over the glass substrate 3010 with the silicon oxide layer 3005, the silicon nitride oxide layer 3004, and the silicon oxynitride layer 3003 interposed therebetween. Note that the thickness of the single crystal silicon layer 3012 obtained by the separation step in FIG. 23C was about 120 nm. As the phase shift mask 3050, the phase shift mask 5000 having the checker flag pattern shape illustrated in FIG. 22A was used. As the laser beam 3052, a linear laser beam with a beam width (short axis) of 360 μm and a length (long axis) of 120 mm was used. The linear laser beam was produced by forming a beam obtained with a XeCl excimer laser having a wavelength of 308 nm, a pulse width of 25 nsec, and a repetition rate of 30 Hz into a linear shape by an optical system. Then irradiation with the laser beam 3052 was performed while a stage on which the glass substrate 3010 provided with the single crystal silicon layer 3012 was disposed was scanned in a direction parallel to a short axis direction of the linear laser beam 3052 at a scanning speed of 1 mm/sec. The energy density of the laser beam 3052 was 550 mJ/cm$^2$ to 600 mJ/cm$^2$. Further, when the irradiation with the laser beam 3052 was performed, the inside of a chamber was set to an air atmosphere and the stage was not heated.

The sample B was formed in a manner similar to that of the sample A except that the pattern shape of the phase shift mask was different. In formation of the sample B, the phase shift mask 5500 having the stripe pattern shape illustrated in FIG. 22B was used as the phase shift mask 3050.

The sample C was formed as a comparative example. In the step of FIG. 23D, the irradiation with the laser beam 3052 was performed without the phase shift mask 3050. The sample C was formed in a manner similar to that of the sample A except the step of FIG. 23D.

Figure 23C:
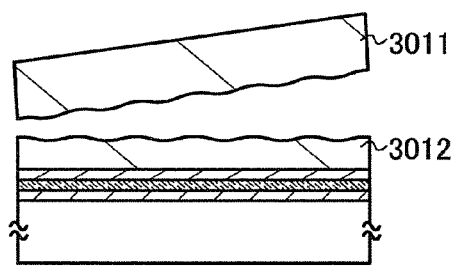
Figure 23D:
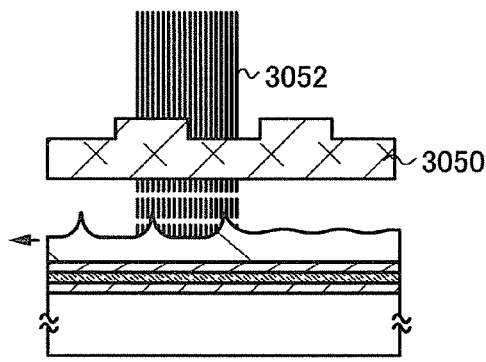
Figure 23E:
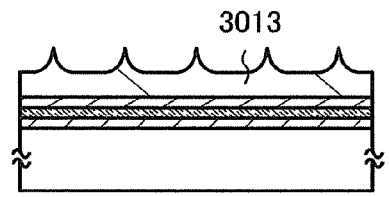

The sample D was also formed as a comparative example through the process of FIGS. 23A-1 to 23C. That is, the single crystal silicon layer 3012 obtained by the separation step of FIG. 23C was left as it is. The steps of FIGS. 23A-1 to 23C for forming the sample D are the same as those of the sample A.

Figure 26A:
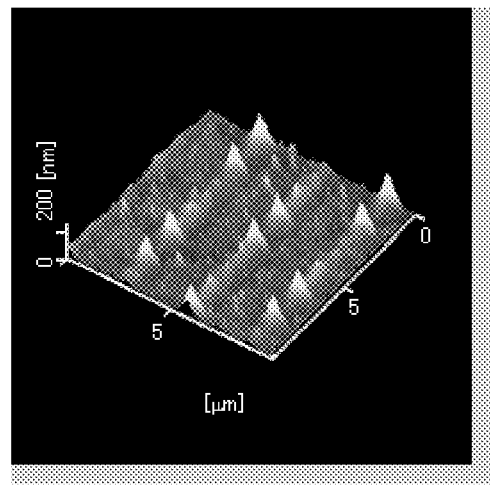
FIGS. 26A and 26B are bird's-eye views and measured values of DFM images obtained by observing measured samples with AFM.
Figure 26B:
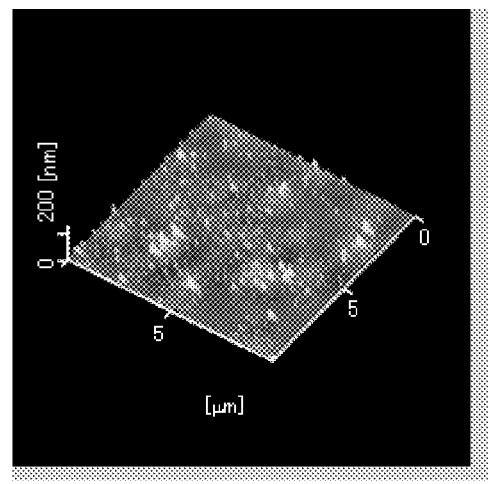

The sample A and the sample C were observed and measured using atomic force microscope (AFM). FIGS. 26A and 26B are bird's-eye views of observed images (hereinafter, referred to as DFM images) by AFM in dynamic force mode (DFM) and measured values obtained by analyzing the DFM images. FIG. 26A is the bird's-eye view of the DFM image of the sample A and the measured value obtained by analyzing the DFM image of the sample A. In addition, FIG. 26B is the bird's-eye view of the DFM image of the sample C and the measured value obtained by analyzing the DFM image of the sample C. Note that a measurement area of AFM was set to 10 μm×10 μm.

As illustrated in FIG. 26A, projections formed regularly can be observed on a surface of the sample A. The average surface roughness (Ra) of the sample A was 17.6 nm, the maximum difference in height (a P–V) thereof was 256.5 nm, and the root-mean-square (RMS) surface roughness thereof was 26.5 nm.

In contrast, as illustrated in FIG. 26B, projections formed with irregular intervals are observed on a surface of the sample C compared with the sample A. The average surface roughness (Ra) of the sample C was 6 nm, the maximum difference in height (a P–V) thereof was 121.8 nm, and the root mean square of surface roughness (RMS) thereof was 9.2 nm.

Figure 27A:
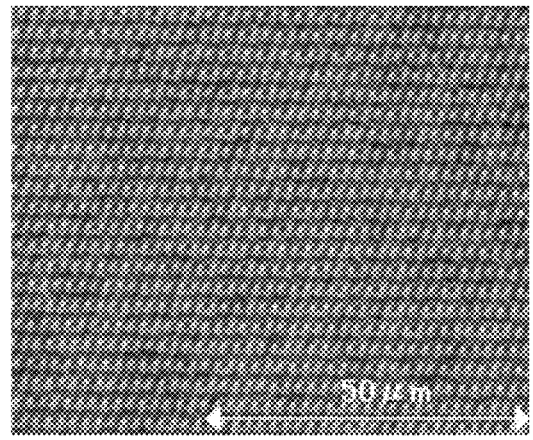
FIG. 27A is a dark field image.
Figure 27B:
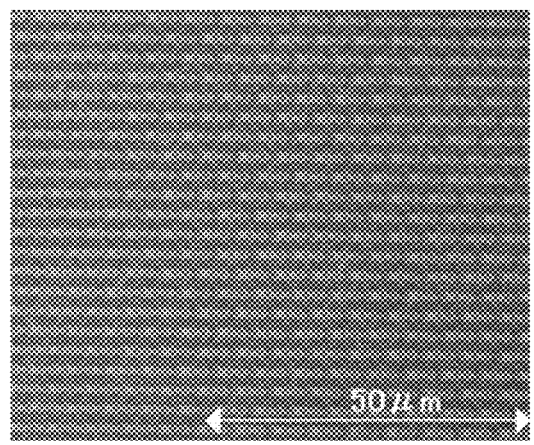
FIG. 27B is a bright field image.

In addition, as for the sample A, the surface of the single crystal silicon layer 3013 was observed with an optical microscope. FIGS. 27A to 27C are optical micrographs. Note that the optical micrographs shown in FIGS. 27A to 27C are obtained by reducing optical micrographs taken at 1000-fold magnification. Further, FIG. 27A is the optical micrograph obtained by observation of dark field, FIG. 27B is the optical micrograph obtained by observation of bright field, and FIG. 27C is the optical micrograph obtained by transmission observation. In FIGS. 27A to 27C, round regions corresponding to the projections which line up almost regularly can be observed. In FIG. 27A, the round white regions are the projections.

Next, as for the samples A to D, measurement results of reflectivity and transmittance of the single crystal silicon layer and absorptance obtained by the reflectivity and the transmittance will be described. The absorptance [%] was calculated using an expression: 100−(the reflectivity+the transmittance).

Figure 28A:
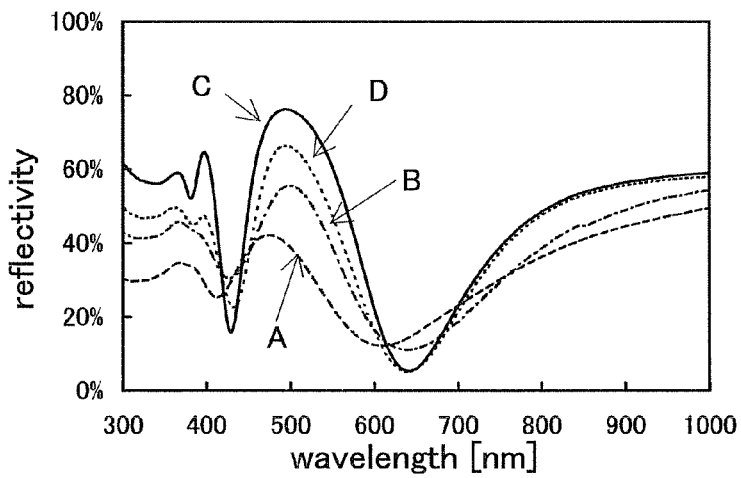
FIGS. 28A to 28C are graphs of reflectivity, transmittance, and absorption in a wavelength range (300 nm to 1000 nm) of measured samples.
Figure 28B:
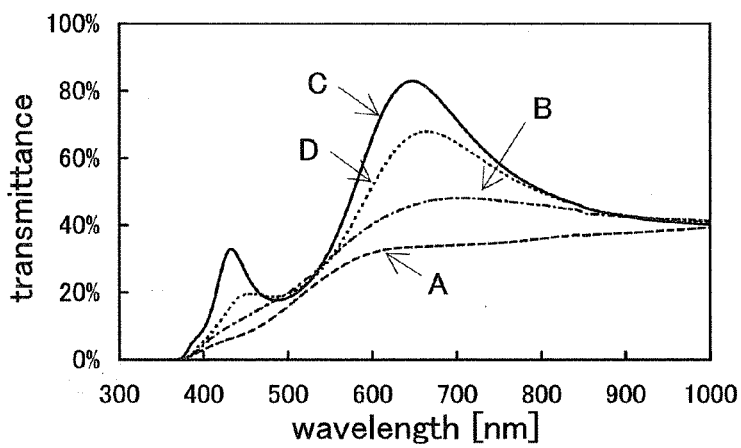
Figure 28C:
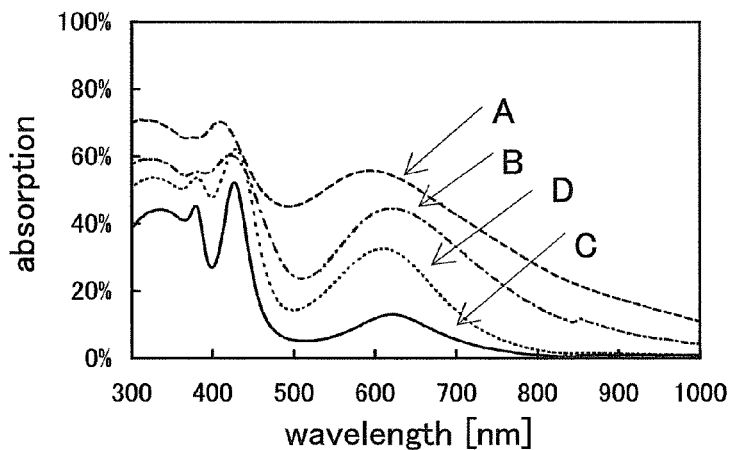

As for the samples A to D, reflectivity and transmittance in a wavelength range of 300 nm to 2000 nm were measured. In this measurement, a spectrophotometer U-4000 manufactured by Hitachi, Ltd., was used. FIG. 28A is a graph of a reflectance spectrum, FIG. 28B is graph of transmission spectrum, and FIG. 28C is a graph of an absorption spectrum. Note that the graphs of FIGS. 28A to 28C each show a spectrum in a wavelength range of 300 nm to 1000 nm.

As shown in FIGS. 28A and 28B, reflectivity and transmittance of each of the sample A and the sample B were lower than those of the sample C which is a comparative example and those of the sample D which is a comparative sample in almost all of the wavelength range. As a result, as shown in FIG. 28C, absorptance of each of the sample A and the sample B are higher than that of the comparative examples (the sample C and the sample D). From above results, the following consideration can be obtained: since the surface uneven structure in which the projections with regular intervals are formed is formed on surfaces of the sample A and the sample B and light is scattered by the surface uneven structure, a distance (optical path length) of the passage of light in the single crystal silicon layer is increased, whereby a percentage of absorption is increased. Note that in FIG. 28A, reflectivity of each of the comparative examples (the sample C and the sample D) and reflectivity of each of the sample A and the sample B are reversed in part of the wavelength range, which is a change by an interference between light reflected on the surface of the single crystal silicon layer and light reflected on the rear surface of the single crystal silicon layer.

According to Embodiment 1 to Embodiment 3, it was confirmed that the projections with regular intervals could be formed by irradiation with the laser beam using the phase shift mask. Further, it was also confirmed that the reflectivity and transmittance of the single crystal silicon layer in which the projections with regular intervals had been formed using the phase shift mask could be reduced and the absorptance thereof could be improved compared with the single crystal silicon layer obtained by the separation step and the single crystal silicon layer on which irradiation with the laser beam had been performed without the phase shift mask.

This application is based on Japanese Patent Application serial No. 2008-037733 filed with Japan Patent Office on Feb. 19, 2008, the entire contents of which are hereby incorporated by reference.

What is claimed is:

1. A method for manufacturing a photoelectric conversion device, comprising the steps of:
    forming an embrittlement layer in a single crystal silicon substrate;
    forming a first impurity silicon layer having one conductivity type, an electrode, and an insulating layer so as to be stacked sequentially over a surface of the single crystal silicon substrate;
    disposing a surface of a supporting substrate and a surface of the insulating layer formed over the single crystal silicon substrate so as to be in contact with each other;
    performing heat treatment to form a first single crystal silicon layer over the supporting substrate by separating part of the single crystal silicon substrate along the embrittlement layer or a periphery of the embrittlement layer;
    modulating a first laser beam to a second laser beam having light intensity regularly;
    performing irradiation with the second laser beam on a separation surface of the first single crystal silicon layer to form unevenness on the separation surface of the first single crystal silicon layer;
    forming a second single crystal silicon layer over the separation surface of the first single crystal silicon layer having the unevenness, thereby unevenness on a surface of the second single crystal silicon layer is formed; and
    forming a second impurity silicon layer having a conductivity type opposite to the one conductivity type in an upper side of the second single crystal silicon layer having the unevenness.

2. The method for manufacturing the photoelectric conversion device according to claim 1, wherein crystal defects of the first single crystal silicon layer are repaired by the step of performing irradiation with the second laser beam.

3. The method for manufacturing the photoelectric conversion device according to claim 1, wherein a phase shift mask or a mask having a slit pattern is used in the modulating step.

4. The method for manufacturing the photoelectric conversion device according to claim 1, wherein the second single crystal silicon layer is formed by solid-phase growth or vapor-phase growth using the first single crystal silicon layer as a seed layer.

5. The method for manufacturing the photoelectric conversion device according to claim 1, wherein the embrittlement layer is formed by performing irradiation with ions or cluster ions on the surface of the single crystal silicon substrate.

6. The method for manufacturing the photoelectric conversion device according to claim 1, wherein a third impurity silicon layer having the one conductivity type, a non-single-crystal silicon layer, and a fourth single crystal silicon layer having the conductivity type opposite to the one conductivity type are formed over the second impurity silicon layer.

7. The method for manufacturing the photoelectric conversion device according to claim 1, wherein a largest difference in height (P–V) of the unevenness is greater than or equal to 50 nm.

8. A method for manufacturing a photoelectric conversion device, comprising the steps of:
    forming an embrittlement layer in a single crystal silicon substrate;
    forming a first impurity silicon layer having one conductivity type, a first electrode, and an insulating layer so as to be stacked sequentially over a surface of the single crystal silicon substrate;
    disposing a surface of a supporting substrate and a surface of the insulating layer formed over the single crystal silicon substrate so as to be in contact with each other;
    performing heat treatment to form a first single crystal silicon layer over the supporting substrate by separating part of the single crystal silicon substrate along the embrittlement layer or a periphery of the embrittlement layer;
    modulating a first laser beam to a second laser beam having light intensity regularly;
    performing irradiation with the second laser beam on a separation surface of the first single crystal silicon layer to form unevenness on the separation surface of the first single crystal silicon layer;
    forming a second single crystal silicon layer over the separation surface of the first single crystal silicon layer having the unevenness, thereby unevenness on a surface of the second single crystal silicon layer is formed;
    forming a second impurity silicon layer having a conductivity type opposite to the one conductivity type in an upper side of the second single crystal silicon layer having the unevenness; and
    forming a second electrode over the second impurity silicon layer.

9. The method for manufacturing the photoelectric conversion device according to claim 8, wherein crystal defects of the first single crystal silicon layer are repaired by the step of performing irradiation with the second laser beam.

10. The method for manufacturing the photoelectric conversion device according to claim 8, wherein a phase shift mask or a mask having a slit pattern is used in the modulating step.

11. The method for manufacturing the photoelectric conversion device according to claim 8, wherein the second single crystal silicon layer is formed by solid-phase growth or vapor-phase growth using the first single crystal silicon layer as a seed layer.

12. The method for manufacturing the photoelectric conversion device according to claim 8, wherein the embrittlement layer is formed by performing irradiation with ions or cluster ions on the surface of the single crystal silicon substrate.

13. The method for manufacturing the photoelectric conversion device according to claim 8, wherein a third impurity silicon layer having the one conductivity type, a non-single-crystal silicon layer, and a fourth single crystal silicon layer having the conductivity type opposite to the one conductivity type are formed between the second impurity silicon layer and the second electrode.

14. The method for manufacturing the photoelectric conversion device according to claim 8, wherein a largest difference in height (P–V) of the unevenness is greater than or equal to 50 nm.

15. The method for manufacturing the photoelectric conversion device according to claim 8, wherein a third electrode is formed in electrical connection with the first electrode at the same time as forming the second electrode.

* * * * *